(12) United States Patent
Drowley et al.

(10) Patent No.: US 12,136,645 B2
(45) Date of Patent: Nov. 5, 2024

(54) COUPLED GUARD RINGS FOR EDGE TERMINATION

(71) Applicant: SEMICONDUCTOR COMPONENTS INDUSTRIES, LLC, Scottsdale, AZ (US)

(72) Inventors: Clifford Drowley, Santa Clara, CA (US); Andrew P. Edwards, Santa Clara, CA (US); Hao Cui, Santa Clara, CA (US); Subhash Srinivas Pidaparthi, Santa Clara, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 341 days.

(21) Appl. No.: 17/584,215

(22) Filed: Jan. 25, 2022

(65) Prior Publication Data

US 2022/0238643 A1 Jul. 28, 2022

Related U.S. Application Data

(60) Provisional application No. 63/142,909, filed on Jan. 28, 2021.

(51) Int. Cl.
| | |
|---|---|
| *H01L 29/06* | (2006.01) |
| *H01L 21/265* | (2006.01) |
| *H01L 21/266* | (2006.01) |
| *H01L 29/20* | (2006.01) |

(52) U.S. Cl.
CPC ...... *H01L 29/0619* (2013.01); *H01L 21/2654* (2013.01); *H01L 21/26546* (2013.01); *H01L 21/266* (2013.01); *H01L 29/2003* (2013.01)

(58) Field of Classification Search
None
See application file for complete search history.

(56) References Cited

U.S. PATENT DOCUMENTS

| | | | |
|---|---|---|---|
| 8,866,148 B2 | 10/2014 | Disney | |
| 9,117,839 B2 | 8/2015 | Kizilyalli et al. | |
| 9,793,345 B1* | 10/2017 | He | H01L 29/404 |
| 2010/0118455 A1* | 5/2010 | Kusunoki | H01L 29/404 |
| | | | 257/E27.071 |
| 2010/0230745 A1* | 9/2010 | Saito | H01L 29/0619 |
| | | | 257/329 |
| 2021/0193846 A1 | 6/2021 | Drowley et al. | |
| 2021/0399091 A1 | 12/2021 | Cui et al. | |
| 2022/0013626 A1 | 1/2022 | Pidaparthi et al. | |
| 2022/0020743 A1 | 1/2022 | Drowley et al. | |

\* cited by examiner

*Primary Examiner* — Alexander G Ghyka
(74) *Attorney, Agent, or Firm* — Kevin B. Jackson

(57) ABSTRACT

A semiconductor device includes an active device region and a plurality of guard rings arranged in a first concentric pattern surrounding the active device region. The semiconductor device also includes a plurality of junctions arranged in a second concentric pattern surrounding the active device region. At least one of the plurality of junctions is arranged between two adjacent guard rings of the plurality of guard rings, and the plurality of junctions have a different resistivity than the plurality of guard rings. The semiconductor device further includes a plurality of coupling paths. At least one of the plurality of coupling paths is arranged to connect two adjacent guard rings of the plurality of guard rings.

13 Claims, 36 Drawing Sheets

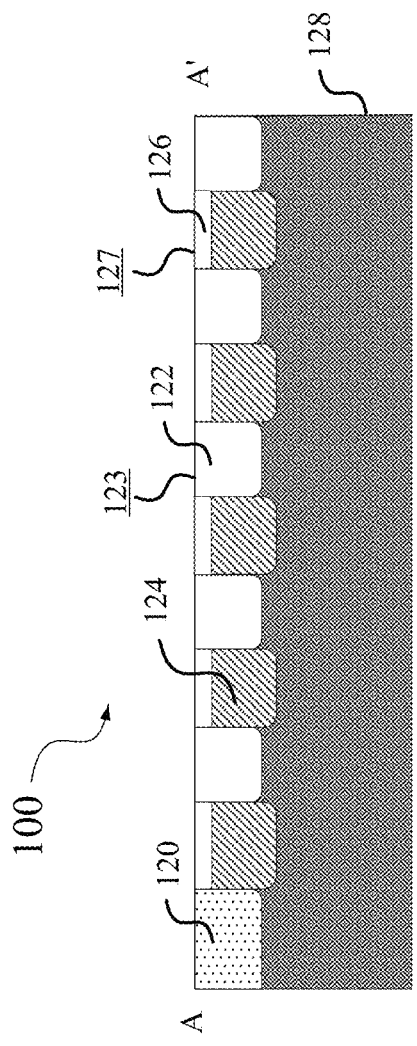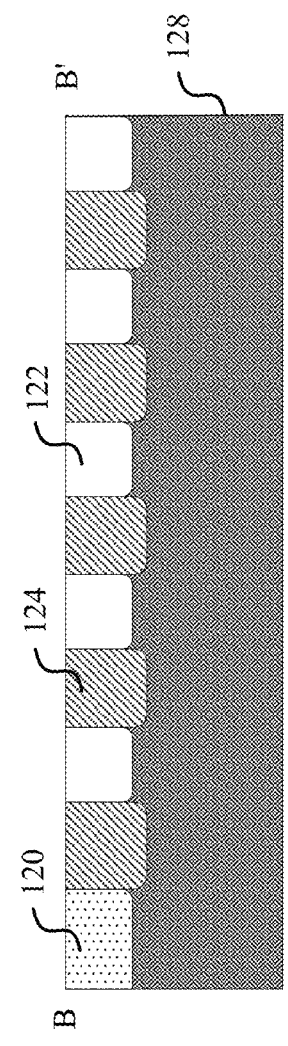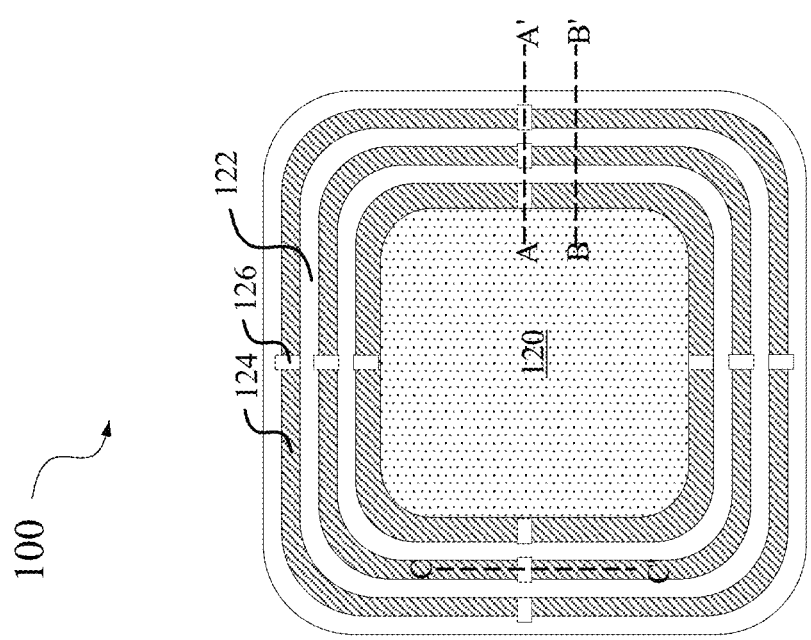
FIG. 1B
FIG. 1C
FIG. 1A

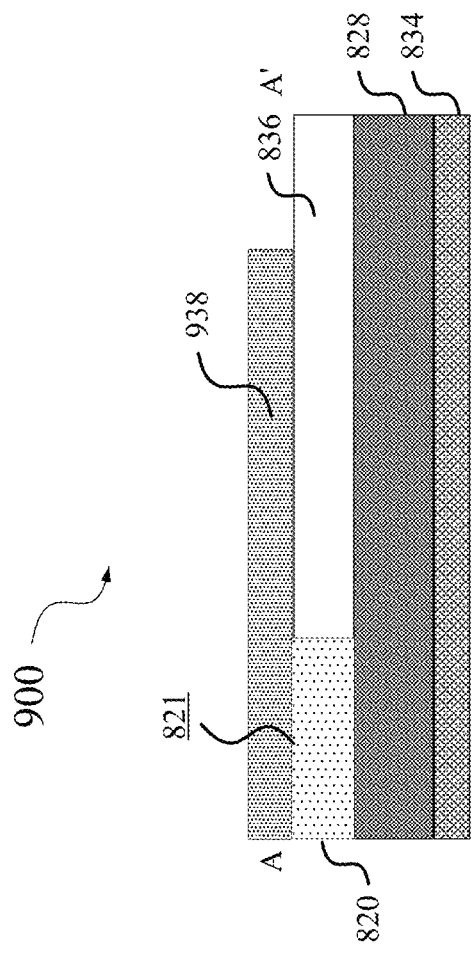
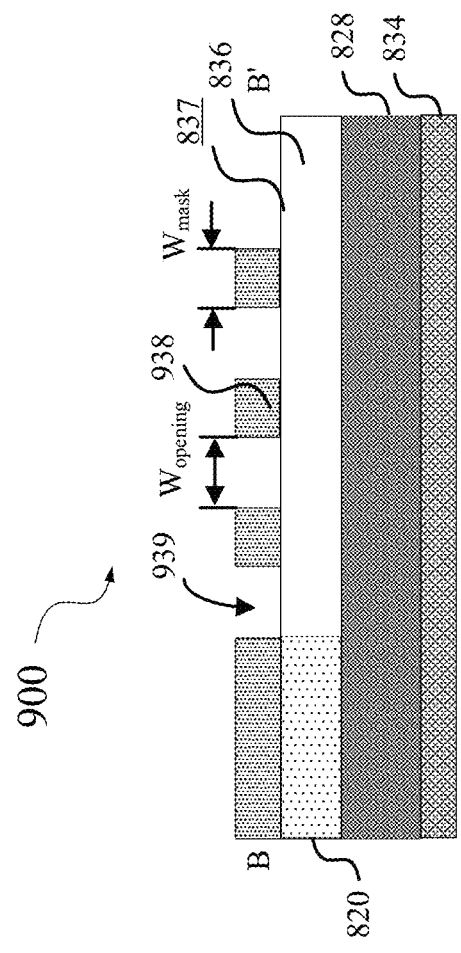
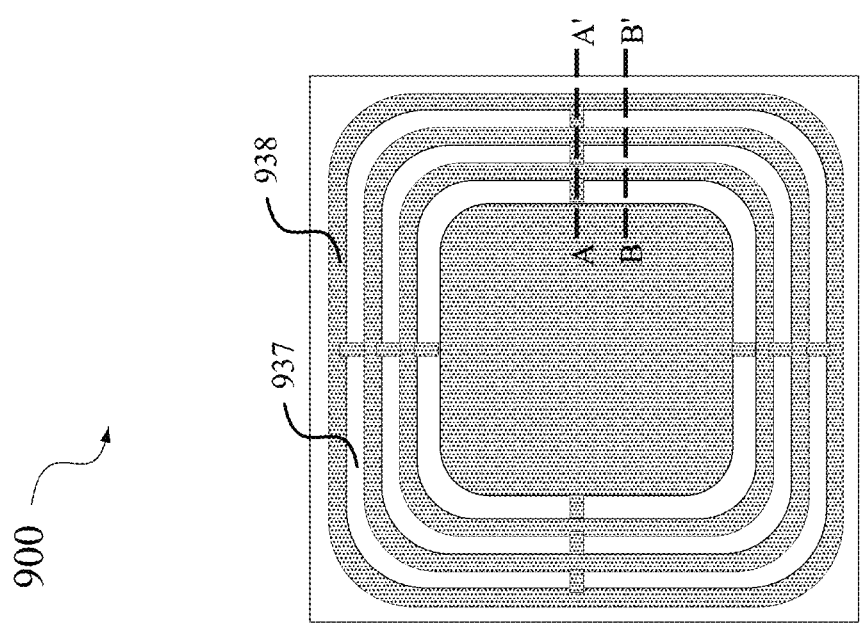
FIG. 9B
FIG. 9C
FIG. 9A

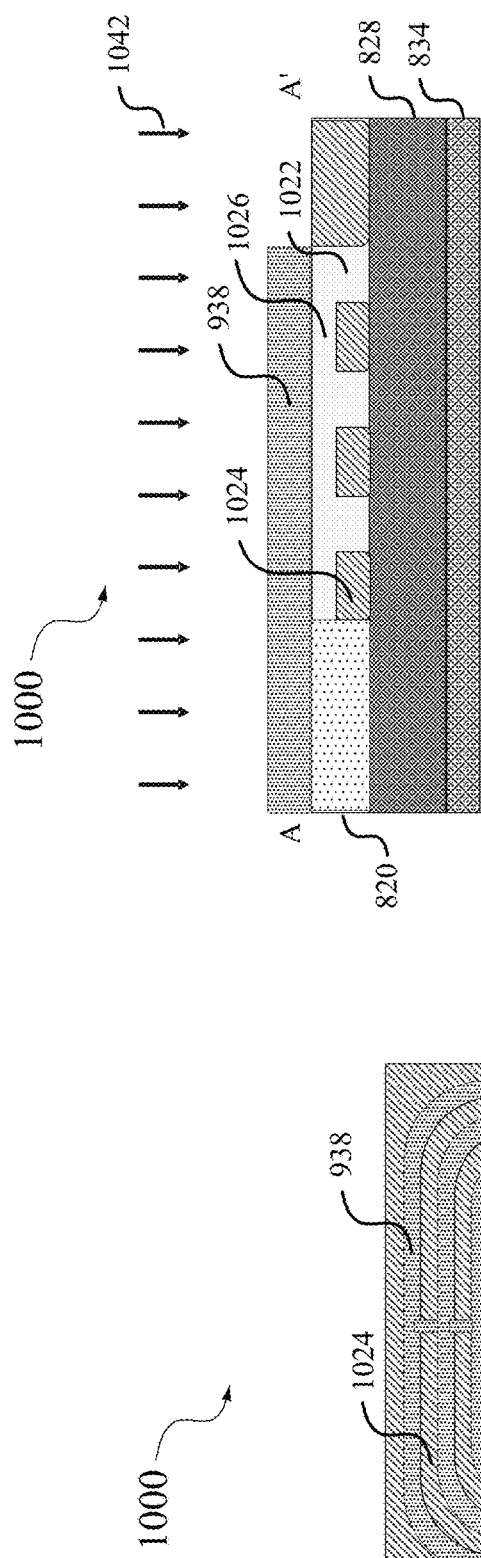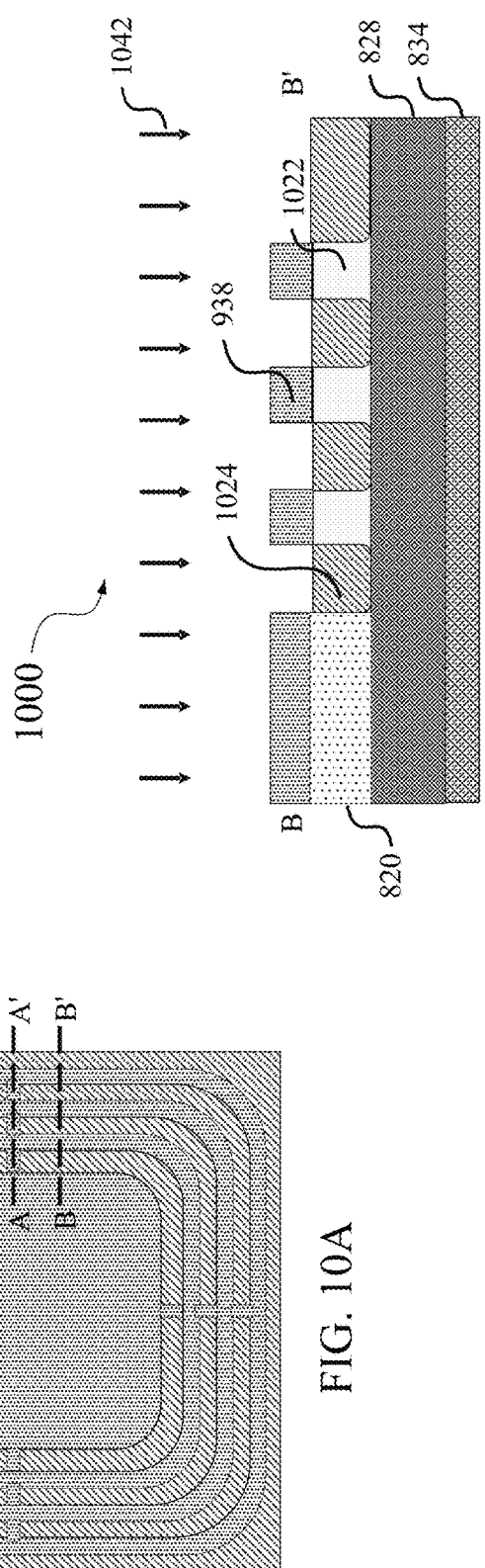
FIG. 10B
FIG. 10C
FIG. 10A

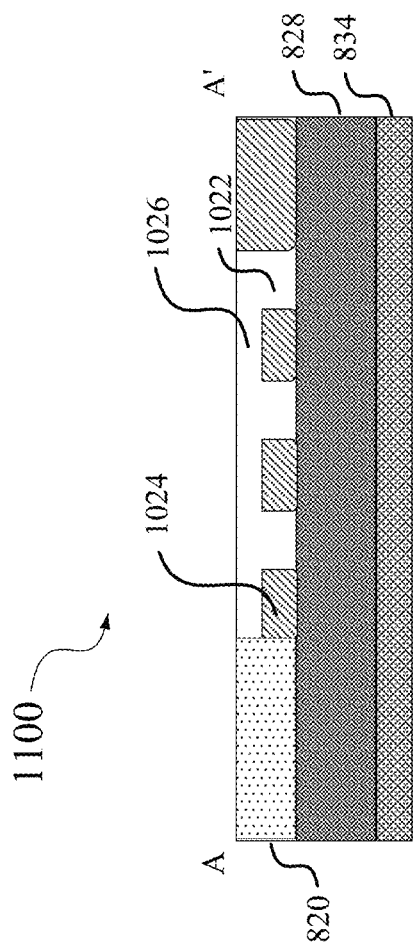
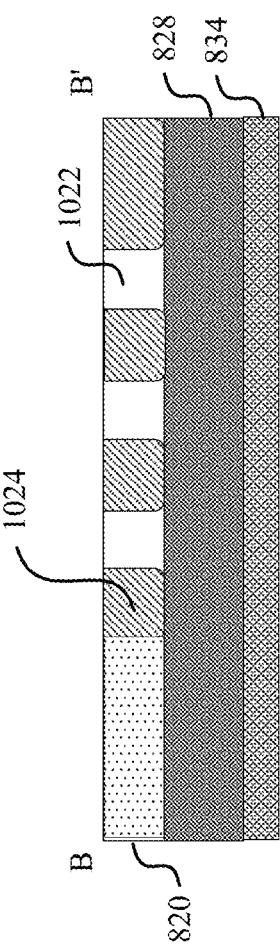
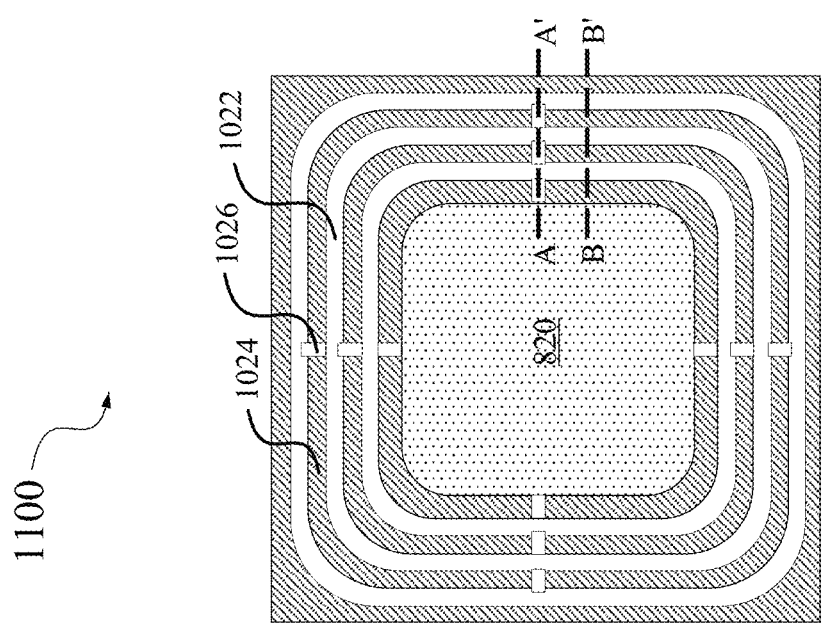
FIG. 11B
FIG. 11C
FIG. 11A

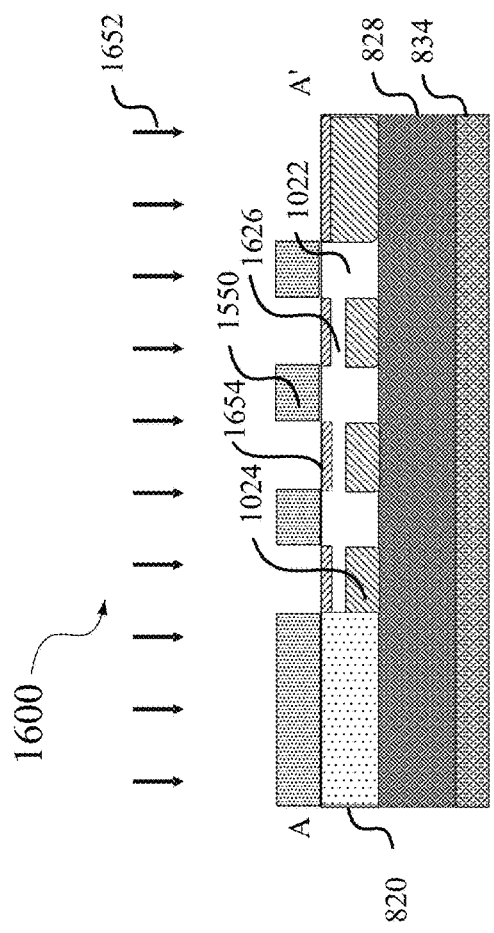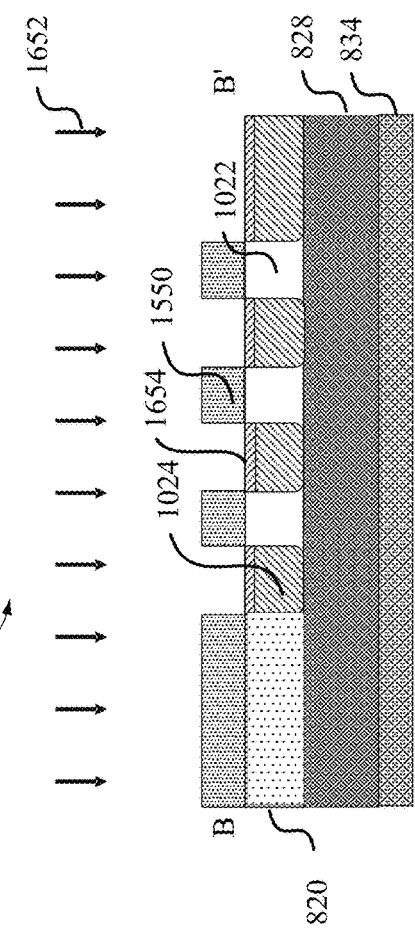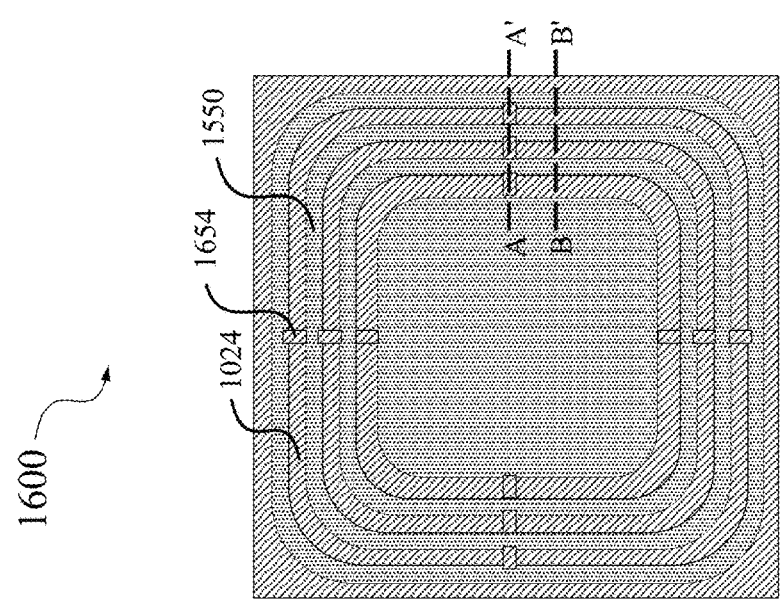

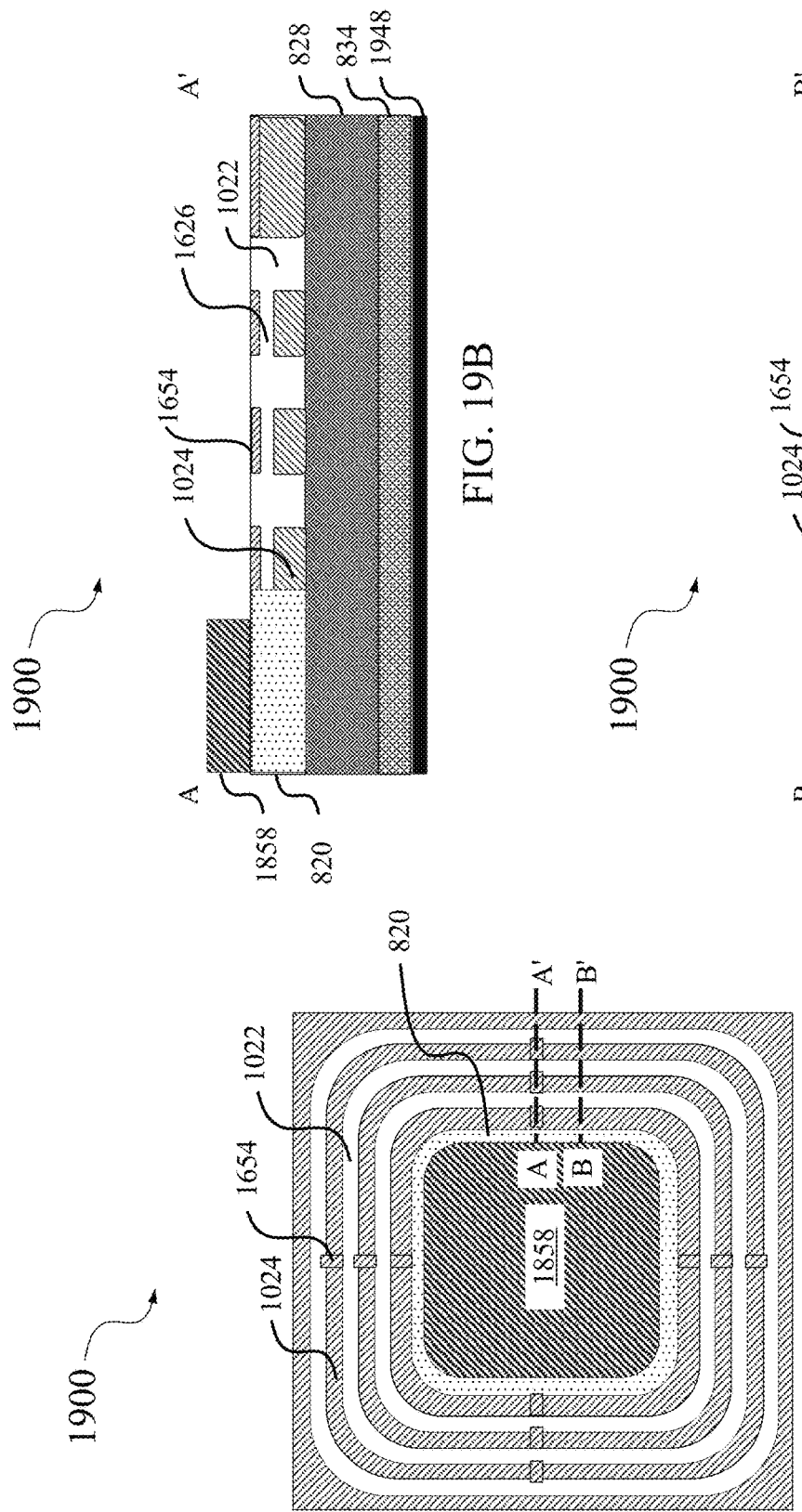

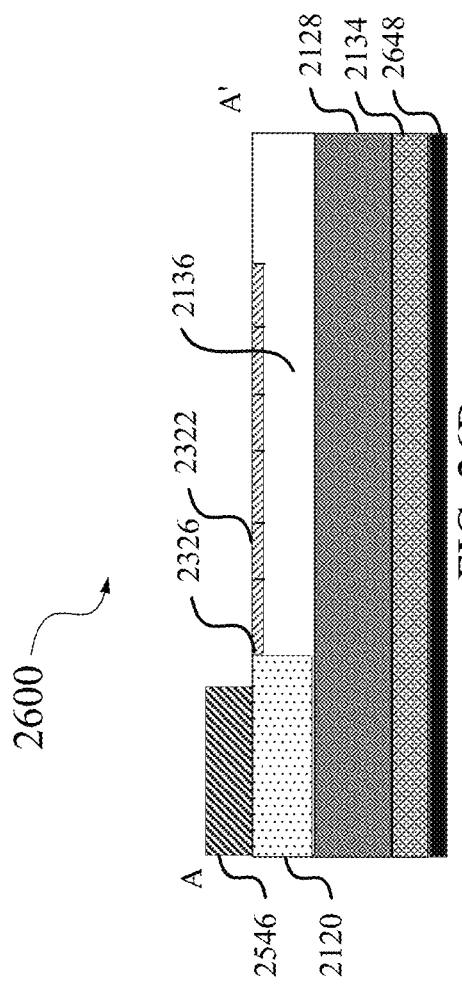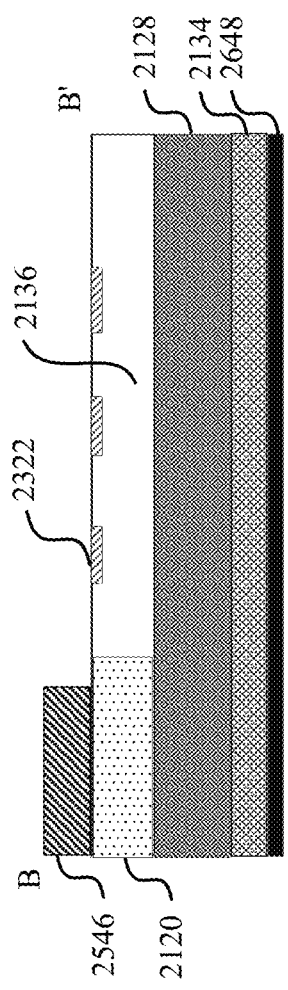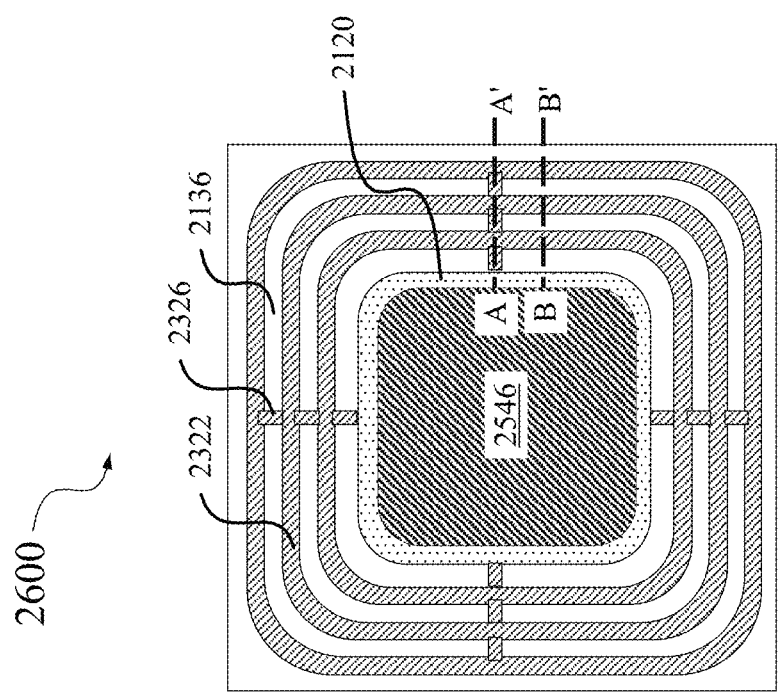

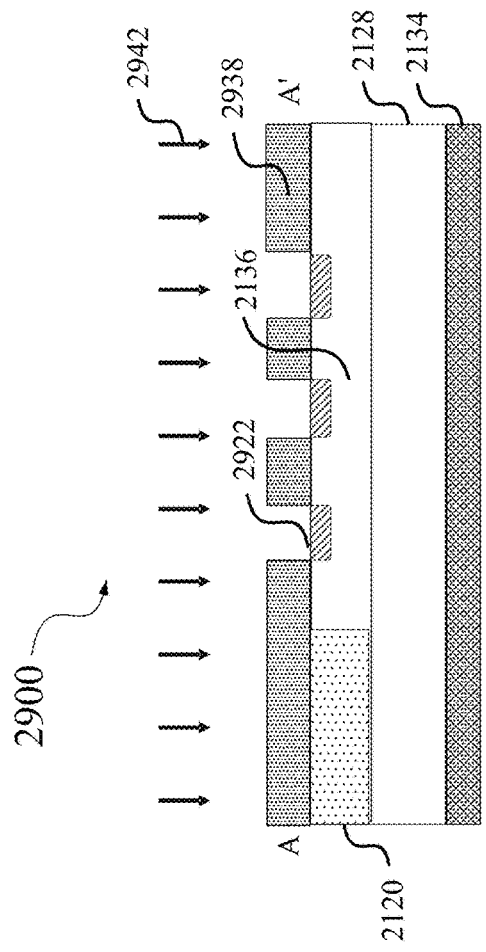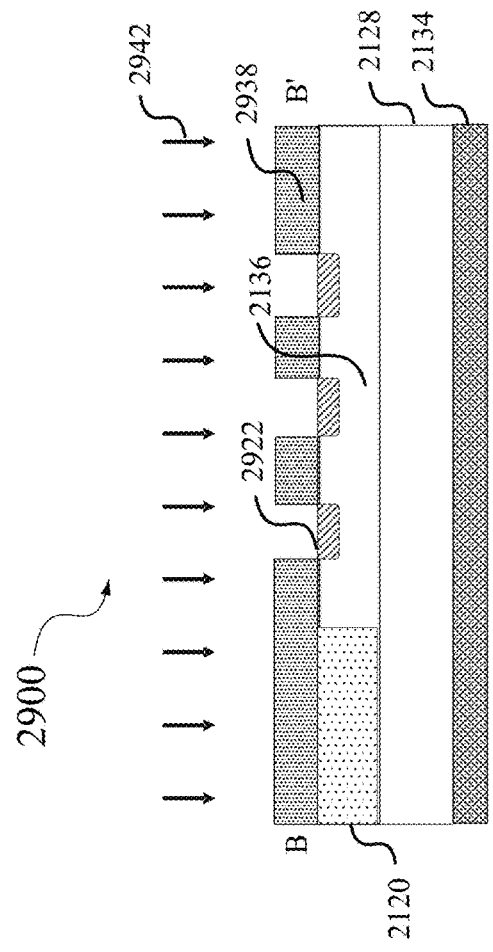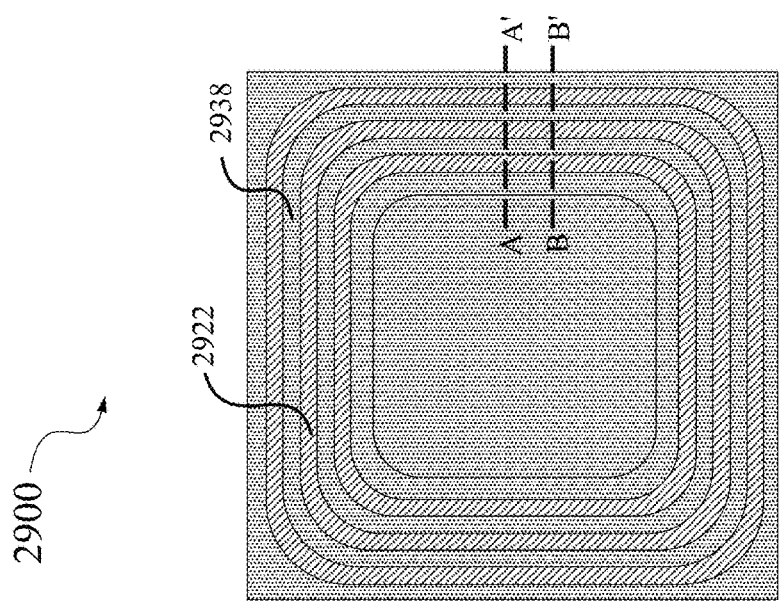

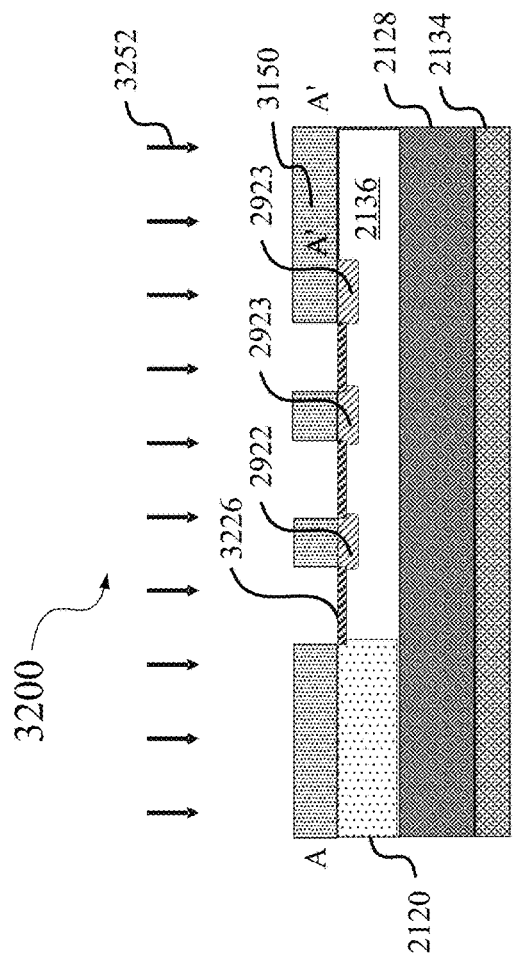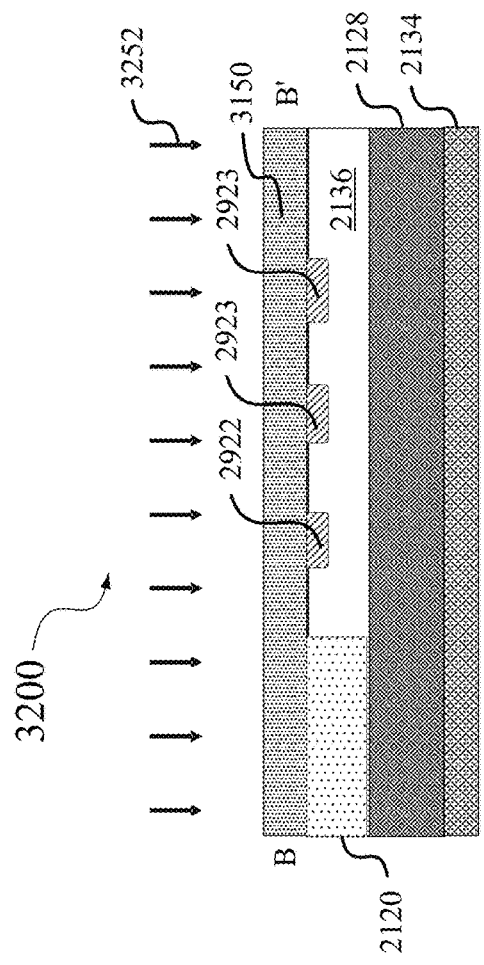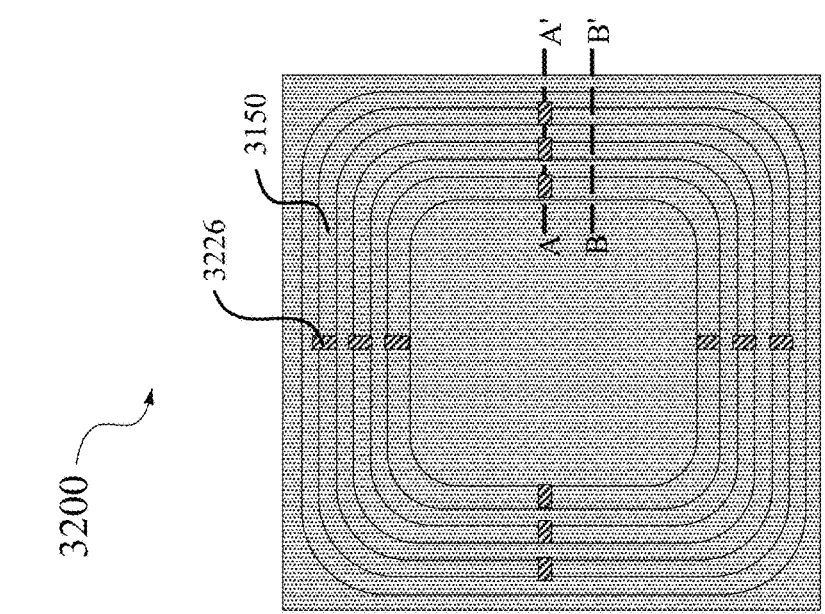

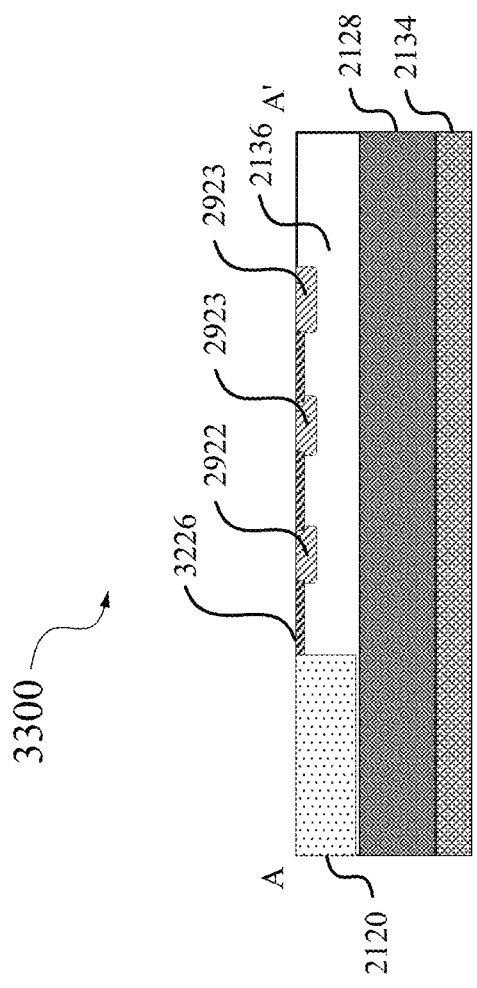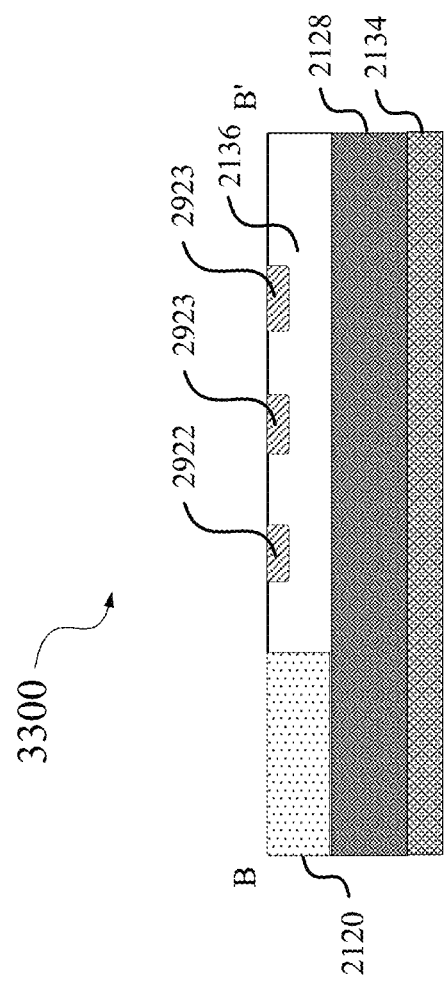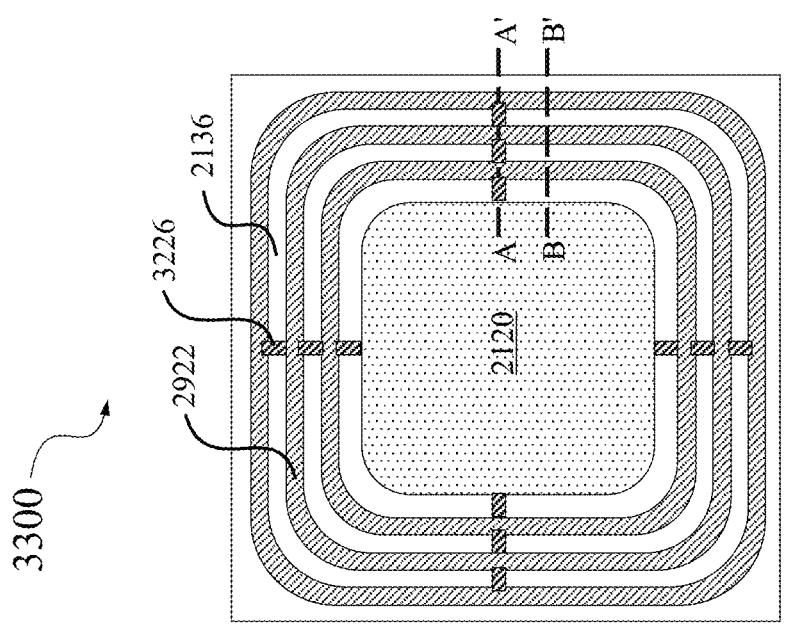

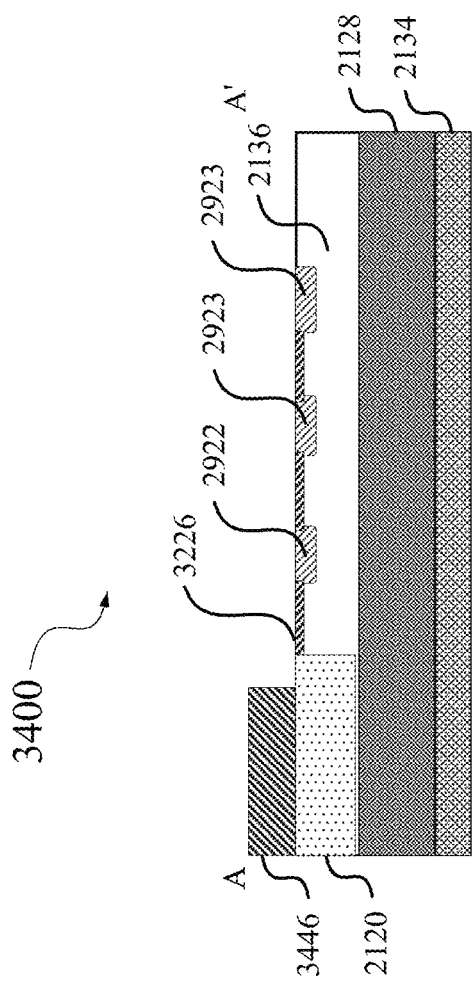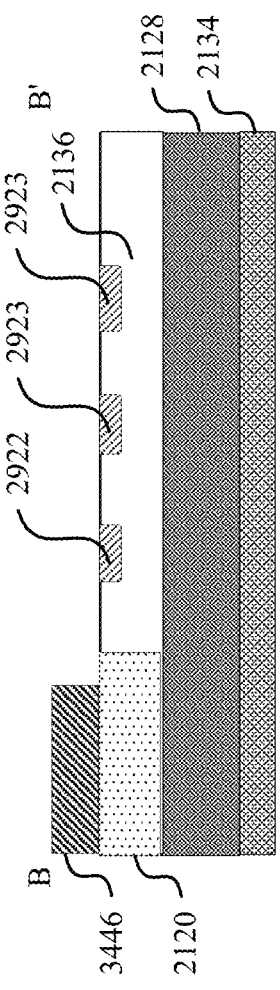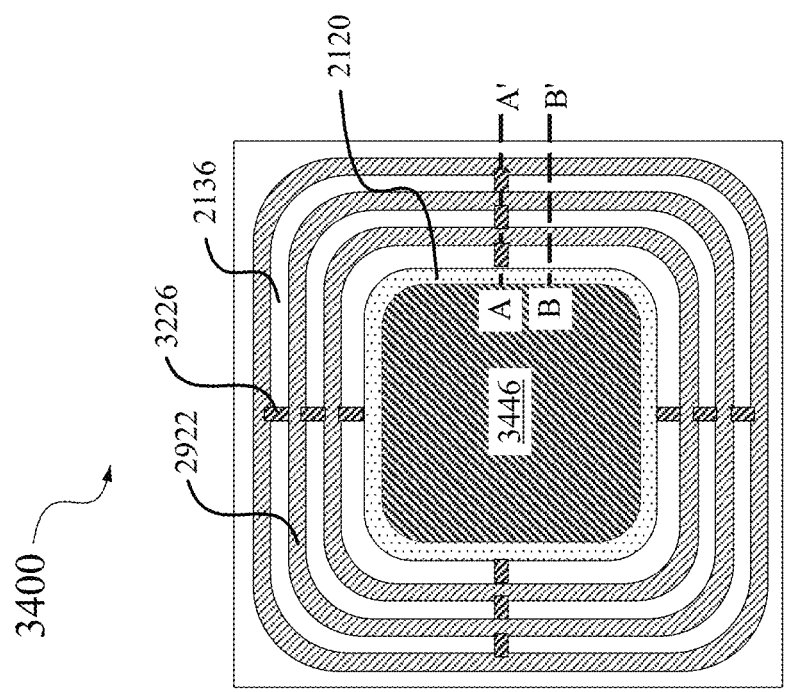
FIG. 34B
FIG. 34C
FIG. 34A

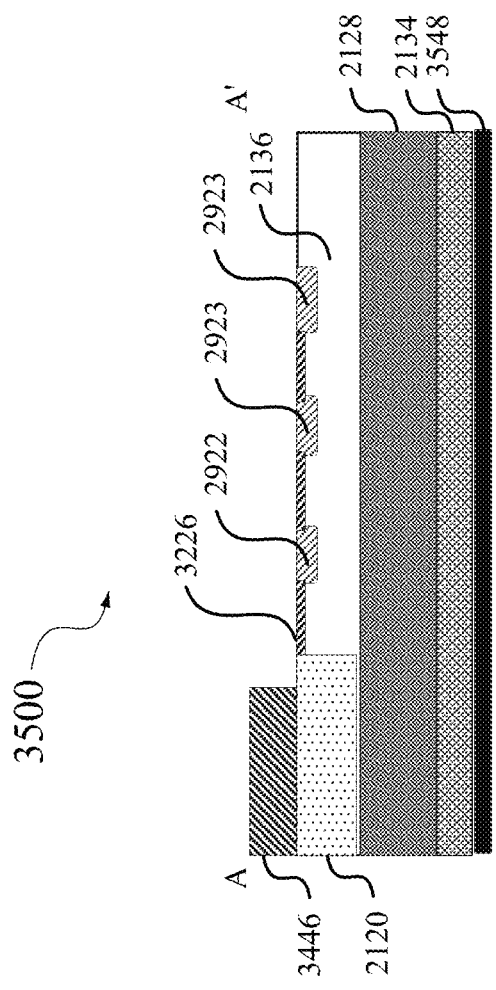
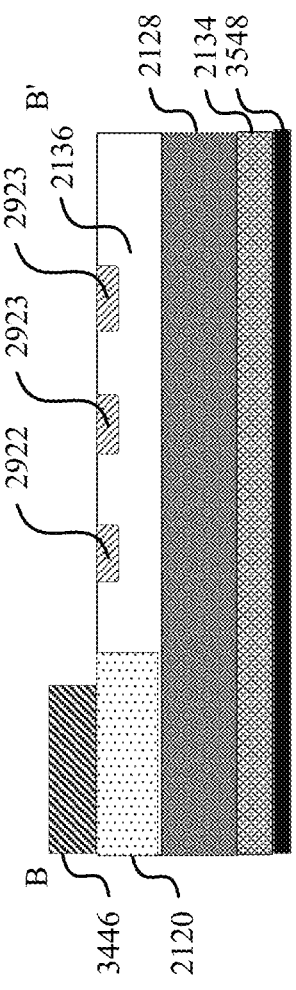
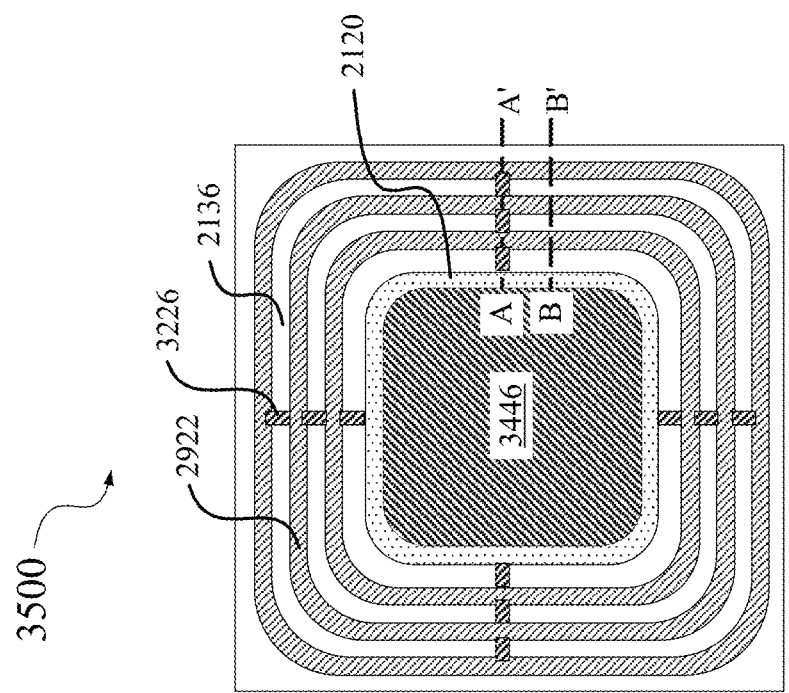

COUPLED GUARD RINGS FOR EDGE TERMINATION

CROSS-REFERENCES TO RELATED APPLICATIONS

This application claims the benefit of and priority to U.S. Provisional Patent Application No. 63/142,909, filed on Jan. 28, 2021, the disclosure of which is hereby incorporated by reference in its entirety for all purposes.

BACKGROUND OF THE INVENTION

Power electronics are widely used in a variety of applications. Power semiconductor devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage-power transmission system. Vertical power devices, in which the primary current flows from the top surface vertically down through the substrate, are often used in applications that require high voltage and/or current levels.

Despite the progress made in power electronics, there is a need in the art for improved electronics systems and methods of operating the same.

SUMMARY OF THE INVENTION

The present invention relates generally to electronic devices. More specifically, the present invention relates to forming edge termination structures using implantation processes in III-nitride semiconductor materials. Merely by way of example, the invention has been applied to methods and systems for manufacturing guard rings for semiconductor devices using ion implantation into gallium nitride (GaN) based epitaxial layers. Coupling paths are provided between some or all of the guard rings and/or between the device region and one of the guard rings. The methods and techniques can be applied to a variety of power semiconductor devices, such as Schottky diodes, PN diodes, vertical junction field-effect transistors (JFETs), thyristors, bipolar junction transistors (BJTs), and other devices.

According to an embodiment of the present invention, a semiconductor device is provided. The semiconductor device includes an active device region and a plurality of guard rings arranged in a first concentric pattern surrounding the active device region. The semiconductor device also includes a plurality of junctions arranged in a second concentric pattern surrounding the active device region. At least one of the plurality of junctions is arranged between two adjacent guard rings of the plurality of guard rings, and the plurality of junctions have a different resistivity than the plurality of guard rings. The semiconductor device further includes a plurality of coupling paths. At least one of the plurality of coupling paths is arranged to connect two adjacent guard rings of the plurality of guard rings.

According to another embodiment of the present invention, a method is provided. The method includes forming a first mask over a semiconductor material having an active device region and a field region surrounding the active device region. The first mask is formed to cover at least the active device region, a first concentric pattern of rings within the field region, and connectors within the field region between a first ring of the first concentric pattern of rings and at least one of the active device region or a second ring of the first concentric pattern of rings. The method also includes performing implantation of a neutralizing species into a plurality of junctions within the field region. The plurality of junctions are arranged in a second concentric pattern that surrounds the active device region, and at least one of the plurality of junctions is arranged between two adjacent rings of the first concentric pattern of rings. The first mask blocks the neutralizing species from reaching a top surface of the active device region, a top surface of the first concentric pattern of rings within the field region, and a top surface of the connectors within the field region.

According to another embodiment of the present invention, a semiconductor device is provided. The semiconductor device includes an active device region, a first guard ring surrounding the active device region, and a second guard ring surrounding the active device region. The semiconductor device also includes a junction region between the first guard ring and the second guard ring. The junction region includes a junction having a different resistivity than the first guard ring and the second guard ring and a coupling path that is arranged to electrically connect the first guard ring and the second guard ring. The coupling path can have a same resistivity as the first guard ring and the second guard ring. The junction can have a higher resistivity than the first guard ring and the second guard ring. A width of the coupling path can decrease from a top surface of the coupling path to a bottom of the coupling path. In some embodiments, the coupling path is arranged to connect the first guard ring with the active device region. A top surface of the coupling path can be arranged parallel to a top surface of the first guard ring and the second guard ring. Alternatively, a top surface of the coupling path can be arranged below a top surface of the first guard ring and the second guard ring. A width of the coupling path can decrease from the top surface of the coupling path to a bottom of the coupling path.

According to a specific embodiment of the present invention, a method is provided. The method includes forming a first mask over a semiconductor material having an active device region and a field region surrounding the active device region. The first mask has a plurality of concentric annular openings over the field region and a plurality of connector openings between a first annular opening of the plurality of concentric annular openings and at least one of the active device region or a second annular opening of the plurality of concentric annular openings. The method also includes performing implantation of a first dopant of a first type into the semiconductor material through the plurality of concentric annular openings and the plurality of connector openings, removing the first mask, and activating the first dopant of the first type.

In some embodiments, the field region includes a second dopant of a second type and the first type is different from the second type. The first dopant can include at least one of zinc, beryllium, magnesium, or calcium. The field region can include n-type GaN. A top surface of the semiconductor material adjacent at least one of the plurality of connector openings can be arranged parallel to a top surface of the semiconductor material adjacent the plurality of concentric annular openings. A top surface of the semiconductor material adjacent at least one of the plurality of connector openings can be arranged below a top surface of the semiconductor material adjacent the plurality of concentric annular openings. In some embodiments, the method further includes forming a plurality of metal regions that are arranged on a top surface of the semiconductor material adjacent the plurality of concentric annular openings.

According to another specific embodiment of the present invention, a method is provided. The method includes forming a first mask over a semiconductor material having an active device region and a field region surrounding the active device region, wherein the first mask has a plurality of concentric annular openings over the field region. The method also includes performing a first implantation of a first dopant of a first type into the semiconductor material through the plurality of concentric annular openings, removing the first mask, and forming a second mask over the semiconductor material. The second mask has a plurality of connector openings that are arranged between a first ring within the field region formed by the first implantation and at least one of the active device region or a second ring within the field region formed by the first implantation. The method further includes performing a second implantation of the first dopant of the first type into the semiconductor material through the plurality of connector openings and activating the first dopant of the first type. The field region can include a second dopant of a second type and the first type is different from the second type. The first dopant can include at least one of zinc, beryllium, magnesium, or calcium. The field region can include n-type GaN. A top surface of the semiconductor material adjacent at least one of the plurality of connector openings can be arranged parallel to a top surface of the semiconductor material adjacent the plurality of concentric annular openings. A top surface of the semiconductor material adjacent at least one of the plurality of connector openings can be arranged below a top surface of the semiconductor material adjacent the plurality of concentric annular openings. In an embodiment, the method further includes forming a plurality of metal regions that are arranged on a top surface of the semiconductor material adjacent the plurality of concentric annular openings.

Numerous benefits are achieved by way of the present invention over conventional techniques. For example, embodiments of the present invention provide techniques for providing switching transistors with high densities of vertical conduction channels with edge-termination structures that enable robust high-voltage operation and a degree of immunity to transient overvoltage conditions. The semiconductor devices provided by embodiments of the present invention may have a breakdown voltage that is increased by a factor of two or three as compared with conventional semiconductor devices. These and other embodiments of the invention, along with many of its advantages and features, are described in more detail in conjunction with the text below and attached figures.

BRIEF DESCRIPTION OF THE DRAWINGS

FIG. 1A illustrates a plan view of a semiconductor device according to an embodiment of the present invention.

FIG. 1B illustrates a cross-sectional view through a first line A-A' of the semiconductor device shown in FIG. 1A.

FIG. 1C illustrates a cross-sectional view through a second line B-B' of the semiconductor device shown in FIG. 1A.

FIGS. 9A-9C illustrate an example of a semiconductor device as modified by another block of the method shown in FIG. 7.

FIGS. 10A-10C illustrate another example of a semiconductor device as modified by another block of the method shown in FIG. 7.

FIGS. 11A-11C illustrate another example of a semiconductor device as modified by another block of the method shown in FIG. 7.

FIGS. 16A-16C illustrate another example of a semiconductor device as modified by another block of the method shown in FIG. 14.

FIGS. 19A-19C illustrate another example of a semiconductor device as modified by another block of the method shown in FIG. 14.

FIGS. 26A-26C illustrate another example of a semiconductor device as modified by another block of the method shown in FIG. 20.

FIGS. 29A-29C illustrate an example of another semiconductor device as modified by another block of the method shown in FIG. 27.

FIGS. 32A-32C illustrate an example of another semiconductor device as modified by another block of the method shown in FIG. 27.

FIGS. 33A-33C illustrate an example of another semiconductor device as modified by another block of the method shown in FIG. 27.

FIGS. 34A-34C illustrate an example of another semiconductor device as modified by another block of the method shown in FIG. 27.

FIGS. 35A-35C illustrate an example of another semiconductor device as modified by another block of the method shown in FIG. 27.

DETAILED DESCRIPTION OF SPECIFIC EMBODIMENTS

Figure 2:
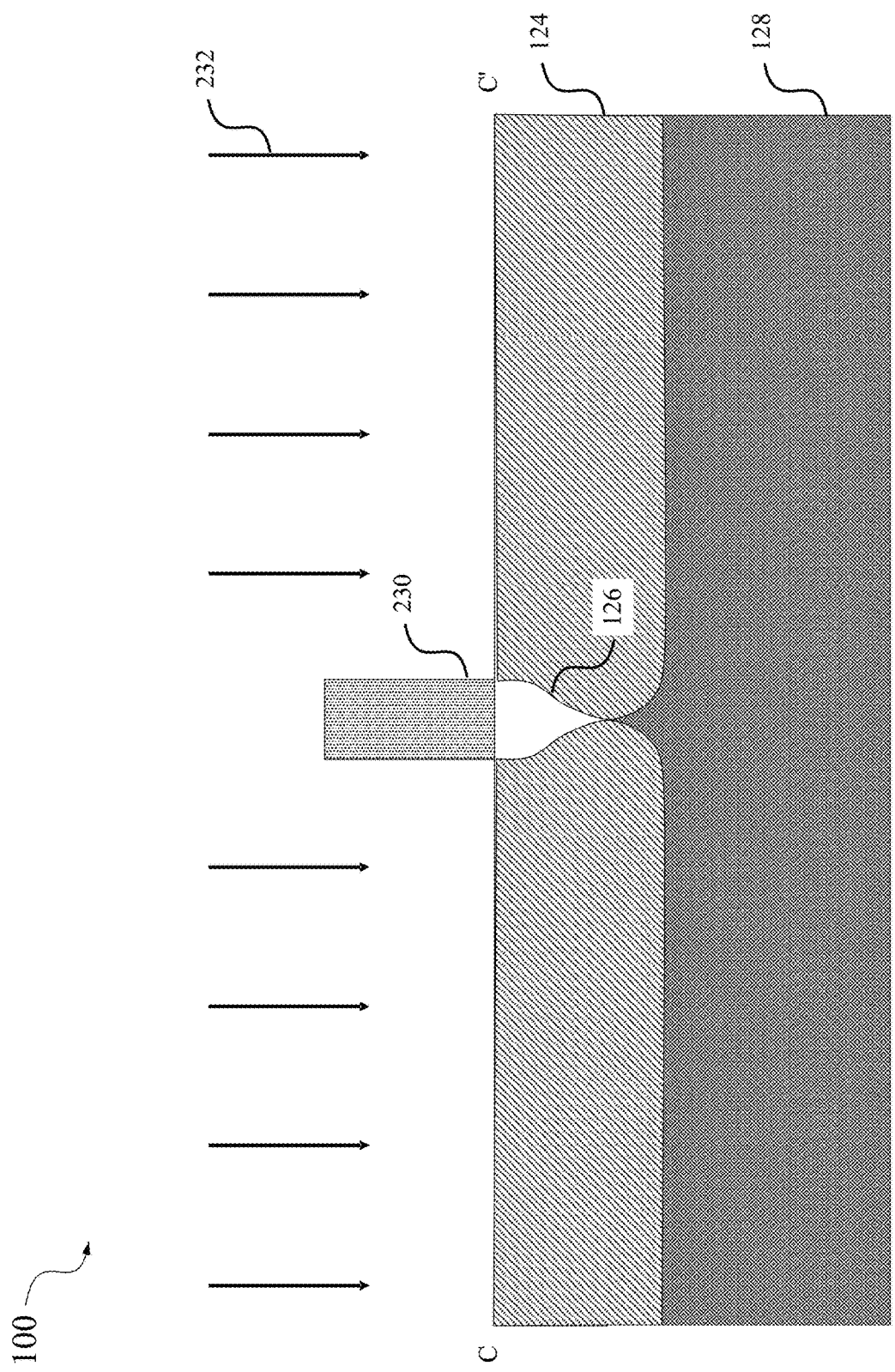
FIG. 2 illustrates a cross-sectional view through a third line C-C' of the semiconductor device shown in FIG. 1A.

Embodiments of the present invention relate to methods and systems to improve the performance of a junction termination structure in semiconductor devices. Embodiments of the present invention are applicable to a variety of semiconductor manufacturing operations including the manufacturing of III-nitride semiconductor devices. Merely by way of example, embodiments are applied in the fabrication of Schottky diodes, PN diodes, vertical JFETs, vertical MOSFETs, thyristors, BJTs, and other devices, but embodiments of the present invention have applicability to a variety of device structures.

Power semiconductor devices including transistors and diodes are widely used today in such applications as industrial power supplies, motor drives, consumer electronics, etc. A common application of power semiconductor transistors is their use as switches in switch-mode power supplies or motor drives. In such applications, the ability of the device to operate at high voltages (650V or 1200V, for example) and to withstand momentary overvoltage conditions (due to inductive circuit elements or line surges or lightning strikes on power lines, for example) is extremely important.

In order to reduce the resistance of the switch and reduce capacitances, etc., that limit switch speed, an increased conductance per unit area is desirable. Switch transistors in which the current flow is primarily vertical offer reduced resistance per area; this benefit can be further improved by arranging the control channel of the transistor to lie in the vertical direction, e.g., a "trench" channel transistor. The resistance of the transistor has several components, including the resistance of transistor channel (the region where current is directly controlled by the input gate voltage), the resistance of the "drift" region (the region designed to hold the breakdown voltage of the transistor), and the resistance of the starting substrate, contacts, metals, etc.

Transistors with vertical current flow are typically designed with the drain contact at the bottom surface of the chip, and the gate and source contacts at the top surface of the chip.

Improvements in switch resistance and capacitance can be made by changing the semiconductor material from silicon to a wide bandgap material such as gallium nitride, which offers a higher critical field for breakdown. This allows the high-voltage drift region of the device to be made thinner and more heavily doped than with similar silicon devices, reducing the "specific resistance" (resistance×area) of the drift region, and reducing the device on resistance for a given die size.

An edge termination structure is commonly provided adjacent to the active device structure on the top surface of the chip in order to provide the transistor with the ability to operate at high voltage and to withstand transient overvoltage stresses. This edge termination structure reduces the average electric field near the edge of the active device structure to increase the breakdown voltage of the junction(s) at the edge of the active device, and may further allow the device to withstand some level of transient overvoltage conditions by entering an avalanche breakdown mode during such conditions. A proper edge termination design will use the minimum area necessary to reduce the electric field at the devices edge without added area and capacitance.

Exemplary embodiments of the invention relate to semiconductor manufacturing technology, and more specifically, to structures and methods for forming edge-termination structures adjacent to Schottky diodes, p-n diodes, merged p-n/Schottky diodes ("MPS diodes"), and arrays of vertical conducting FET channels.

One such vertical FET transistor structure is described in U.S. Pat. No. 9,117,839, the entire disclosure of which is incorporated by reference for all purposes. In this structure, the transistor conducting channel is formed using a semiconductor "fin" created by patterning and etching surrounding material to a certain depth. A semiconductor material with an opposite doping type is epitaxially regrown (e.g., using metalorganic vapor phase epitaxy, or MOVPE) to be substantially planar to the top of the semiconductor "fin". The regrown material serves as the gate electrode of a vertical FET, and application of control voltages to the gate electrode modulates the conduction of current in the vertical "fin" channel between the top of the fin ("source") and bottom of the fin (normally, the drift region which is further connected to the "drain" electrode via the semiconductor substrate). Other device structures, including vertical JFETs, vertical MOSFETs, Schottky diodes, p-n junction diodes, and MPS diodes, are illustrated in U.S. Patent Application Publication Nos. 2021/0193846, 2021/0399091, 2022/0013626 and 2022/0020743, the entire disclosures of which are incorporated by reference for all purposes.

Edge termination structures may be formed by a number of methods. One type of edge termination structure involves creating a tapered junction adjacent to the active transistor by implantation through a mask with a tapered thickness (see, e.g., U.S. Patent Application Publication No. 2022/0020743). In such an approach, the depletion charge on the junction is spread laterally over a large distance, reducing the lateral electric field adjacent to the active transistor region.

Another type of edge-termination structure uses floating guard rings adjacent to the active device region (see, e.g., U.S. Pat. No. 9,117,839, the entire disclosure of which is incorporated by reference for all purposes). This type of structure provides a series of concentric isolated junction regions adjacent to the active transistor region, where each junction region is separated by an intervening semiconductor region of opposite conduction type. As the voltage on the transistor drain is increased, the depletion region of the active transistor region increases in width, and "captures" adjacent guard rings. The guard ring structure also serves to spread the potential drop in the lateral direction over a large distance, reducing the lateral electric field adjacent to the active transistor region.

The design of such floating guard-ring structures involves designing the space between guard rings such that the depletion semiconductor can "capture" the guard ring (and spread out the potential drop) before a critical breakdown field occurs locally. The spacing becomes a part of the design, and variations in the coupling of the depletion to the guard ring (e.g., from lithographic variations) can create variations in the robustness of the guard ring structure.

The guard rings may be coupled by other methods. One example is the fabrication of separated guard rings by use of a masked implantation into a blanket junction region to "neutralize" the conductivity of the junction region between the desired guard rings (see, e.g., U.S. Pat. No. 8,866,148, the entire disclosure of which is incorporated by reference for all purposes). By appropriate choice of implantation energy, a conducting region may be left at the bottom of the junction region between guard rings, providing a resistive coupling path. As the drain voltage is increased, this resistive coupling region will deplete, allowing the guard rings to float and spread the potential drop laterally. Such an approach relaxes the lithographic design requirements of a conventional floating guard ring. This approach requires close matching of the implant conditions and the junction thickness, which requires tight manufacturing control on the junction thickness.

Exemplary embodiments of the present invention relax the requirement for matching the implant conditions and junction thickness by creating a coupling path, defined by one or more lithographic steps, at the top surface of the junction. The lithographic step(s) and the creation of the coupling path may be made concurrently or simultaneously with the creation of the guard rings, and the fabrication of the coupling path and guard rings can be either by a subtractive process (e.g., the neutralization of an existing junction region), by an additive process (e.g., the creation of new junction regions by masked implantation), or by a combination of the two techniques.

FIG. 1A illustrates a plan view of a semiconductor device 100 according to an embodiment of the present invention. As shown in FIG. 1A, the semiconductor device includes an active device region 120 that is surrounded by concentric guard rings 122 that extend to a distance for reducing the lateral field of the depletion region of the active device region 120 to a value equal or lower than that of the vertical field of the active device region 120. For example, the width of the region including the guard rings 122 may be 2-5 times the thickness of the vertical "drift" region in the active device region 120. The active device region 120 and the guard rings 122 may include the same material, such as unimplanted p-GaN. As discussed above, the active device region 120 may include Schottky diodes, PN diodes, vertical JFETs, thyristors, BJTs, and/or other devices.

Concentric junctions 124 are formed between adjacent ones of the guard rings 122, and between the active device region 120 and the innermost one of the guard rings 122. The junctions 124 have a higher resistivity than the guard rings 122. In addition, coupling paths 126 are formed to connect at least some of the guard rings 122. The coupling paths 126 may include the same material as the active device region 120 and the guard rings 122, such as unimplanted p-GaN. Some of the coupling paths 126 may also connect the active device region 120 with the innermost one of the guard rings 122. In some embodiments, the coupling paths 126 may be depleted as the bias on the guard rings 122 increases, eliminating the coupling at an appropriate voltage. In some embodiments, not all of the guard rings 122 are connected by the coupling paths 126. In some embodiments, the resistance of the coupling paths 126 between adjacent guard rings 122 may be varied according to the degree of coupling required (for example, the number of the coupling paths 126 and/or the width of the coupling paths 126 may be different between different pairs of adjacent guard rings 122). In some embodiments, the depletion voltages of coupling paths 126 between different sets of guard rings 122 may be different, according to the desired floating potential difference between the adjacent guard rings 122.

FIG. 1B illustrates a cross-sectional view through a first line A-A' of the semiconductor device 100 shown in FIG. 1A. The cross-section shown in FIG. 1B is taken through a region that includes the coupling paths 126. As shown in FIG. 1B, the top surface 127 of the coupling paths 126 may be parallel to the top surface 123 of the guard rings 122. FIG. 1C illustrates a cross-sectional view through a second line B-B' of the semiconductor device 100 shown in FIG. 1A. The cross-section shown in FIG. 1C is taken through a region that does not include the coupling paths 126. As shown in FIGS. 1B and 1C, the semiconductor device 100 also includes a drift region 128 that may include n-GaN.

FIG. 2 illustrates a cross-sectional view through a third line C-C' of the semiconductor device 100 shown in FIG. 1A. The cross-section shown in FIG. 2 is taken through a region that includes the coupling paths 126. As shown in FIG. 2, each coupling path 126 may have an "undercut" such that the width W of the coupling path 126 decreases from the top surface of the coupling path 126 to the tapered bottom of the coupling path 126. In this example, the coupling path 126 has a teardrop shape. This may be achieved by performing ion implantation 232 into the junction 124 from above the semiconductor device 100, and using a mask 230 to define the top width of the coupling path 126. Due to lateral "straggle" of the implanted ions caused by scattering events in the surface layer during the ion implantation 232, some of the implanted ions may penetrate into the region of the junction 124 underneath the mask 230. The shape and the resistance of the coupling path 126 may be determined by adjusting the width of the mask 230 and/or the amount of the lateral straggle, which is a function of the energy of the implanted ions.

Figures 3A, 3B:
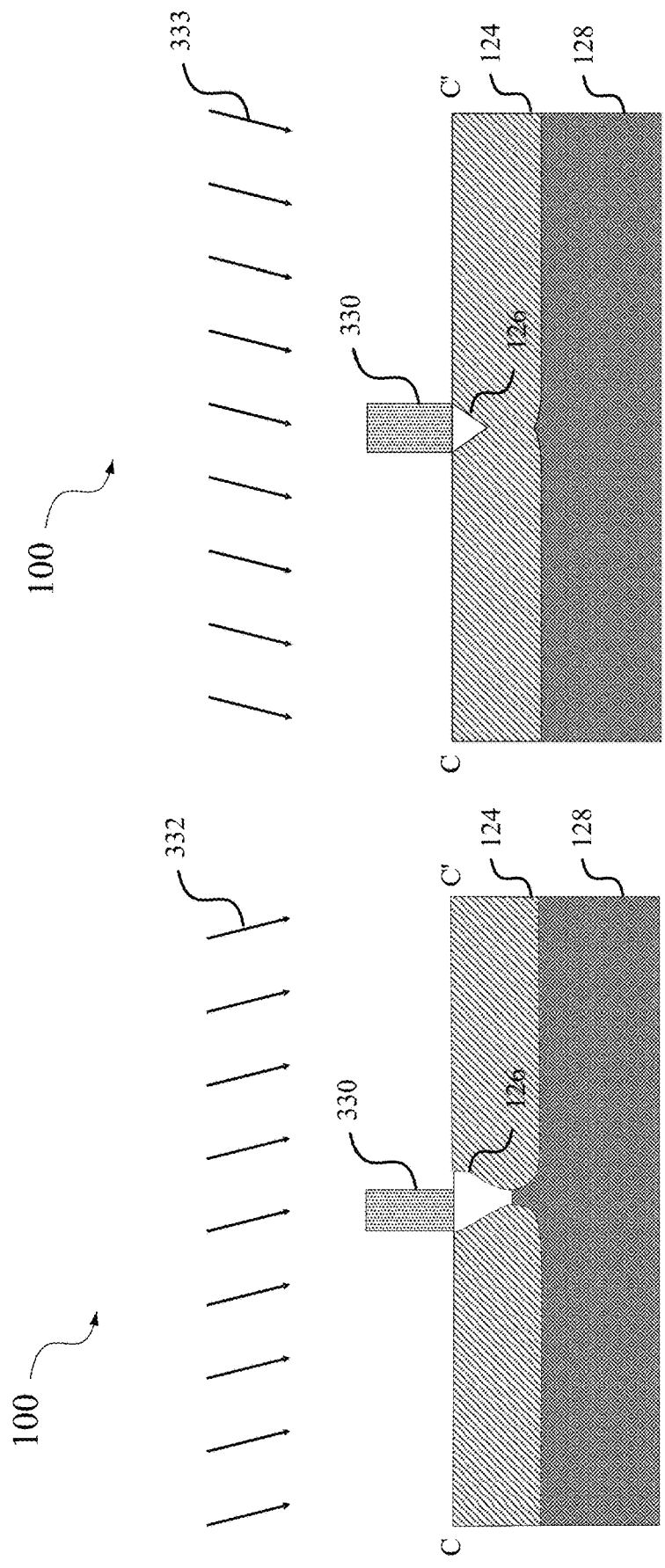
FIGS. 3A and 3B illustrate another cross-sectional view through the third line C-C' of the semiconductor device shown in FIG. 1A.

FIGS. 3A and 3B illustrate another cross-sectional view through the third line C-C' of the semiconductor device 100 shown in FIG. 1A. As shown in FIG. 3B, each coupling path 126 may have an "undercut" such that the width of the coupling path 126 decreases from the top surface of the coupling path 126 to the bottom point of the coupling path 126. In this example, the coupling path 126 has a triangular shape. This may be achieved by directing the ion beam into the junction 124 of the semiconductor device 100 at multiple angles with respect to the top surface during successive implant steps. For example, a first ion implantation 332 shown in FIG. 3A may be performed at a first angle, and a second ion implantation 333 shown in FIG. 3B may be performed at a second angle that is a mirror reflection of the first angle. A mask 330 may be used to define the top width of the coupling path 126. The angles may be chosen to further direct the implanted ions under the mask 330, thereby neutralizing the conductivity of the junction 124 to a shallower depth than achieved by lateral straggle alone.

Figure 4:
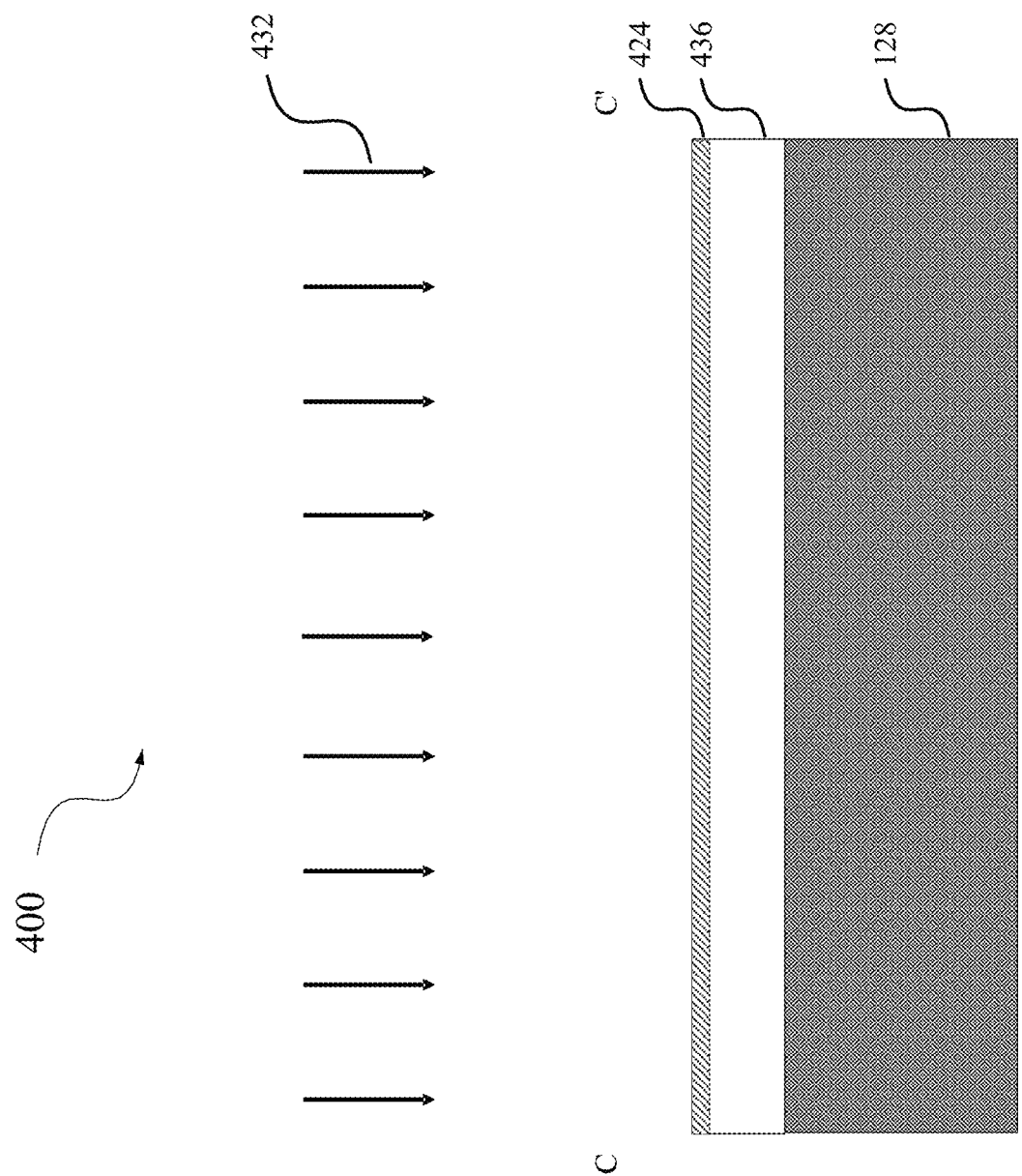
FIGS. 4 and 5 illustrate a method of forming a buried coupling path in a semiconductor device according to an embodiment of the present invention.
Figure 5:
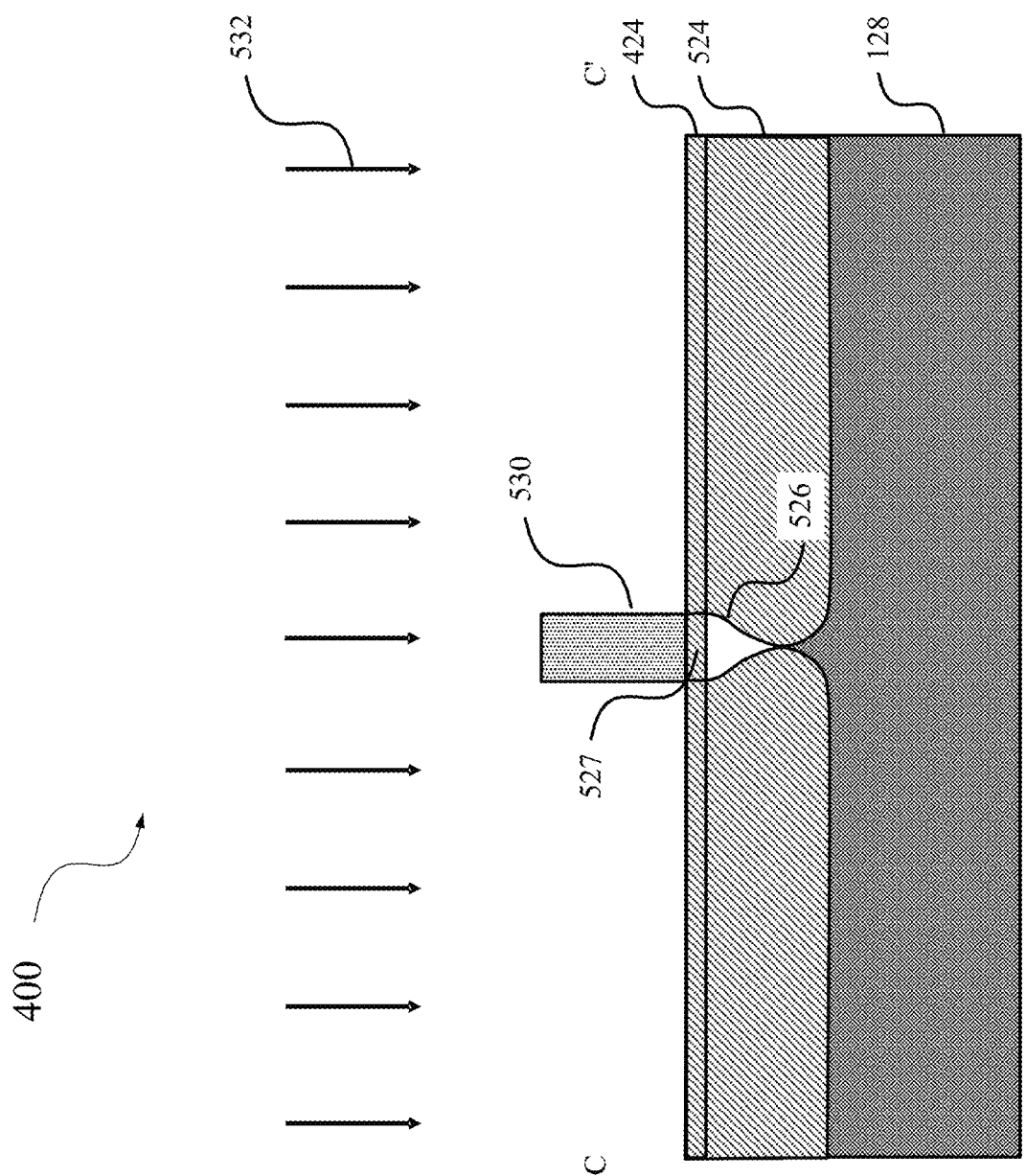

FIGS. 4 and 5 illustrate a method of forming a buried coupling path in a semiconductor device 400 according to an embodiment of the present invention. FIGS. 4 and 5 show another cross-sectional view corresponding to the third line C-C' of the semiconductor device 100 shown in FIG. 1A. As shown in FIG. 4, a first ion implantation 432 may be performed from above the semiconductor device 400 to create a first implanted layer 424 at a top surface of a field region 436. Then, as shown in FIG. 5, a second ion implantation 532 may be performed to create a second implanted layer 524, which defines the shape of the coupling path 526. In this example, the coupling path 526 has a teardrop shape. This may be achieved by performing the second ion implantation 532 from above the semiconductor device 400, and using a mask 530 to define the top width of the coupling path. Due to lateral "straggle" of the implanted ions caused by scattering events in the surface layer during the ion implantation 532, some of the implanted ions may penetrate into the region of the second implanted layer 524 underneath the mask 530. This results in the coupling path 526 being buried beneath a portion 527 of the first implanted layer 424.

Figure 6B:
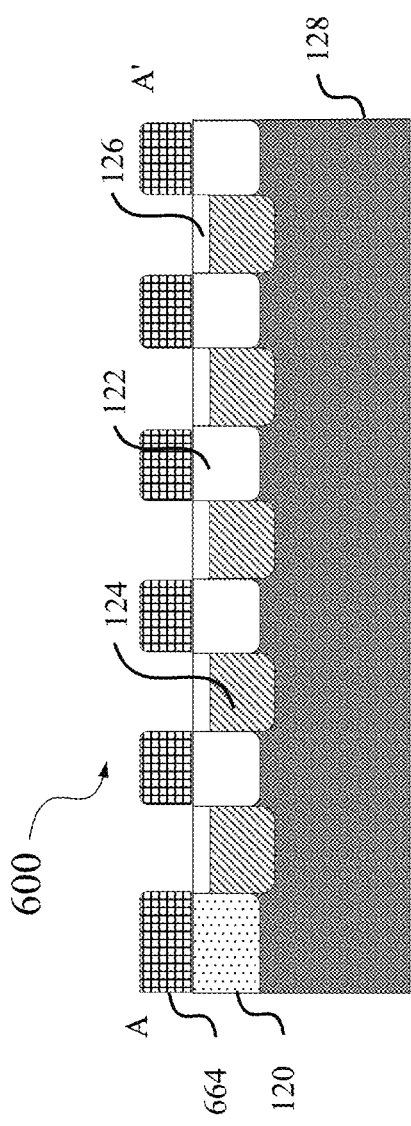
FIG. 6B illustrates a cross-sectional view through a first line A-A' of the semiconductor device shown in FIG. 6A.
Figure 6C:
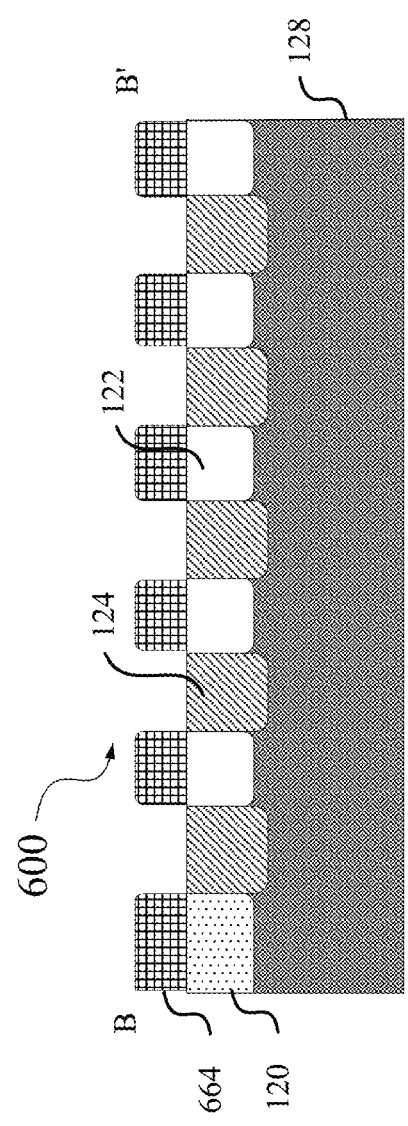
FIG. 6C illustrates a cross-sectional view through a second line B-B' of the semiconductor device shown in FIG. 6A.
Figure 6A:
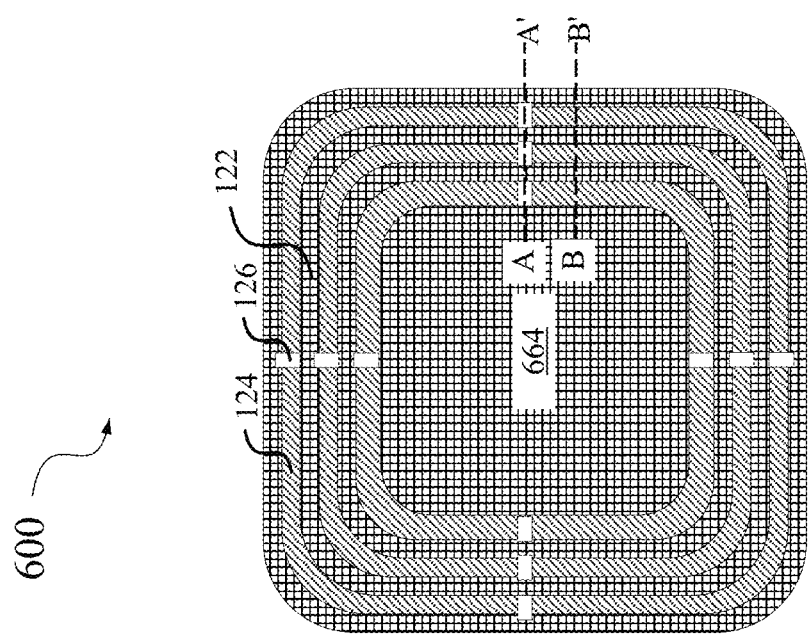
FIG. 6A illustrates a plan view of a semiconductor device including contact electrodes according to an embodiment of the present invention.

FIG. 6A illustrates a plan view of a semiconductor device including contact electrodes according to an embodiment of the present invention. FIG. 6B illustrates a cross-sectional view through a first line A-A' of the semiconductor device shown in FIG. 6A. FIG. 6C illustrates a cross-sectional view through a second line B-B' of the semiconductor device shown in FIG. 6A. Thus, FIGS. 6A-6C illustrate an example of a semiconductor device 600 in which contact electrodes are formed on the semiconductor device 100 shown in FIGS. 1A-1C.

As shown in FIGS. 6A-6C, metal straps 664 may be formed on the top surface of one or more of the guard rings 122. Alternatively or in addition, the metal straps 664 may be formed on the top surface of the active device region 120. In some examples, the metal straps 664 may include nickel and/or gold. The metal straps 664 may help the guard rings 122 dissipate energy in the event of an electrical discharge. The metal straps also help to maintain uniform potential in the guard ring, in particular far away from the coupling path 126.

Figure 7:
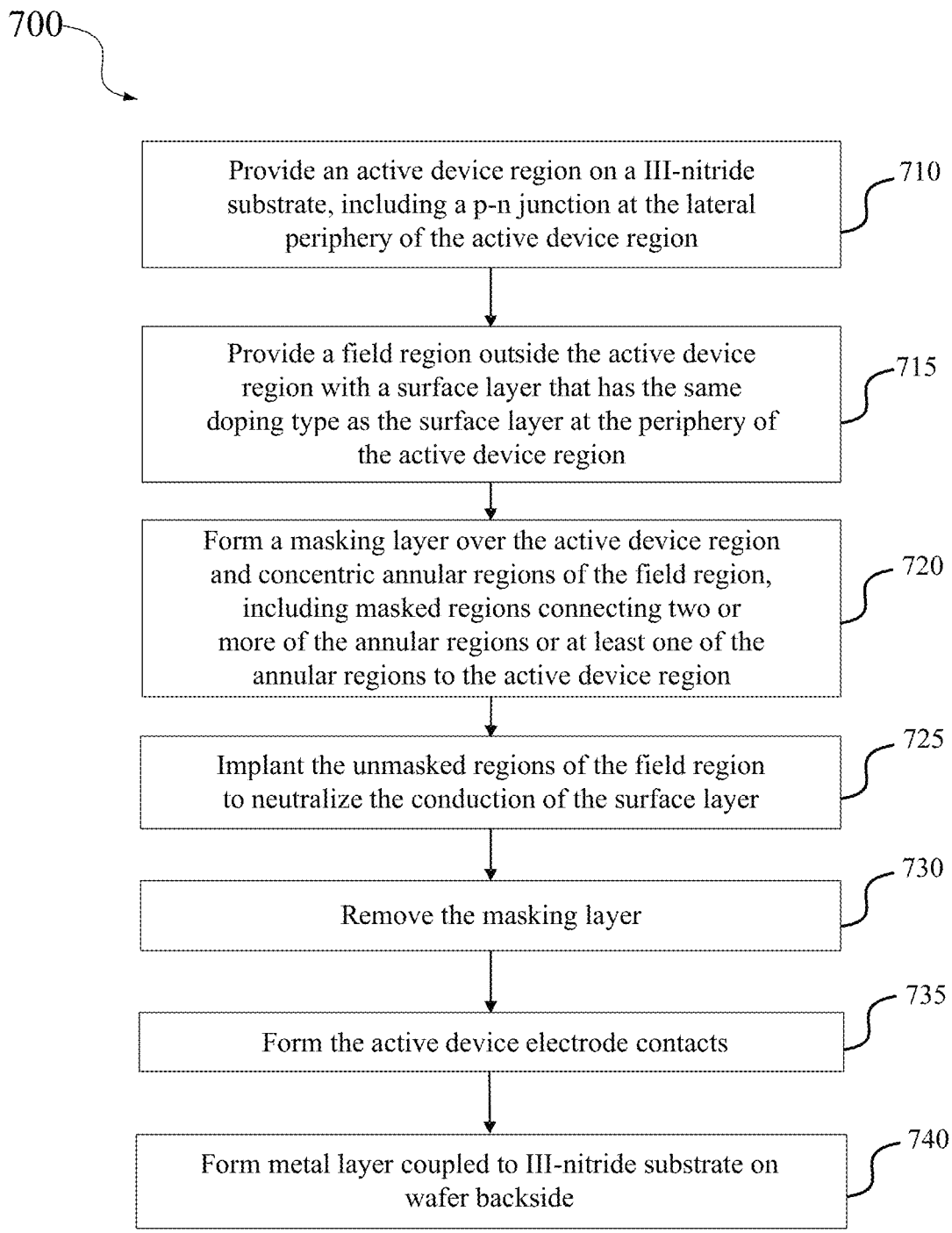
FIG. 7 is a simplified flowchart illustrating a method of manufacturing a semiconductor device according to some embodiments of the present invention.

FIG. 7 is a simplified flowchart illustrating a method of manufacturing a semiconductor device according to some embodiments of the present invention. Referring to FIG. 7, an active device region is provided on a III-nitride substrate, including a p-n junction at the lateral periphery of the active device region, at block 710. In some embodiments, the active device region includes a plurality of vertical JFETs. In some embodiments, the active device region includes a vertical MOSFET. In some embodiments, the active device region includes one of a p-n junction diode, Schottky diode, or MPS diode. In some embodiments, the active device region includes combinations of FETs and diodes.

Method 700 also includes providing a field region outside the active device region with a similar p-n junction to that at the lateral periphery of the active device region at block 715. For example, a regrown p-GaN region (or, alternatively, an implanted p-GaN region or a diffused p-GaN region) may be formed adjacent to the active transistor region of a vertical FET (which can be a JFET or a MOSFET).

Figure 8B:
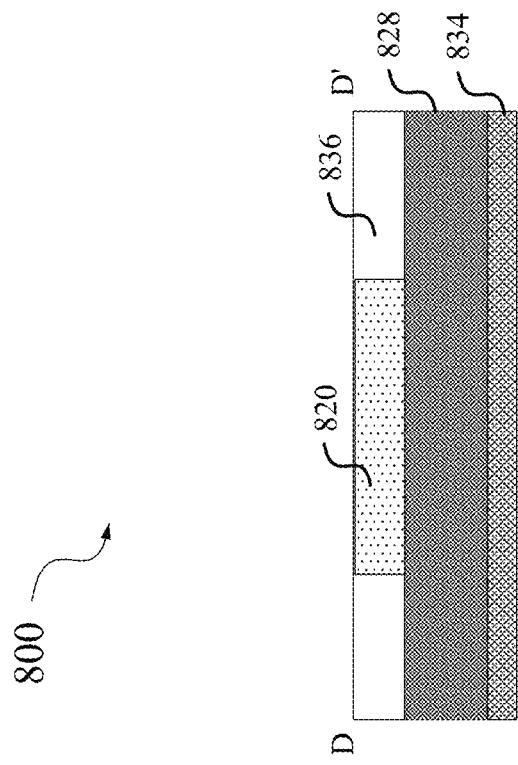
FIG. 8B illustrates a cross-sectional view through a line D-D' of the semiconductor device shown in FIG. 8A.
Figure 8A:
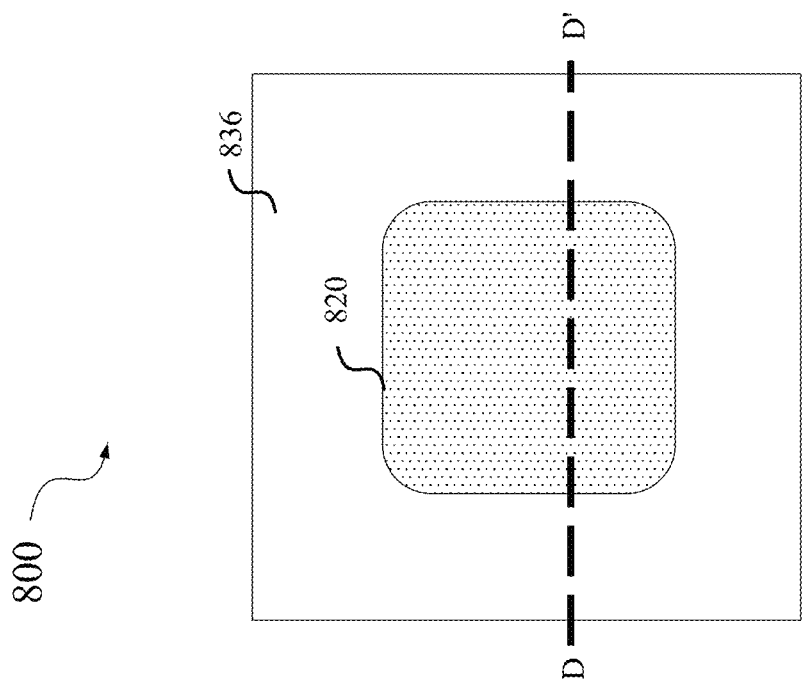
FIG. 8A is a plan view of a semiconductor device manufactured in accordance with FIG. 7.

FIG. 8A is a plan view of a semiconductor device manufactured in accordance with FIG. 7. FIG. 8B illustrates a cross-sectional view through a line D-D' of the semiconductor device shown in FIG. 8A. Thus, FIGS. 8A and 8B illustrate an example of a semiconductor device 800 as provided by blocks 710 and 715 of method 700 shown in FIG. 7.

As shown in FIGS. 8A and 8B, the semiconductor device 800 includes an active device region 820 that is surrounded by a field region 836. The field region 836 may include a surface layer having the same doping type as the periphery of the active device region 820. The semiconductor device 800 also includes a drift region 828 that is formed on a substrate 834.

In some embodiments, the active device region 820 and the field region 836 may be fabricated on the drift region 828, which may be a first III-nitride epitaxial layer. The drift region 828 may be formed on the substrate 834, which may be a III-nitride substrate. In some embodiments, the III-nitride substrate is an n-GaN substrate. In some embodiments, the III-nitride substrate has a resistivity of less than 0.020 ohm-cm or less than 0.014 ohm-cm. In some embodiments, the first III-nitride epitaxial layer is an n-GaN layer with a net doping concentration between $5\times10^{15}$ cm$^{-3}$ and $5\times10^{16}$ cm$^{-3}$ and a thickness between 3 μm and 12 μm. In some embodiments, the surface layer that includes the active device region 820 and the field region 836 is a regrown p-GaN layer with a doping concentration between $5\times10^{18}$ cm$^{-3}$ and $3\times10^{19}$ cm$^{-3}$ and a thickness between 0.5 μm and 1.0 μm.

In some embodiments, the active device region 820 includes one or more vertical JFETs. In some embodiments, the active device region 820 includes one or more vertical MOSFETs. In some embodiments, the active device region 820 includes one or more Schottky diodes. In some embodiments, the active device region 820 includes one or more p-n junction diodes. In some embodiments, the active device region 820 includes more than one of the above devices.

Returning to FIG. 7, method 700 also includes forming a masking layer over the active device region and on concentric annular regions of the field region at block 720. In addition, method 700 further includes forming the masking layer on regions, e.g., narrow regions, which can be referred to as coupling regions, connecting two or more of the annular regions or at least one of the annular regions to the active device region at block 720.

FIGS. 9A-9C illustrate an example of a semiconductor device 900 as modified by block 720 of method 700 shown in FIG. 7. FIG. 9B illustrates a cross-sectional view through a first line A-A' of the semiconductor device 900 shown in FIG. 9A. FIG. 9C illustrates a cross-sectional view through a second line B-B' of the semiconductor device 900 shown in FIG. 9A.

As shown in FIGS. 9A-9C, a masking layer 938 is formed on the top surface 821 of the active device region 820 and over portions of the field region 836. The pattern of the masking layer 938 on the field region 836 includes concentric annular masking layer regions with strips, e.g., narrow strips, of masking layer crossing between one or more of the annular masking layer regions. Referring to FIG. 9B, the masking layer strip crosses the field region 836 to the outer edge of the last annular masking layer region.

In some embodiments, the masking layer 938 is a photoresist having a thickness between 1.5 μm and 3 μm. In some embodiments, the minimum width $W_{mask}$ of the annular masking layer region is between 0.6 µm and 1.0 µm. In some embodiments, the widths of the annular masking layer regions are all the same. In some embodiments, the widths of the annular masking layer regions increase for annular photoresist regions farther from the active device region 820. In some embodiments, the widths $W_{opening}$ of the annular openings 939 are between 1 µm and 5 µm. In some embodiments, the width of the outermost annular opening is larger than the width of the innermost annular opening. In some embodiments, the width of the masking strip is between 0.6 µm and 1.0 µm.

Referring to FIGS. 9A and 9C, the annular masking layer regions 938 are present between the annular openings 937. In some embodiments, a top surface 837 of the semiconductor material adjacent at least one of the plurality of connector openings 937, is arranged parallel to a top surface of the semiconductor material adjacent the plurality of concentric annular openings 939. In other embodiments, a top surface of the semiconductor material adjacent at least one of the plurality of connector openings 937 is arranged below a top surface of the semiconductor material adjacent the plurality of concentric annular openings 939.

Returning to FIG. 7, method 700 further includes using ion implantation to implant the unmasked regions of the field region to neutralize the conduction of the surface layer at block 725. The masking layer selectively blocks the ion-implantation of one or more "neutralizing" species at one or more energies and one or more tilt angles. The "neutralizing" species decrease the conductivity of the surface region between masked regions. In some embodiments, this decrease in conductivity is greater than 10,000 times. In some embodiments, the surface region is p-GaN. In some embodiments, the "neutralizing" implanted species includes one or more of oxygen, nitrogen, helium, argon, or silicon.

The widths of the coupling regions are chosen to allow the lateral straggle of the ion implantation process to neutralize the surface region (e.g., p-GaN) at some depth below the surface. For example, for a p-GaN region having a depth between 0.6 µm and 0.8 µm, the mask region may have a width between 0.5 µm and 1.0 µm.

The width of the remaining conducting surface region in the coupling region also may be controlled by implanting the neutralizing species at angles with respect to the mask, such that some amount of the implanted species is implanted underneath the outer edges of the masking layer. For example, the ions may be implanted at tilt angles between 7 degrees and 45 degrees relative to the surface of the wafer. In some embodiments, multiple implants are performed at different tilt angles such that the different sides of the coupling region have identical implant profiles.

The resulting resistive connection formed in the coupling region is a shallow region connecting adjacent guard rings. In some embodiments, the coupling region and the guard rings are p-GaN, where the guard rings are formed from the full thickness of the p-GaN. The resistive connection in the coupling region thus has a higher sheet resistance (for example, 10-1000 times higher) than the floating guard ring p-GaN region.

In some embodiments, multiple coupling regions between adjacent guard rings may be formed in the masking layer. These multiple coupling regions may be arranged symmetrically or asymmetrically about the active device region, and may consist of the same or different numbers of coupling regions per side of the active device region or between adjacent guard rings. As illustrated in FIG. 9A, in an embodiment, four coupling regions on the four sides of the active device region are utilized.

FIGS. 10A-10C illustrate an example of a semiconductor device 1000 as modified by block 725 of method 700 shown in FIG. 7. FIG. 10B illustrates a cross-sectional view through a first line A-A' of the semiconductor device 1000 shown in FIG. 10A. FIG. 10C illustrates a cross-sectional view through a second line B-B' of the semiconductor device 1000 shown in FIG. 10A.

As shown in FIGS. 10A-10C, an ion implantation 1042 is performed into the surfaces exposed by the masking layer 938. The implant species is chosen such that the implant neutralizes the conductivity of the surface layer of the field region 836. Referring to FIG. 10B, the implant is blocked by the masking layer 938 in the region that will become the coupling paths 1026. Referring to FIG. 10C, the implant is introduced into the surface layer of the field region 836 between the concentric annular masking layer regions of the masking layer 938, thereby forming the junction 1024. The remaining portion of the field region 836 will become the guard rings 1022.

The implant energy may be chosen so that the implanted ions can fully penetrate the depth of the field region 836. In addition, the width of the masking strip of the masking layer 938 may be chosen such that the implanted ions will penetrate across the surface layer of the field region 836 at some depth under the masking layer 938, according to the lateral "straggle" of the implanted ions caused by scattering events in the surface layer during the implantation, as discussed above with reference to FIG. 2. Alternatively or in addition, the ion beam may be directed at the surface at multiple angles by successive implant steps within the implantation procedure. The angles can be chosen to further direct the implanted ions under the masking strip in the masking layer 938, thereby neutralizing the conductivity of the surface layer of the field region 836 to a shallower depth than achieved by lateral straggle alone, as discussed above with reference to FIG. 3.

In some embodiments, the surface layer of the field region 836 is a p-GaN layer with a doping concentration between $5 \times 10^{18}$ cm$^{-3}$ and $3 \times 10^{19}$ cm$^{-3}$. In some embodiments, the implanted species is one or more of nitrogen, oxygen, helium, argon or silicon. In some embodiments, the thickness of the surface layer of the field region 836 is between 0.7 µm and 1.0 µm. In some embodiments, the implantation process is performed with multiple doses at different energies. In some embodiments, the implant is performed at an angle of up to 45° with respect to the normal to the surface layer of the field region 836. In some embodiments, the maximum energy of the implant is between 500 keV and 600 keV.

The total implant dose may be chosen to neutralize the conductivity of the surface layer of the field region 836 that becomes the junction 1024. For example, for a p-GaN surface layer with a doping concentration of $2 \times 10^{19}$ cm$^{-3}$ and a thickness of 0.8 µm, a total implant dose between $5 \times 10^{13}$ cm$^{-3}$ and $5 \times 10^{14}$ cm$^{-3}$ may be used for nitrogen implantation.

Returning to FIG. 7, method 700 further includes removing the masking layer at block 730. FIGS. 11A-11C illustrate an example of a semiconductor device 1100 as modified by block 730 of method 700 shown in FIG. 7. FIG. 11B illustrates a cross-sectional view through a first line A-A' of the semiconductor device 1100 shown in FIG. 11A. FIG. 11C illustrates a cross-sectional view through a second line B-B' of the semiconductor device 1100 shown in FIG. 11A.

As shown in FIGS. 11A and 11B, coupling paths 1026, which may be thin in comparison to the depth of the junctions 1024, exist in the remaining surface layer of the field region 836 that had been covered by the masking strip between the annular conductive surface layer regions forming the guard rings 1022. As shown in FIG. 11C, the guard rings 1022 are separated by the junctions 1024, which are low-conductivity regions outside of the regions that were covered by the masking strips.

Returning to FIG. 7, method 700 further includes forming contact electrodes on the active device region at block 735. These contact electrodes may be selected to be appropriate to the active device; for example, FET active devices would include source and gate contacts. In some embodiments, one of the contact electrodes is applied to the surface of each guard ring to provide a low-resistance metal on top of and in contact with the guard ring to "strap" the guard ring with a low resistance conducting path.

Figure 12B:
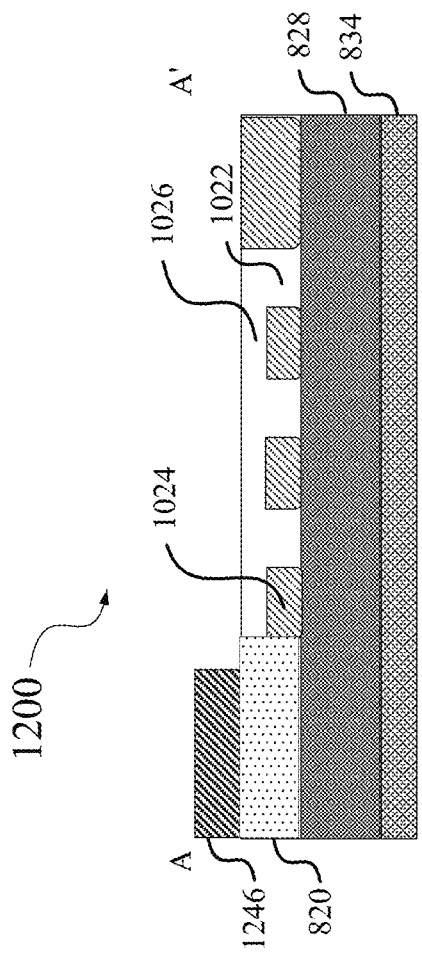
FIGS. 12A-12C illustrate another example of a semiconductor device as modified by another block of the method shown in FIG. 7.
Figure 12C:
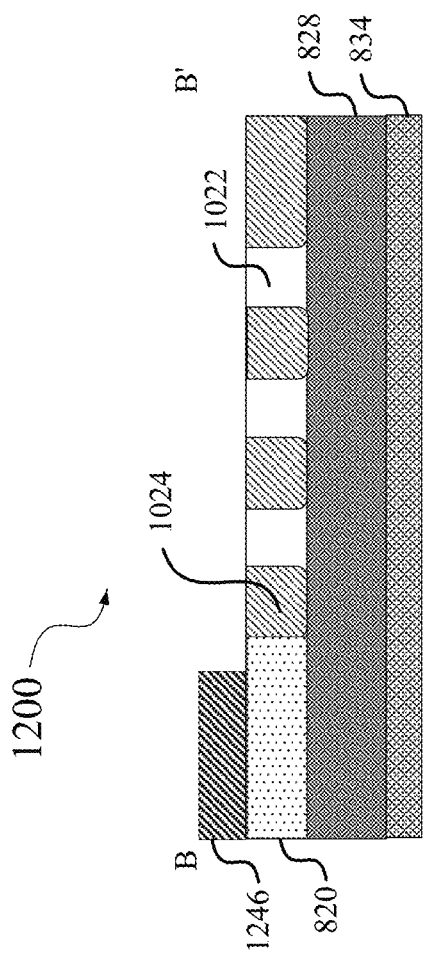
Figure 12A:
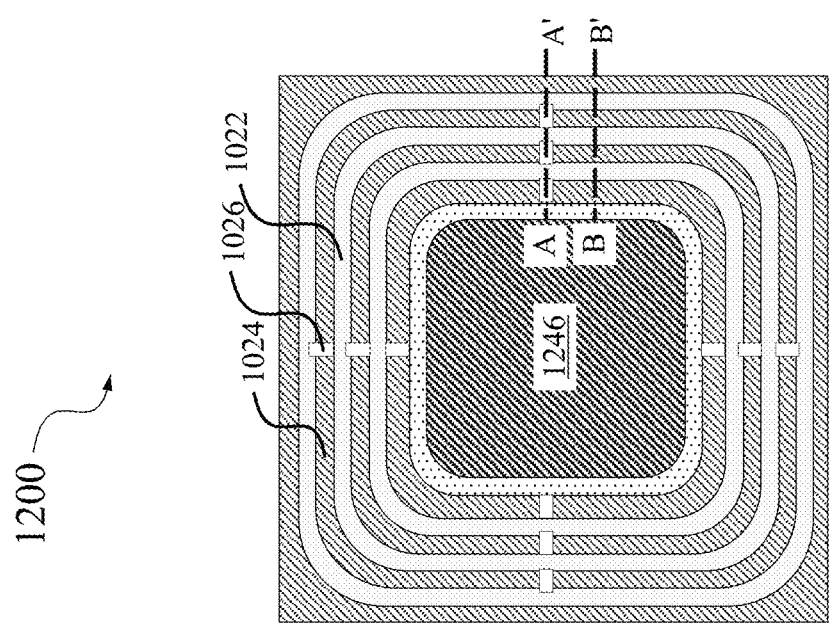

FIGS. 12A-12C illustrate an example of a semiconductor device 1200 as modified by block 735 of method 700 shown in FIG. 7. FIG. 12B illustrates a cross-sectional view through a first line A-A' of the semiconductor device 1200 shown in FIG. 12A. FIG. 12C illustrates a cross-sectional view through a second line B-B' of the semiconductor device 1200 shown in FIG. 12A.

As shown in FIGS. 12A-12C, contact electrodes 1246 are formed on the active device region 820. Contact electrodes are not formed on the coupling paths 1026. In some embodiments, such as the semiconductor device 1200 shown in FIG. 12C, the guard rings 1022 do not have contact electrodes. In some embodiments, such as the semiconductor device 600 shown in FIG. 6, contact electrodes such as metal straps 664 are formed over one or more of the guard rings 1022.

In some embodiments, the contact electrodes 1246 include n-type contact electrodes and p-type contact electrodes. In some embodiments, the contact electrodes 1246 include p-type contact electrodes. In some embodiments, the contact electrodes 1246 include p-type contact electrodes and Schottky contact electrodes. In some embodiments, the n-type contact electrodes include one or more of Ti, TiN, Al, or Mo. In some embodiments, the p-type contact electrodes include one or more of Au, Ni, Pt, or Pd.

Returning to FIG. 7, method 700 further includes forming a metal layer coupled to the opposite surface of the III-nitride wafer at block 740. This metal layer forms one of the electrodes of the active device; for example, for FET active devices, this metal layer would form the drain contact.

Figure 13B:
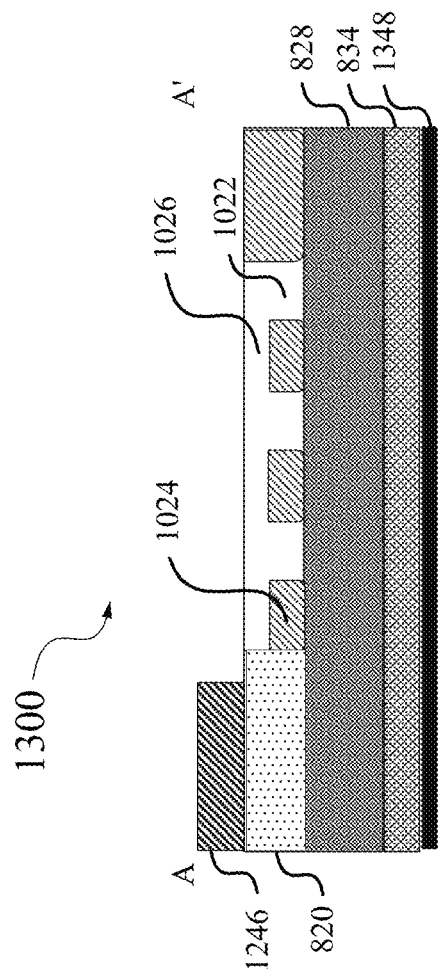
FIGS. 13A-13C illustrate another example of a semiconductor device as modified by another block of the method shown in FIG. 7.
Figure 13C:
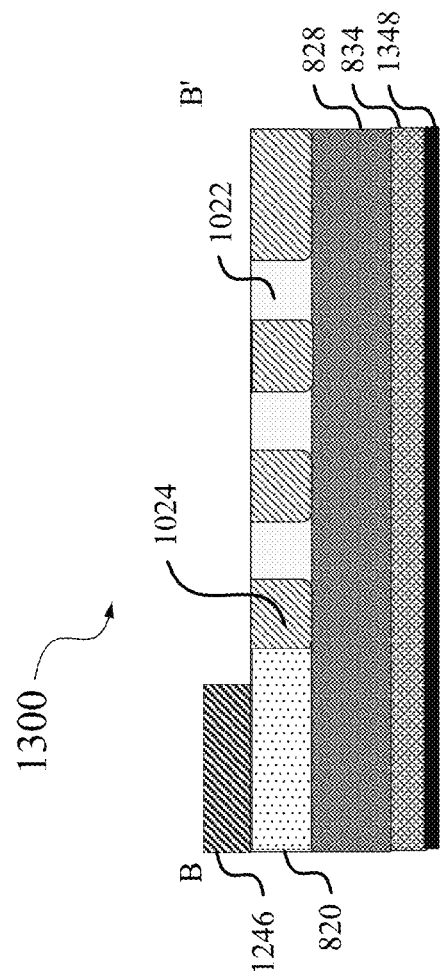
Figure 13A:
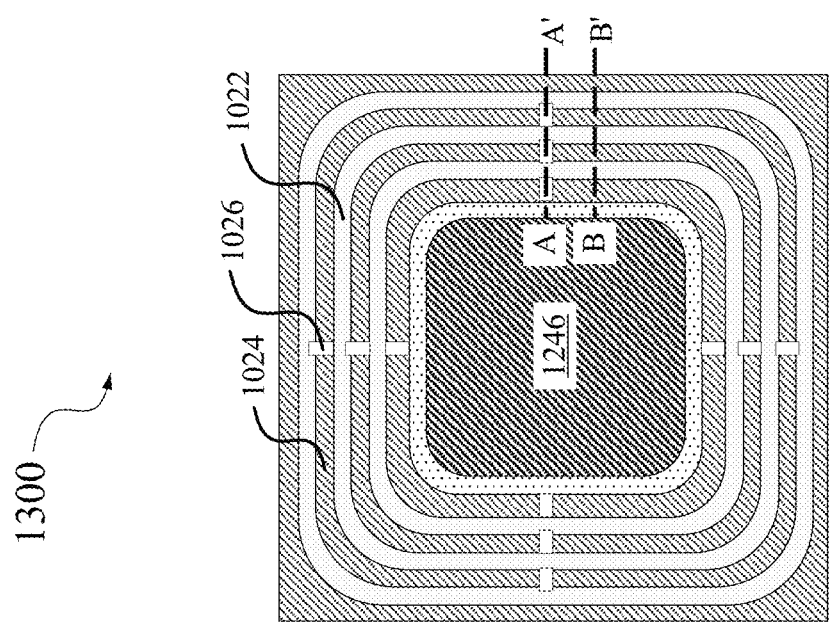

FIGS. 13A-13C illustrate an example of a semiconductor device 1300 as modified by block 740 of method 700 shown in FIG. 7. FIG. 13B illustrates a cross-sectional view through a first line A-A' of the semiconductor device 1300 shown in FIG. 13A. FIG. 13C illustrates a cross-sectional view through a second line B-B' of the semiconductor device 1300 shown in FIG. 13A.

As shown in FIGS. 13B and 13C, a metal electrode 1348 is formed on the opposite face of the substrate 834 to the active device region 820. In some embodiments, the substrate 834 is n-GaN and the opposite face is the nitrogen face. In some embodiments, the metal electrode 1348 includes one or more of Cr, Pt, Pd, Al, Ti, TiN, Ni, V, or Ag.

Figure 14:
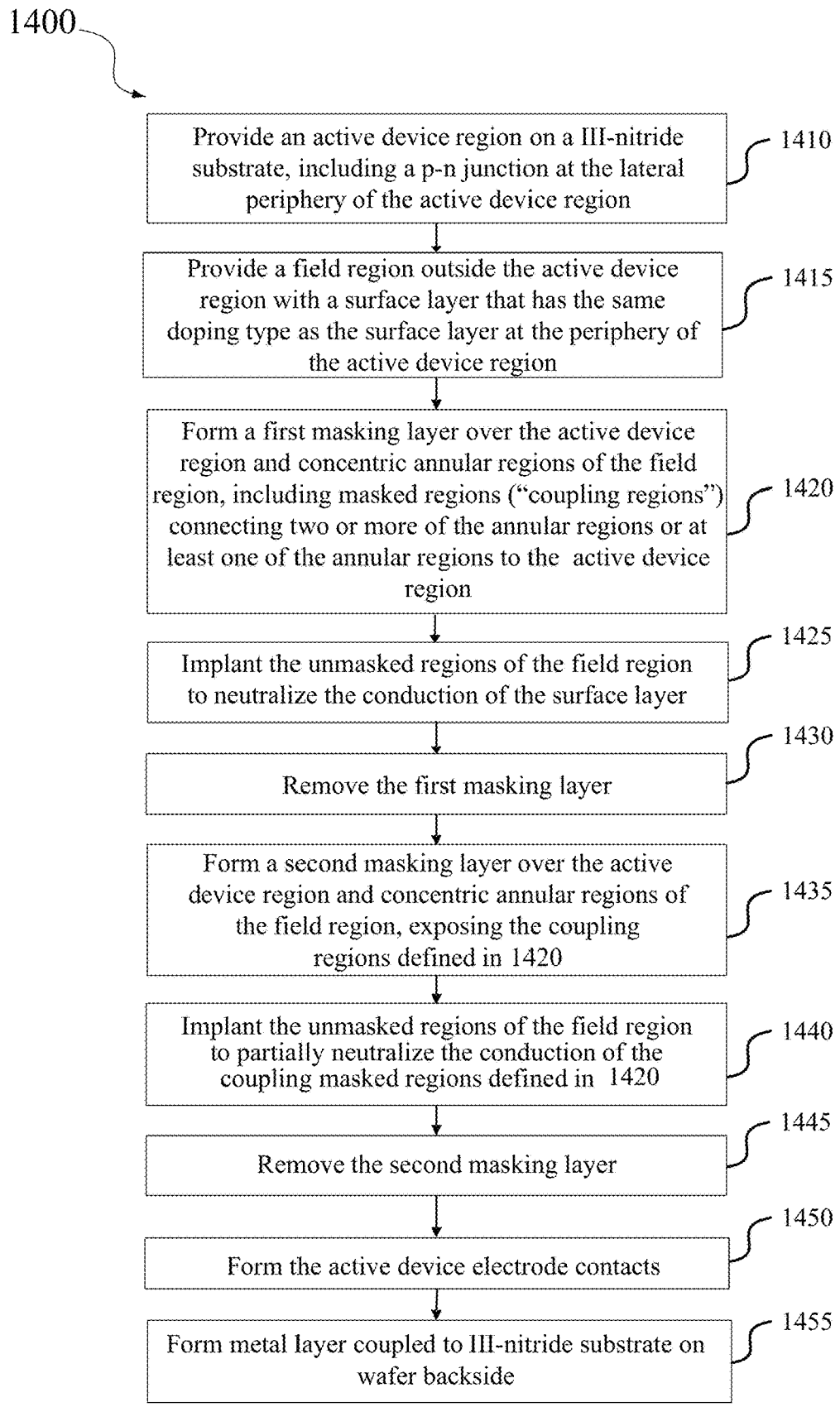
FIG. 14 is a simplified flowchart illustrating another method of manufacturing a semiconductor device according to some embodiments of the present invention.

FIG. 14 illustrates another method 1400 of manufacturing a semiconductor device according to some embodiments of the present invention. Referring to FIG. 14, an active device region is provided on a III-nitride substrate, including a p-n junction at the lateral periphery of the active device region, at block 1410. In some embodiments, the active device region includes a vertical JFET. In some embodiments, the active device region includes a vertical MOSFET. In some embodiments, the active device region includes one of a p-n junction diode, Schottky diode, or MPS diode. In some embodiments, the active device region includes combinations of FETs and diodes. In some embodiments, the p-n junction includes a surface p-GaN layer and a buried n-GaN drift region.

Method 1400 also includes providing a field region outside the active device region with a similar p-n junction to that at the lateral periphery of the active device region at block 1415. For example, a regrown p-GaN region (or, alternatively, an implanted p-GaN region or a diffused p-GaN region) may be formed adjacent to the active transistor region of a vertical FET (which can be a JFET or a MOSFET).

FIGS. 8A and 8B illustrate an example of a semiconductor device 800 as provided by blocks 1410 and 1415 of method 1400 shown in FIG. 14. The semiconductor device 800 shown in FIGS. 8A and 8B is described above.

Returning to FIG. 14, method 1400 also includes forming a first masking layer over the active device region and on concentric annular regions of the field region at block 1420. In addition, method 1400 further includes forming the first masking layer on regions, e.g., narrow regions, which may also be referred to as coupling regions, connecting two or more of the annular regions or at least one of the annular regions to the active device region at block 720.

FIGS. 9A-9C illustrate an example of a semiconductor device 900 as modified by block 1420 of method 1400 shown in FIG. 14. The semiconductor device 900 shown in FIGS. 9A-9C is described above. The masking layer 938 is an example of the first masking layer described in block 1420 of method 1400.

Returning to FIG. 14, method 1400 further includes using ion implantation to implant the unmasked regions of the field region to neutralize the conduction of the surface layer at block 1425. The masking layer selectively blocks the ion-implantation of one or more "neutralizing" species at one or more energies and one or more tilt angles. The "neutralizing" species decrease the conductivity of the surface region between masked regions. In some embodiments, this decrease in conductivity is greater than 10,000 times. In some embodiments, the surface region is p-GaN. In some embodiments, the "neutralizing" implanted species includes one or more of oxygen, nitrogen, helium, argon, or silicon. In some embodiments, the p-GaN region thickness is between 0.7 μm and 0.9 μm. In some embodiments, the implanted species is nitrogen implanted at multiple energies between 15 keV and 570 keV. In some embodiments, the total implanted dose is between $1\times10^{13}$ cm$^{-2}$ and $1.5\times10^{14}$ cm$^{-2}$.

The widths of the coupling regions are chosen to allow the lateral straggle of the ion implantation process to neutralize the surface region (e.g., p-GaN) at some depth below the surface. For example, for a p-GaN region having a depth between 0.6 μm and 0.8 μm, the mask region may have a width between 0.5 μm and 1.0 μm.

The width of the remaining conducting surface region in the coupling region also may be controlled by implanting the neutralizing species at angles with respect to the mask, such that some amount of the implanted species is implanted underneath the outer edges of the masking layer. For example, the ions may be implanted at tilt angles between 7 degrees and 45 degrees relative to the surface of the wafer. In some embodiments, multiple implants are performed at different tilt angles such that the different sides of the coupling region have identical implant profiles.

The resulting resistive connection formed in the coupling region is a shallow region connecting adjacent guard rings.

In some embodiments, the coupling region and the guard rings are p-GaN, where the guard rings are formed from the full thickness of the p-GaN. The resistive connection in the coupling region is thus a higher sheet resistance (for example, 10-1000 times higher) than the floating guard ring p-GaN region.

In some embodiments, multiple coupling regions between adjacent guard rings may be formed in the masking layer. These multiple coupling regions may be arranged symmetrically or asymmetrically about the active device region, and may consist of the same or different numbers of coupling regions per side of the active device region or between adjacent guard rings.

FIGS. 10A-10C illustrate an example of a semiconductor device 1000 as modified by block 1425 of method 1400 shown in FIG. 14. The semiconductor device 1000 shown in FIGS. 10A-10C is described above.

Returning to FIG. 14, method 1400 further includes removing the first masking layer at block 1430. FIGS. 11A-11C illustrate an example of a semiconductor device 1100 as modified by block 1430 of method 1400 shown in FIG. 14. The semiconductor device 1100 shown in FIGS. 11A-11C is described above.

Returning to FIG. 14, method 1400 further includes forming a second masking layer over the active device region and the concentric annular regions of the field region that were masked by the first masking layer at block 1435. This second masking layer is not present over the coupling regions between the annular regions.

Figure 15B:
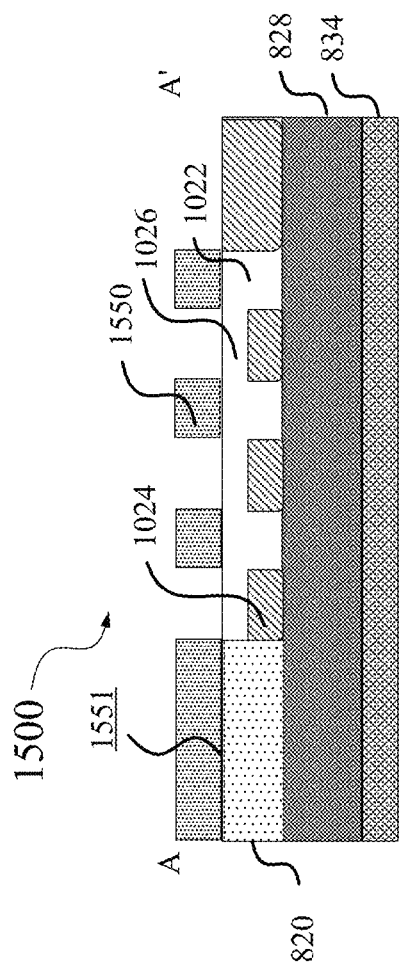
FIGS. 15A-15C illustrate an example of a semiconductor device as modified by a block of the method shown in FIG. 14.
Figure 15C:
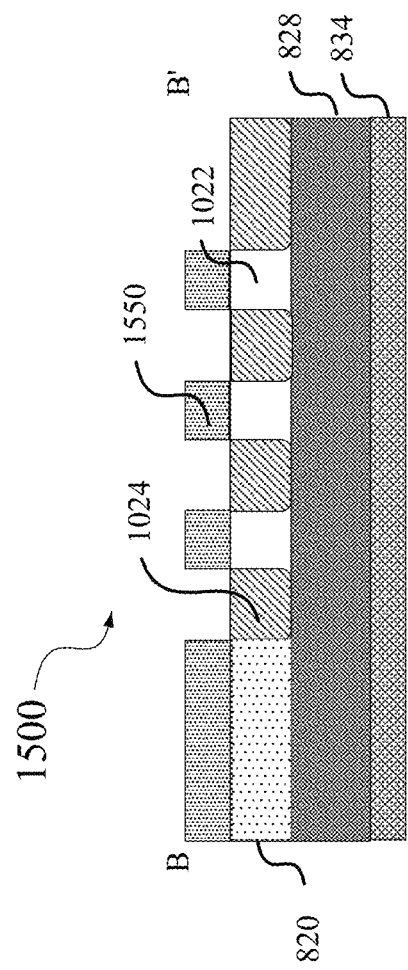
Figure 15A:
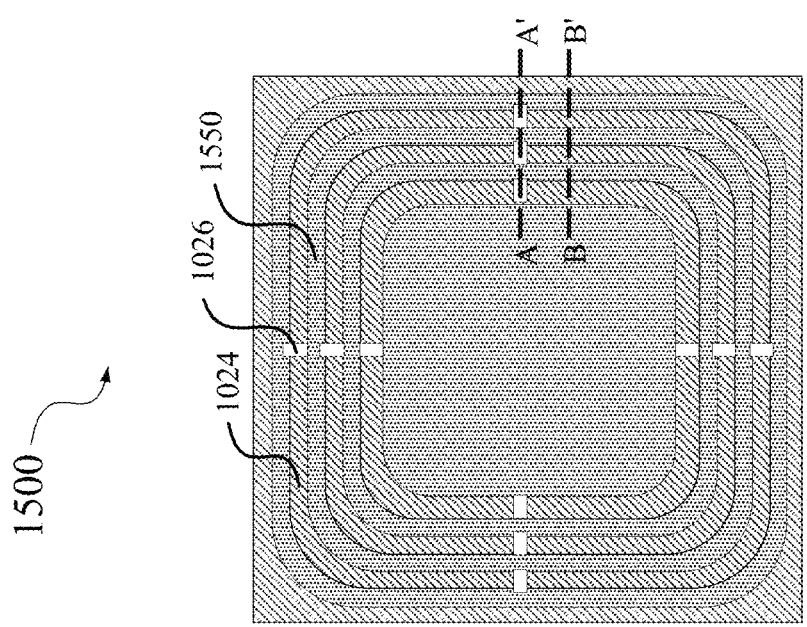

FIGS. 15A-15C illustrate an example of a semiconductor device 1500 as modified by block 1435 of method 1400 shown in FIG. 14. FIG. 15B illustrates a cross-sectional view through a first line A-A' of the semiconductor device 1500 shown in FIG. 15A. FIG. 15C illustrates a cross-sectional view through a second line B-B' of the semiconductor device 1500 shown in FIG. 15A.

As shown in FIGS. 15A-15C, a second masking layer 1550 is formed on the top surface 1551 of the active device region 820 and over portions of the field region 836. The pattern of the second masking layer 1550 on the field region 836 includes concentric annular masking layer regions coincident with the guard rings 1022 created by the first masking layer 938. As shown in FIG. 15B, the surfaces of the coupling paths 1026 are not covered by the second masking layer 1550. Further, the surfaces of the junctions 1024 are not covered by the second masking layer 1550.

In some embodiments, the second masking layer 1550 is a photoresist having a thickness between 1.5 μm and 3 μm. In some embodiments, the minimum width of the annular masking layer region of the second masking layer 1550 is between 0.6 μm and 1.0 μm. In some embodiments, the widths of the annular masking layer regions of the second masking layer 1550 are all the same. In some embodiments, the widths of the annular masking layer regions of the second masking layer 1550 increase for annular photoresist regions further from the active device region 820. In some embodiments, the widths of the annular openings of the second masking layer 1550 are between 1 μm and 5 μm. In some embodiments, the width of the outermost annular opening is larger than the width of the innermost annular opening. In some embodiments, openings are provided in the second masking layer 1550 corresponding to the active device region 820. In alternative embodiments, the minimum width of the annular masking layer region of the second masking layer 1550 is between 1 μm and 5 μm while the widths of the annular openings of the second masking layer 1550 are between 0.6 μm and 1.0 μm.

Returning to FIG. 14, method 1400 further includes implanting the unmasked regions with a neutralizing species to partially neutralize the conduction of the coupling regions at block 1440. In some embodiments, the implant neutralizes the conduction at the surface of the coupling regions. In some embodiments, the implant neutralizes the conduction at the bottom of the coupling regions. In some embodiments, the implanted species is one or more of oxygen, nitrogen, helium, argon or silicon. In some embodiments, the implantation energy is between 10 and 30 keV. In some embodiments, the total implanted dose is between $5\times10^{12}$ cm$^{-2}$ and $1.5\times10^{14}$ cm$^{-2}$.

FIGS. 16A-16C illustrate an example of a semiconductor device 1600 as modified by block 1440 of method 1400 shown in FIG. 14. FIG. 16B illustrates a cross-sectional view through a first line A-A' of the semiconductor device 1600 shown in FIG. 16A. FIG. 16C illustrates a cross-sectional view through a second line B-B' of the semiconductor device 1600 shown in FIG. 16A.

As shown in FIGS. 16A-16C, a second ion implantation 1652 is performed into the second masking layer 1550 over the active device region 820 and the second masking layer 1550 and the exposed surfaces of the field region 836. An example of such an implant is discussed above with respect to FIG. 4. As shown in FIGS. 16A and 16B, the implant species is chosen such that the implant neutralizes the conductivity of a layer 1654 at a top portion of the coupling paths 1026. The layer 1654 may be thin in comparison to the depth of the junctions 1024. This results in the formation of buried coupling paths 1626 beneath the layer 1654. Further, the implant is introduced into the surface layer of the field region 836 between the guard rings 1022 (i.e., above the junctions 1024).

The implant energy may be chosen so that the implanted ions do not fully neutralize the full depth of the coupling paths 1026. Accordingly, a portion of the coupling paths 1026 remains as the buried coupling paths 1626 after the second implant. Further, the ion beam may be directed at the surface at one or more angles by successive implant steps within the second implantation 1652.

In some embodiments, the surface layer in the coupling region is a p-GaN layer with a doping concentration between $5\times10^{18}$ cm$^{-3}$ and $3\times10^{19}$ cm$^{-3}$. In some embodiments, the implanted species is one or more of nitrogen, oxygen, helium, argon or silicon. In some embodiments, the thickness of the layer 1654 produced by the second implantation 1652 is between 500 nm and 2000 nm. In some embodiments, the second implantation 1652 is performed with multiple ion doses at different energies.

The total implant dose is chosen to neutralize the conductivity of the surface layer. For example, for a p-GaN surface layer with a doping concentration of $2\times10^{19}$ cm$^{-3}$, a total implant dose between $5\times10^{13}$ cm$^{-2}$ and $5\times10^{14}$ cm$^{-2}$ at one or more energies between 15 keV and 30 keV may be used for nitrogen implantation.

Figures 17A, 17B, 17C:
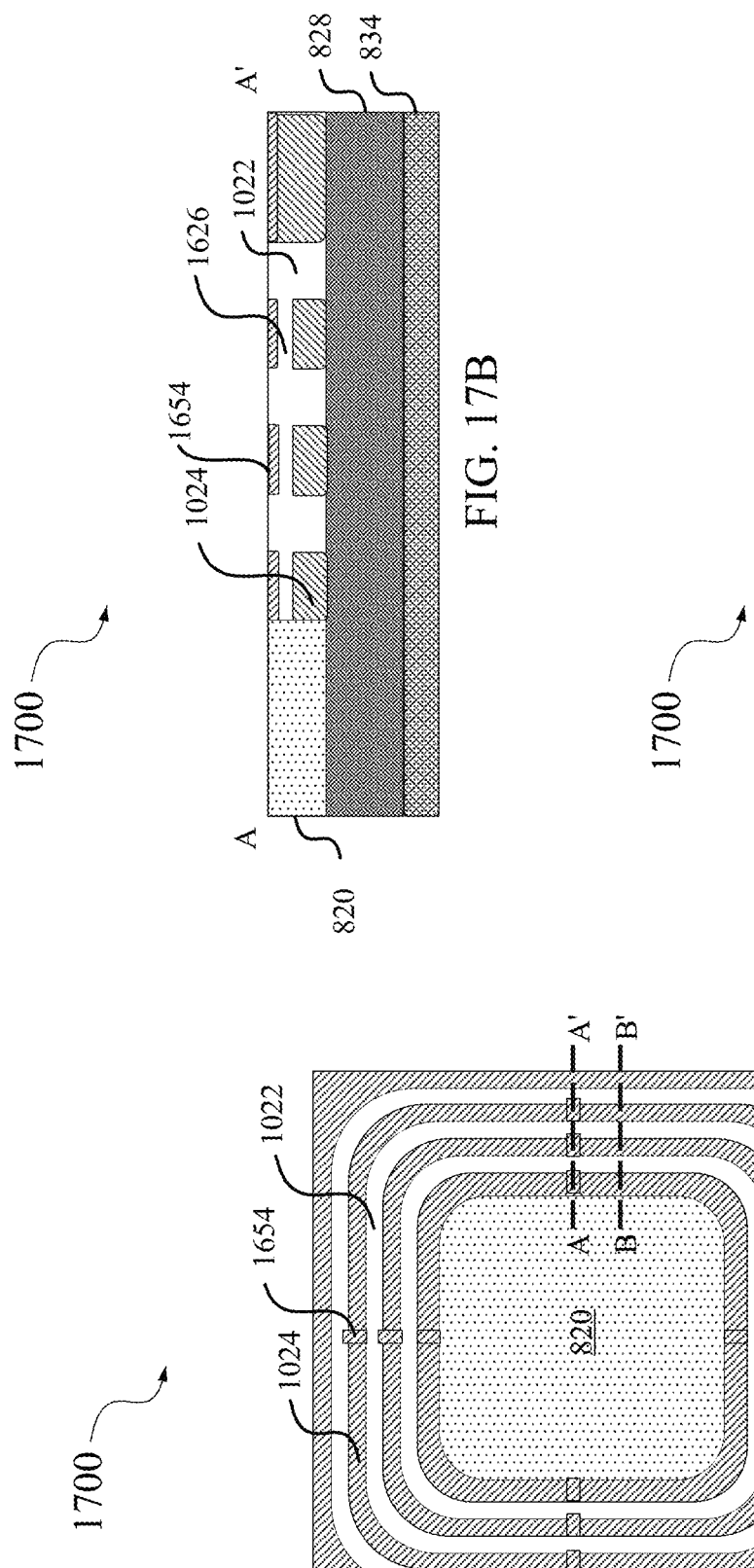
FIGS. 17A-17C illustrate another example of a semiconductor device as modified by another block of the method shown in FIG. 14.

Returning to FIG. 14, method 1400 further includes removing the second masking layer at block 1445. FIGS. 17A-17C illustrate an example of a semiconductor device 1700 as modified by block 1445 of method 1400 shown in FIG. 14. FIG. 17B illustrates a cross-sectional view through a first line A-A' of the semiconductor device 1700 shown in FIG. 17A. FIG. 17C illustrates a cross-sectional view through a second line B-B' of the semiconductor device 1700 shown in FIG. 17A.

As shown in FIG. 17B, the buried coupling paths 1626 exist in the remaining surface layer that had first been covered by the masking strip of the first masking layer 938 during the first implantation 1042 between the annular conductive surface layer regions, and subsequently exposed during the second implantation 1652. Further, the guard rings 1022 are separated by low-conductivity regions including the junctions 1024 and the layer 1654.

Returning to FIG. 14, method 1400 further includes forming contact electrodes on the active devices at block 1450. These contact electrodes are appropriate to the active device; for example, FET active devices would include source and gate contacts. In some embodiments, one of the contact electrodes is applied to the surface of each guard ring to provide a low-resistance metal on top of and in contact with the guard ring to "strap" the guard ring with a low resistance conducting path.

Figure 18B:
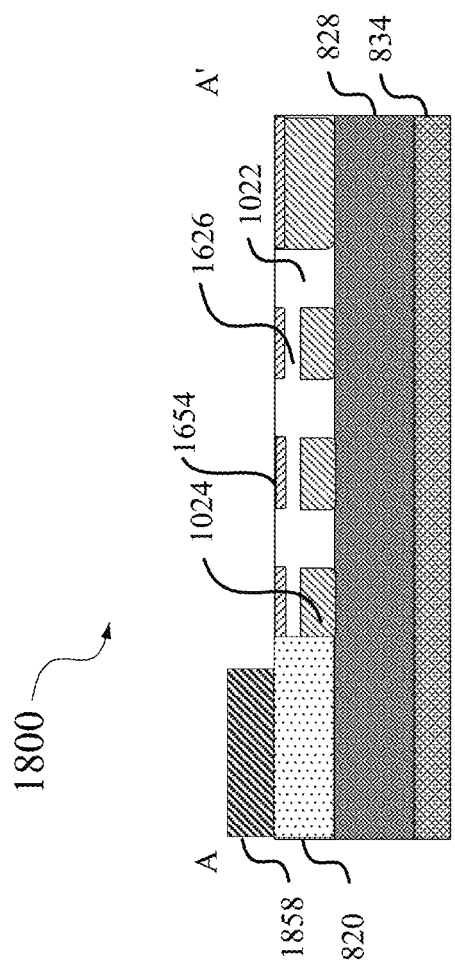
FIGS. 18A-18C illustrate another example of a semiconductor device as modified by another block of the method shown in FIG. 14.
Figure 18C:
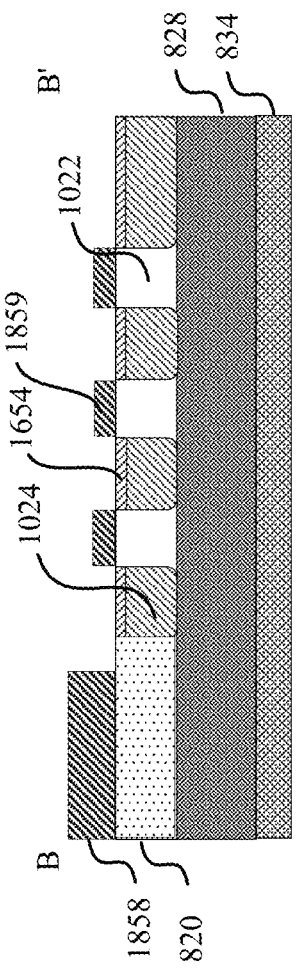
Figure 18A:
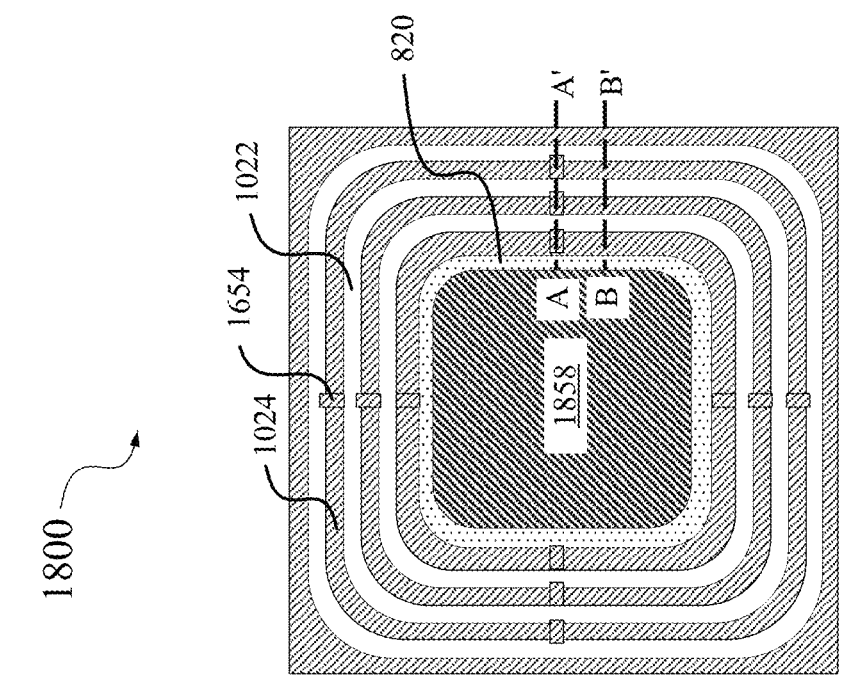

FIGS. 18A-18C illustrate an example of a semiconductor device 1800 as modified by block 1450 of method 1400 shown in FIG. 14. FIG. 18B illustrates a cross-sectional view through a first line A-A' of the semiconductor device 1800 shown in FIG. 18A. FIG. 18C illustrates a cross-sectional view through a second line B-B' of the semiconductor device 1800 shown in FIG. 18A.

As shown in FIGS. 18A-18C, contact electrodes 1858 are formed on the active device region 820. Contact electrodes are not formed on the coupling regions. In some embodiments, the guard rings 1022 do not have contact electrodes. In some embodiments, contact electrodes are formed over one or more of the guard rings 1022. Thus, some embodiments include forming contact electrodes in the form of a plurality of metal regions 1859 that are arranged on a top surface of the guard rings formed from the semiconductor material adjacent the plurality of concentric annular openings during fabrication.

In some embodiments, the contact electrodes 1858 include n-type contact electrodes and p-type contact electrodes. In some embodiments, the contact electrodes 1858 include p-type contact electrodes. In some embodiments, the contact electrodes 1858 include p-type contact electrodes and Schottky contact electrodes. In some embodiments, the n-type contact electrodes include one or more of Ti, TiN, Al, or Mo. In some embodiments, the p-type contact electrodes include one or more of Au, Ni, Pt, or Pd.

Returning to FIG. 14, method 1400 further includes forming a metal layer coupled to the opposite surface of the III-nitride wafer at block 1455. This metal layer forms one of the electrodes of the active device; for example, for FET active devices, this metal layer would form the drain contact.

FIGS. 19A-19C illustrate an example of a semiconductor device 1900 as modified by block 1455 of method 1400 shown in FIG. 14. FIG. 19B illustrates a cross-sectional view through a first line A-A' of the semiconductor device 1900 shown in FIG. 19A. FIG. 19C illustrates a cross-sectional view through a second line B-B' of the semiconductor device 1900 shown in FIG. 19A.

As shown in FIGS. 19A-19C, a metal electrode 1948 is formed on the opposite face of the substrate 834 to the active device region 820. In some embodiments, the substrate 834 is n-GaN and the opposite face is the nitrogen face. In some embodiments, the metal electrode 1948 includes one or more of Cr, Pt, Pd, Al, Ti, TiN, Ni, V or Ag.

Figure 20:
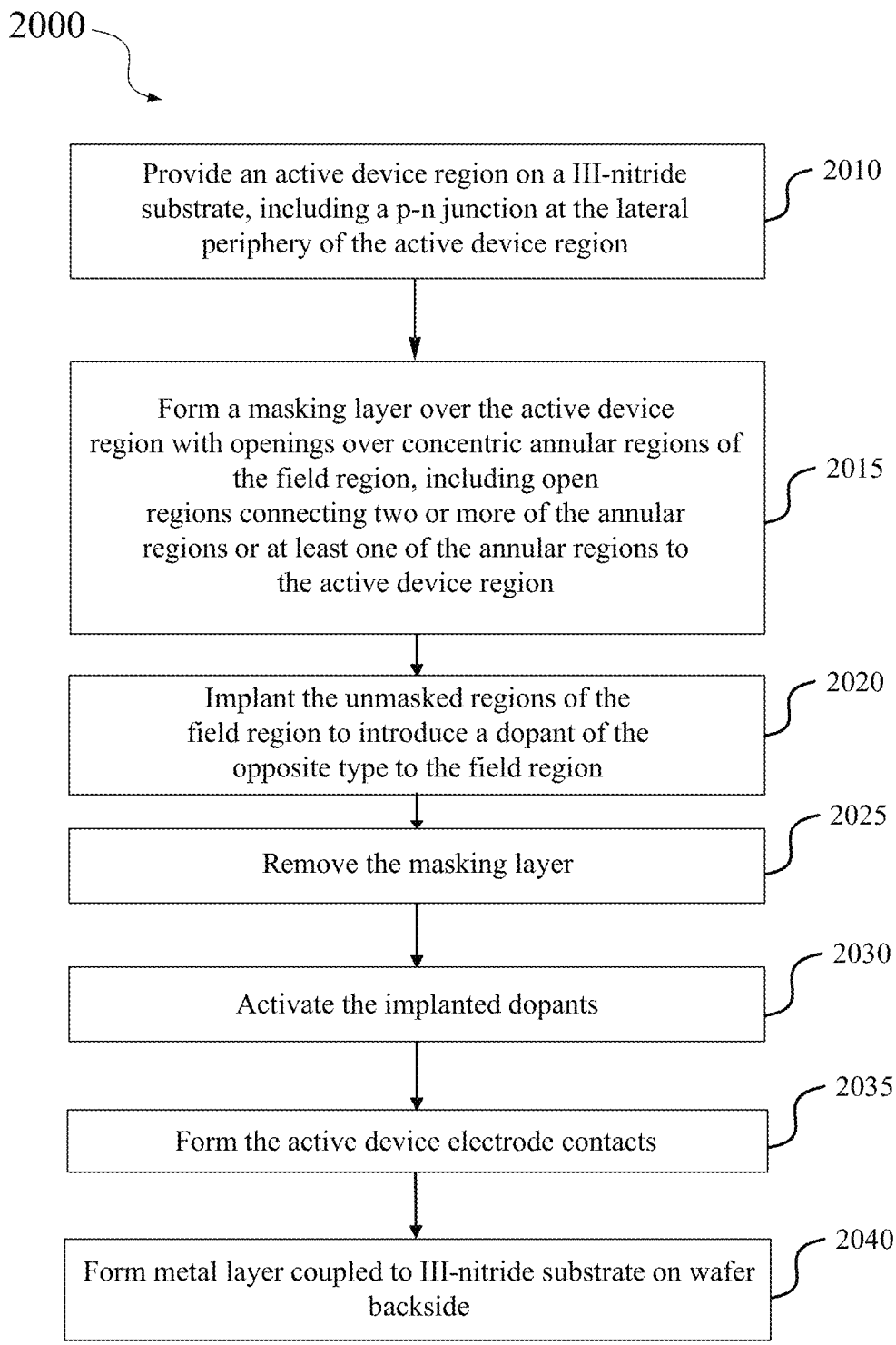
FIG. 20 is a simplified flowchart illustrating another method of manufacturing a semiconductor device according to some embodiments of the present invention.

FIG. 20 illustrates another method 2000 of manufacturing a semiconductor device according to some embodiments of the present invention. Referring to FIG. 20, an active device region is provided on a III-nitride substrate, including a p-n junction at the lateral periphery of the active device region, at block 2010. In some embodiments, the active device region includes a vertical JFET. In some embodiments, the active device region includes a vertical MOSFET. In some embodiments, the active device region includes one of a p-n junction diode, Schottky diode, or MPS diode. In some embodiments, the active device region includes combinations of FET's and diodes. In some embodiments, the p-n junction is formed by a surface p-GaN layer and a buried n-GaN drift region. In some embodiments, the final active region p-n junction is produced concurrently with block 2015 discussed below.

Figure 21B:
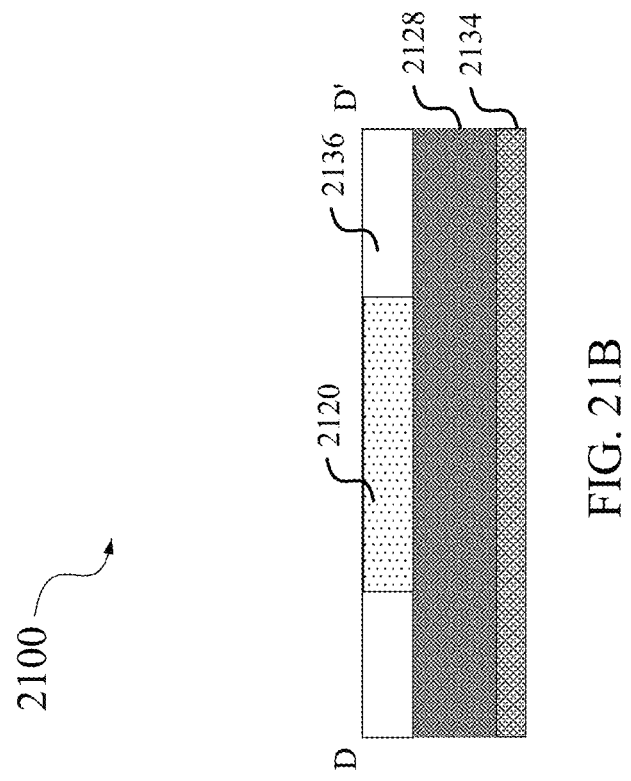
FIGS. 21A and 21B illustrate an example of a semiconductor device as provided by a block of the method shown in FIG. 20.
Figure 21A:
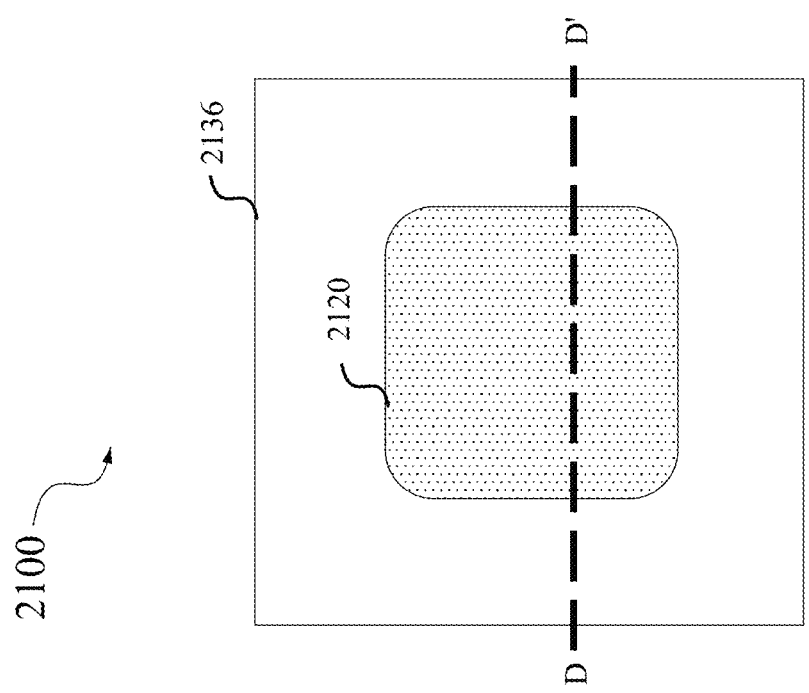

FIGS. 21A and 21B illustrate an example of a semiconductor device 2100 as provided by block 2010 of method 2000 shown in FIG. 20. FIG. 21A illustrates a plan view of the semiconductor device 2100, and FIG. 21B illustrates a cross-sectional view through a line D-D' of the semiconductor device 2100 shown in FIG. 21A. As shown in FIGS. 21A and 21B, the semiconductor device 2100 includes an active device region 2120 that is surrounded by a field region 2136. The field region 2136 does not include a surface layer having the same doping type as the periphery of the active device region 2120. The semiconductor device 2100 also includes a drift region 2128 that is formed on a substrate 2134.

In some embodiments, the active device region 2120 and the field region 2136 may be fabricated on the drift region 2128, which may be a first III-nitride epitaxial layer. The drift region 2128 may be formed on the substrate 2134, which may be a III-nitride substrate. In some embodiments, the III-nitride substrate is an n-GaN substrate. In some embodiments, the III-nitride substrate has a resistivity of less than 0.020 ohm-cm or less than 0.014 ohm-cm. In some embodiments, the first III-nitride epitaxial layer is an n-GaN layer with a net doping concentration between $5\times10^{15}$ cm$^{-3}$ and $5\times10^{16}$ cm$^{-3}$, and a thickness between 3 μm and 12 μm.

In some embodiments, the surface layer in the active device region 2120 is a regrown p-GaN layer with a doping concentration of $5\times10^{18}$ cm$^{-3}$ to $3\times10^{19}$ cm$^{-3}$, and a thickness between 0.5 μm and 1.0 μm. In some embodiments, field region 2136 is a second III-nitride epitaxial layer. In some embodiments, field region 2136 is an n-GaN layer with a net doping concentration of $5\times10^{15}$ cm$^{-3}$ to $5\times10^{16}$ cm$^{-3}$.

In some embodiments, the active device region 2120 includes one or more vertical JFETs. In some embodiments, the active device region 2120 includes one or more vertical MOSFETs. In some embodiments, the active device region 2120 includes one or more Schottky diodes. In some embodiments, the active device region 2120 includes one or more p-n junction diodes. In some embodiments, the active device region 2120 includes more than one of the above devices.

Returning to FIG. 20, method 2000 also includes forming a masking layer over the active device region with openings over concentric annular regions of the field region at block 2015. The masking layer also includes regions connecting two or more of the annular regions or at least one of the annular regions to the active device region. In some embodiments, the masking layer also has openings over the active device region, for example to expose the gate regions of a vertical JFET.

Figure 22B:
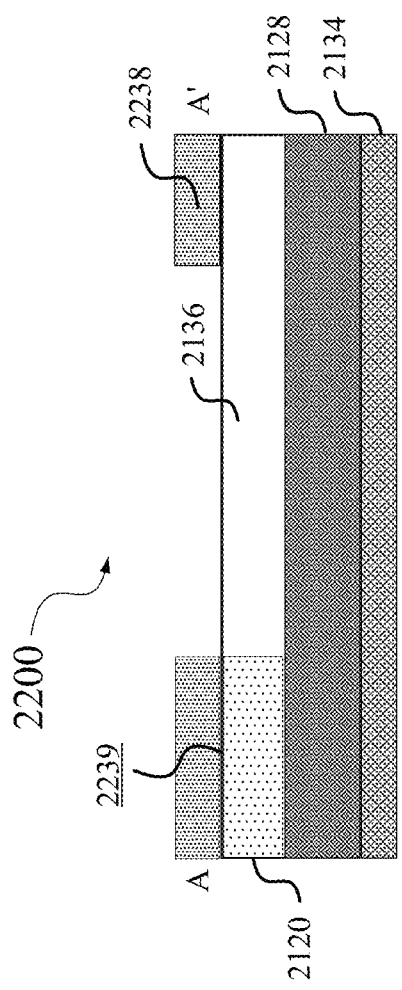
FIGS. 22A-22C illustrate an example of a semiconductor device as modified by another block of the method shown in FIG. 20.
Figure 22C:
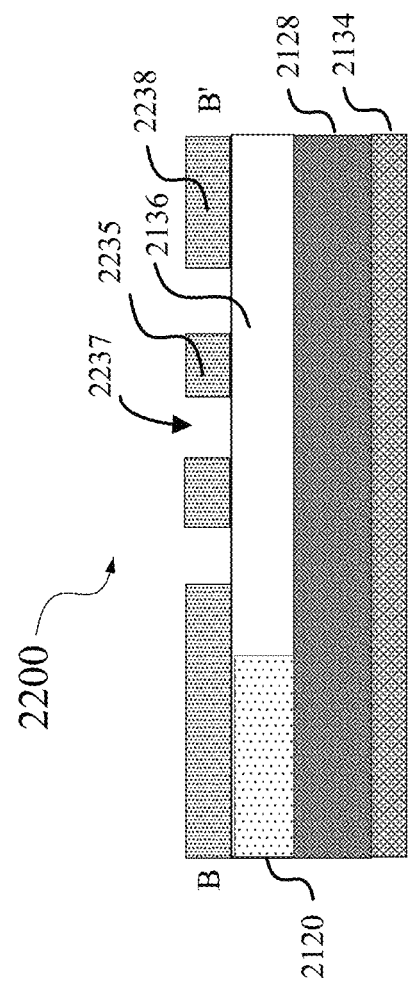
Figure 22A:
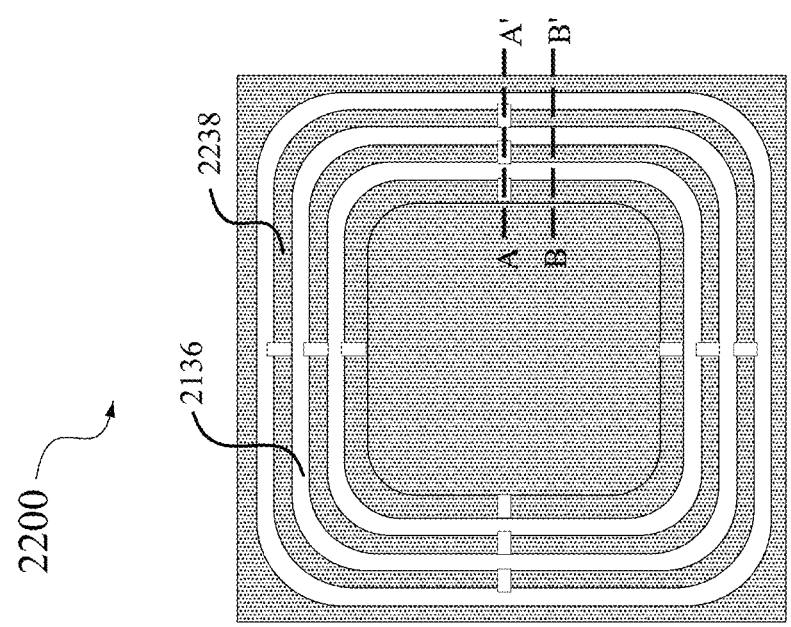

FIGS. 22A-22C illustrate an example of a semiconductor device 2200 as modified by block 2015 of method 2000 shown in FIG. 20. FIG. 22B illustrates a cross-sectional view through a first line A-A' of the semiconductor device 2200 shown in FIG. 22A. FIG. 22C illustrates a cross-sectional view through a second line B-B' of the semiconductor device 2200 shown in FIG. 22A.

As shown in FIGS. 22A-22C, a masking layer 2238 is formed on the top surface 2239 of the active device region 2120 and over portions of the field region 2136. The pattern of the masking layer 2238 on the field region 2136 includes concentric annular masking layer regions 2235 with openings 2237 in the masking layer 2238 crossing between one or more of the annular masking layer regions 2235. The masking layer opening crosses the field region 2136 to the inner edge of the last annular open region. Further, the annular masking layer regions 2235 are present between the annular openings 2237.

In some embodiments, the masking layer 2238 is a photoresist having a thickness between 1.5 µm and 3 µm. In some embodiments, the minimum width of the annular masking layer region of the masking layer 2238 is between 0.6 µm and 1.0 µm. In some embodiments, the widths of the annular masking layer regions of the masking layer 2238 are all the same. In some embodiments, the widths of the annular masking layer regions of the masking layer 2238 increase for annular photoresist regions further from the active device region. In some embodiments, the widths of the annular openings of the masking layer 2238 are between 1 and 5 mm. In some embodiments, the width of the outermost annular opening of the masking layer 2238 is larger than the width of the innermost annular opening. In some embodiments, the openings between the annular openings of the masking layer 2238 are between 0.6 µm and 1.0 µm wide.

Returning to FIG. 20, method 2000 also includes using ion implantation to implant the unmasked regions of the field region to introduce a dopant of the opposite type to the field region at block 2020. For example, if the field region is n-type, a p-type dopant is implanted into the field region. In some embodiments, the field is n-GaN and the p-type dopant is one of Zn, Be, Mg or Ca. The masking layer selectively blocks the ion-implantation of the dopant ions. In some embodiments, the p-GaN region thickness is between 0.1 µm and 0.5 µm. In some embodiments, the implanted species is implanted at multiple energies between 15 keV and 250 keV. In some embodiments, the total implanted dose is between $5 \times 10^{13}$ cm$^{-2}$ and $5 \times 10^{14}$ cm$^{-2}$.

The widths of the coupling regions are chosen to provide a high-sheet-resistance path between adjacent annular regions, or between one or more of the annular regions and the active device region. For example, for a p-GaN region, the target sheet resistance is between 105 ohms/square and 107 ohms/square. The resulting resistive connection formed in the coupling region is a shallow region connecting adjacent guard rings. In some embodiments, the coupling region and the guard rings are made of p-GaN.

In some embodiments, multiple coupling regions between adjacent guard rings may be formed in the masking layer. These multiple coupling regions may be arranged symmetrically or asymmetrically about the active device region, and may include the same or different numbers of coupling regions per side of the active device region or between adjacent guard rings.

Figure 23B:
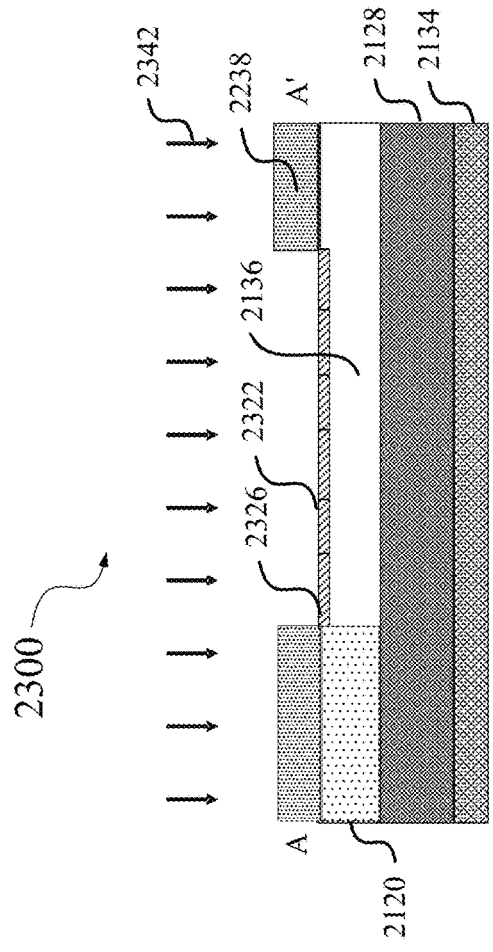
FIGS. 23A-23C illustrate another example of a semiconductor device as modified by another block of the method shown in FIG. 20.
Figure 23C:
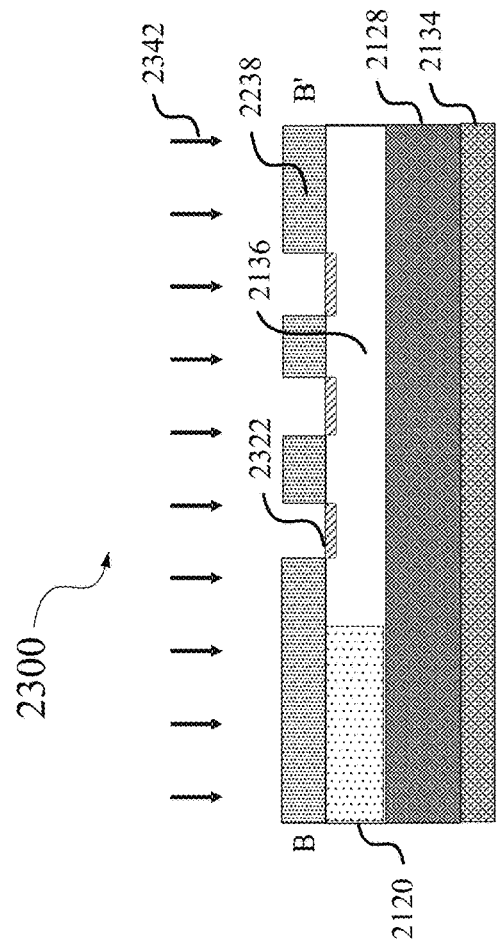
Figure 23A:
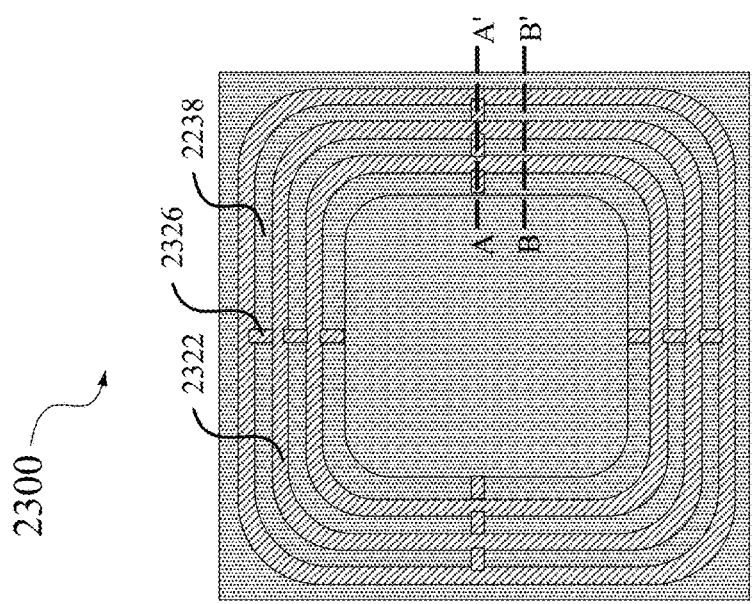

FIGS. 23A-23C illustrate an example of a semiconductor device 2300 as modified by block 2020 of method 2000 shown in FIG. 20. FIG. 23B illustrates a cross-sectional view through a first line A-A' of the semiconductor device 2300 shown in FIG. 23A. FIG. 23C illustrates a cross-sectional view through a second line B-B' of the semiconductor device 2300 shown in FIG. 23A.

As shown in FIGS. 23A-23C, an ion implantation 2342 is performed into the masking layer 2238 over the active device region 2120, and into the masking layer 2238 and the exposed surfaces of the field region 2136. The implant species is chosen such that the implanted species has the opposite conductivity type as the field region 2136. The implant is allowed in the region that becomes the coupling path 2326. Further, the implant is introduced into the surface of the field region 2136 between the concentric annular masking layer regions that becomes the guard rings 2322. The implant dose(s) and energy(ies) are chosen so that the implanted regions achieve a desired depth and sheet resistance in the field region 2136. The ion beam may be directed at the surface at multiple angles by successive implant steps within the implantation procedure.

In some embodiments, the field region 2136 is an n-GaN layer with a net doping concentration of $5 \times 10^{15}$ cm$^{-3}$ to $5 \times 10^{16}$ cm$^{-3}$. In some embodiments, the implanted region is p-GaN. In some embodiments, the implanted species is one or more of beryllium, magnesium, or calcium. In some embodiments, the thickness of the implanted region is between 0.1 µm and 0.5 µm. In some embodiments, the implantation process is performed with multiple doses at different energies. In some embodiments, the maximum energy of the implant is between 100 keV and 200 keV. In some embodiments, the total implanted dose is between $1 \times 10^{14}$ cm$^{-2}$ and $2 \times 10^{15}$ cm$^{-2}$.

Returning to FIG. 20, method 2000 also includes removing the masking layer at block 2025. In addition, method 2000 includes activating the implanted dopants at block 2030. This activation may include deposition of a protective layer on the top surface of the III-nitride material, followed by a rapid thermal annealing process at temperatures up to 1500° C. In some embodiments, the protective layer includes one of silicon nitride, aluminum nitride, or aluminum-silicon nitride, with a thickness between 500 nm and 2000 nm. In some embodiments, the rapid thermal annealing process is performed at a temperature between 1200° C. and 1500° C. and a time between 30 seconds and 300 seconds. In some embodiments the annealing process may be performed at a high ambient pressure (e.g., at 1 GPa in a $N_2$ ambient), with or without the protective layer. In some embodiments the heating may be a result of a series of rapid pulses (e.g. microwave). In some embodiments, the protective layer is removed after the thermal annealing process.

Figure 24B:
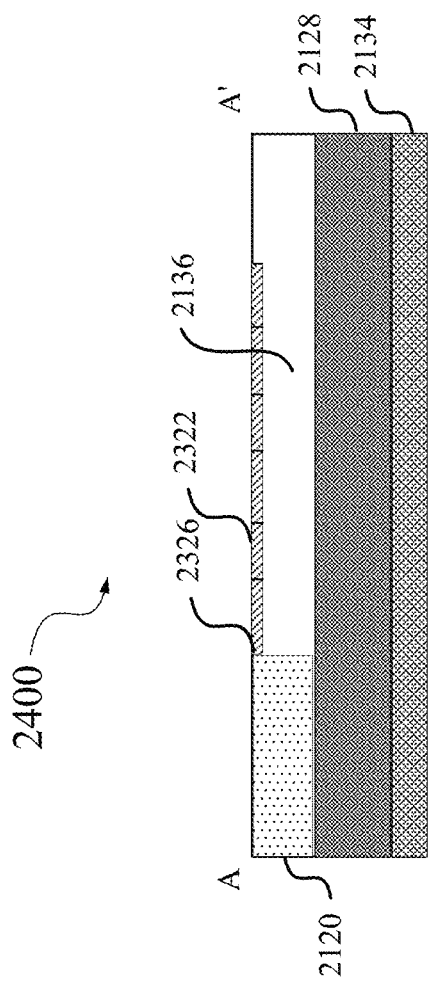
FIGS. 24A-24C illustrate another example of a semiconductor device as modified by another block of the method shown in FIG. 20.
Figure 24C:
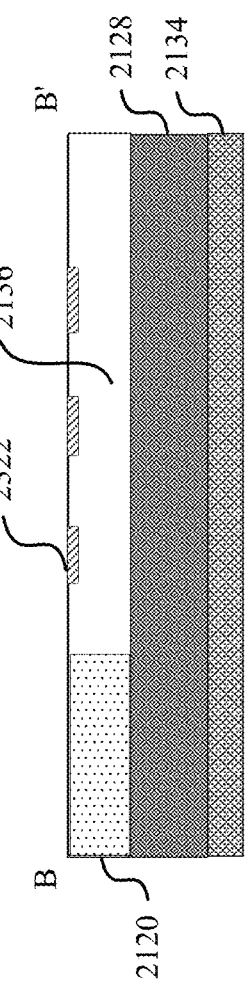
Figure 24A:
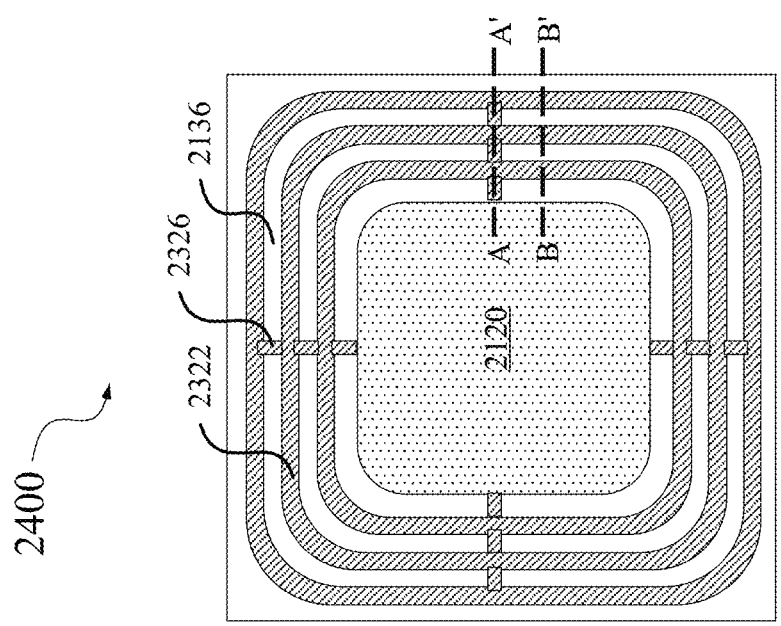

FIGS. 24A-24C illustrate an example of a semiconductor device 2400 as modified by blocks 2025 and 2030 of method 2000 shown in FIG. 20. FIG. 24B illustrates a cross-sectional view through a first line A-A' of the semiconductor device 2400 shown in FIG. 24A. FIG. 24C illustrates a cross-sectional view through a second line B-B' of the semiconductor device 2400 shown in FIG. 24A.

As shown in FIG. 24B, a conductive coupling region exists in the region that had been exposed between the annular conductive regions. This conductive coupling region includes the coupling paths 2326 and the guard rings 2322. As shown in FIG. 24C, the guard rings 2322 are separated by unimplanted field regions 2136 outside of the regions that were covered by the masking layer 2238.

Returning to FIG. 20, method 2000 also includes forming the contact electrodes on the active devices at block 2035. These contact electrodes are appropriate to the active device; for example, FET active devices would include source and gate contacts. In some embodiments, one of the contact electrodes is applied to the surface of each guard ring to provide a low-resistance metal on top of and in contact with the guard ring to "strap" the guard ring with a low resistance conducting path.

Figures 25A, 25B, 25C:
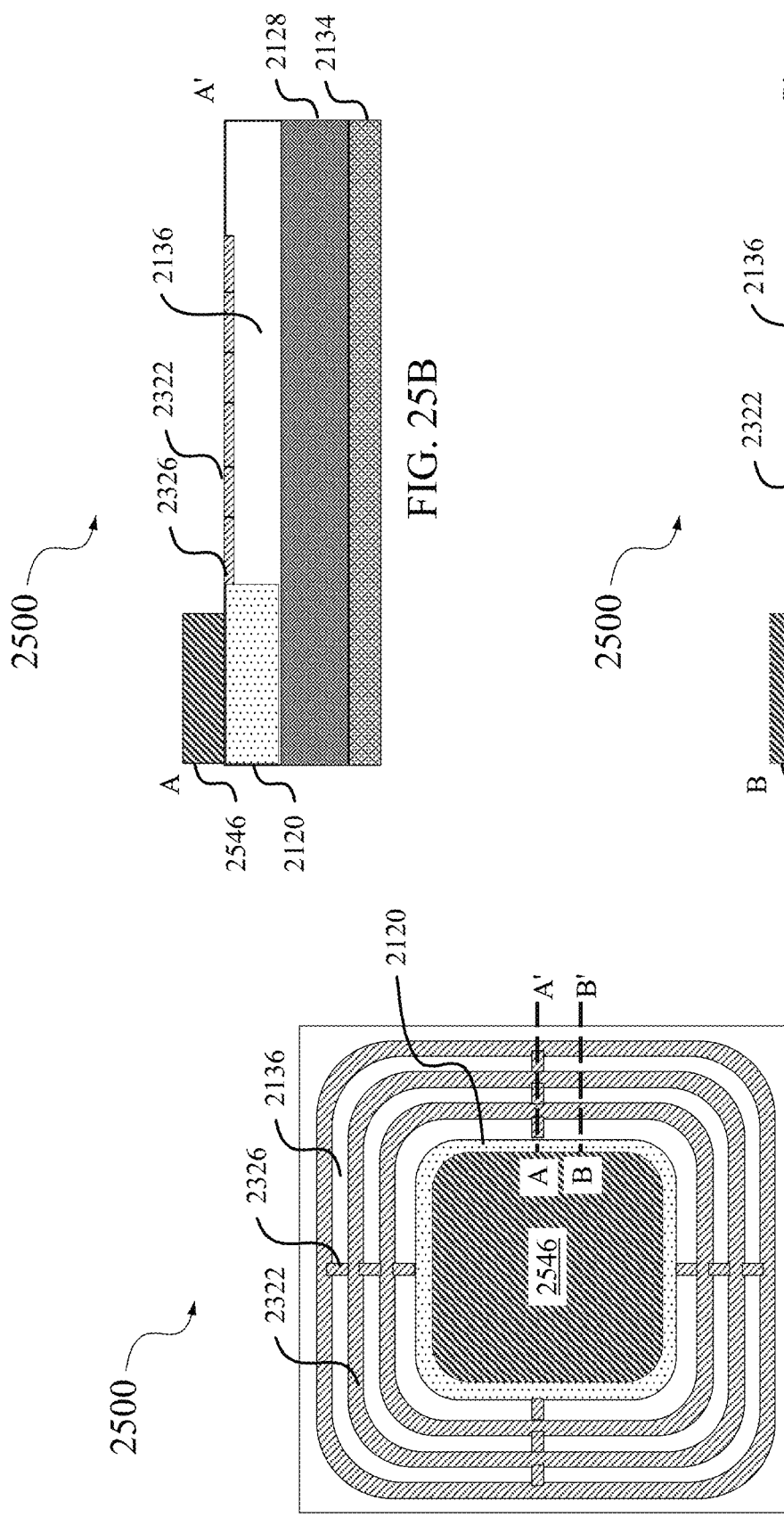
FIGS. 25A-25C illustrate another example of a semiconductor device as modified by another block of the method shown in FIG. 20.

FIGS. 25A-25C illustrate an example of a semiconductor device 2500 as modified by block 2035 of method 2000 shown in FIG. 20. FIG. 25B illustrates a cross-sectional view through a first line A-A' of the semiconductor device 2500 shown in FIG. 25A. FIG. 25C illustrates a cross-sectional view through a second line B-B' of the semiconductor device 2500 shown in FIG. 25A.

As shown in FIGS. 25A-25C, contact electrodes 2546 are formed on the active device region 2120. However, contact electrodes are not formed on the coupling paths 2326. In some embodiments, the guard rings 2322 do not have contact electrodes. In other embodiments, contact electrodes (not shown) are formed over one or more of the guard rings 2322.

In some embodiments, the contact electrodes 2546 include n-type contact electrodes and p-type contact electrodes. In some embodiments, the contact electrodes 2546 include p-type contact electrodes. In some embodiments, the contact electrodes 2546 include p-type contact electrodes and Schottky contact electrodes. In some embodiments, the n-type contact electrodes include one or more of Ti, TiN, Al, or Mo. In some embodiments, the p-type contact electrodes include one or more of Au, Ni, Pt, or Pd.

Returning to FIG. 20, method 2000 also includes forming a metal layer coupled to the opposite surface of the III-nitride wafer at block 2040. This metal layer forms one of the electrodes of the active device; for example, for FET active devices, this metal layer would form the drain contact.

FIGS. 26A-26C illustrate an example of a semiconductor device 2600 as modified by block 2040 of method 2000 shown in FIG. 20. FIG. 26B illustrates a cross-sectional view through a first line A-A' of the semiconductor device 2600 shown in FIG. 26A. FIG. 26C illustrates a cross-sectional view through a second line B-B' of the semiconductor device 2600 shown in FIG. 26A.

As shown in FIGS. 26A-26C, a metal electrode 2648 is formed on the opposite face of the substrate 2134 to the active device region 2120. In some embodiments, the substrate 2134 is n-GaN and the opposite face is the nitrogen face. In some embodiments, the metal electrode 2648 includes one or more of Cr, Pt, Pd, Al, Ti, TiN, Ni, V, or Ag.

Figure 27:
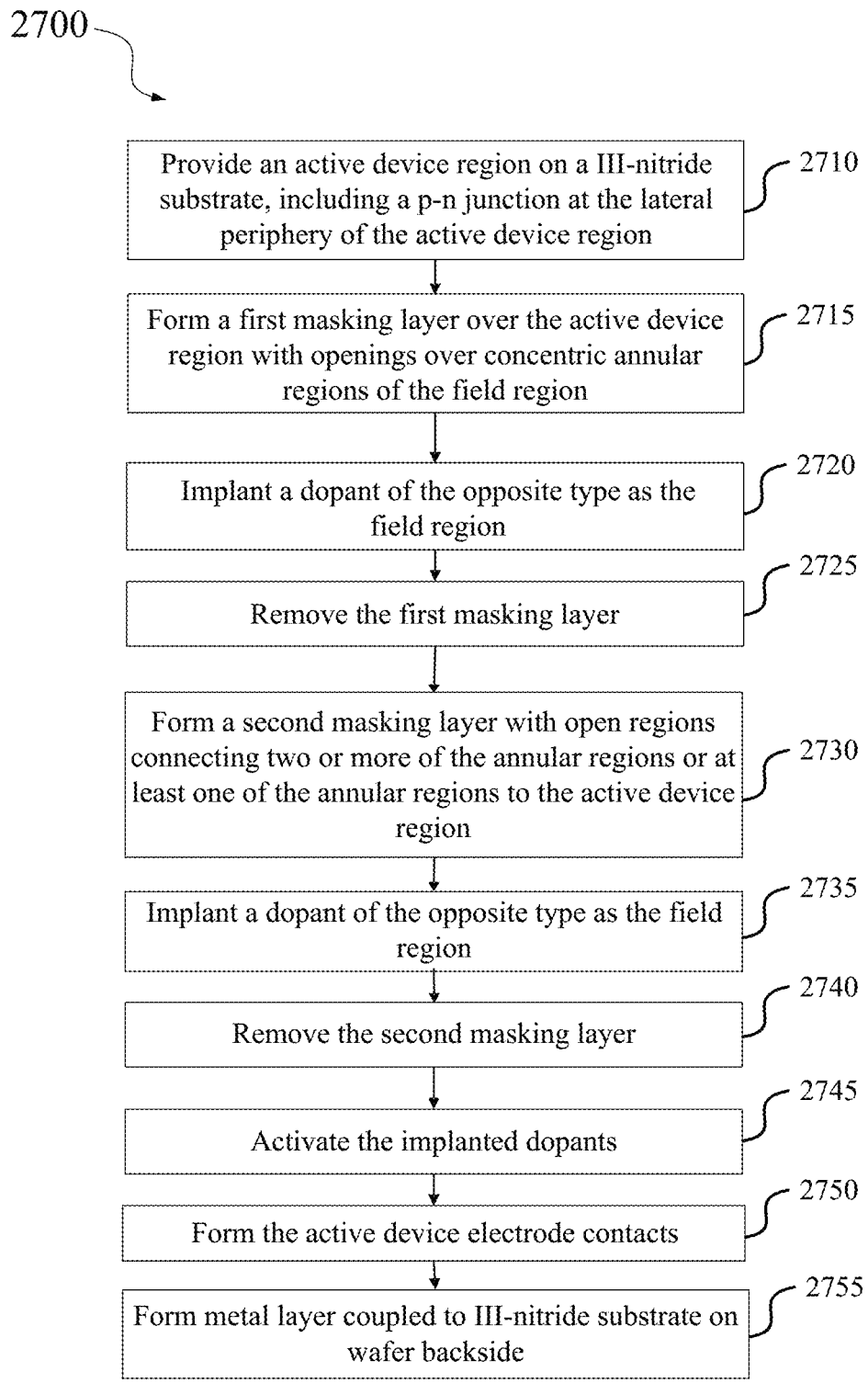
FIG. 27 is a simplified flowchart illustrating another method of manufacturing a semiconductor device according to some embodiments of the present invention.

FIG. 27 illustrates another method 2700 of manufacturing a semiconductor device according to some embodiments of the present invention. Referring to FIG. 27, an active device region is provided on a III-nitride substrate, including a p-n junction at the lateral periphery of the active device region, at block 2710. In some embodiments, the active device region includes a vertical JFET. In some embodiments, the active device region includes a vertical MOSFET. In some embodiments, the active device region includes one of a p-n junction diode, Schottky diode, or MPS diode. In some embodiments, the active device region contains combinations of FET's and diodes. In some embodiments, the p-n junction is formed by a surface p-GaN layer and a buried n-GaN drift region. In some embodiments the final active region p-n junction is produced concurrently with the following steps in method 2700.

FIGS. 21A and 21B illustrate an example of a semiconductor device 2100 as provided by block 2710 of method 2700 shown in FIG. 27. The semiconductor device 2100 shown in FIGS. 21A and 21B is described above.

Returning to FIG. 27, method 2700 also includes forming a first masking layer over the active device region with openings over concentric annular regions in the field region outside of the active device region at block 2715. In some embodiments, the masking layer also has openings over the active device region, for example to expose the gate regions of a vertical JFET.

Figure 28B:
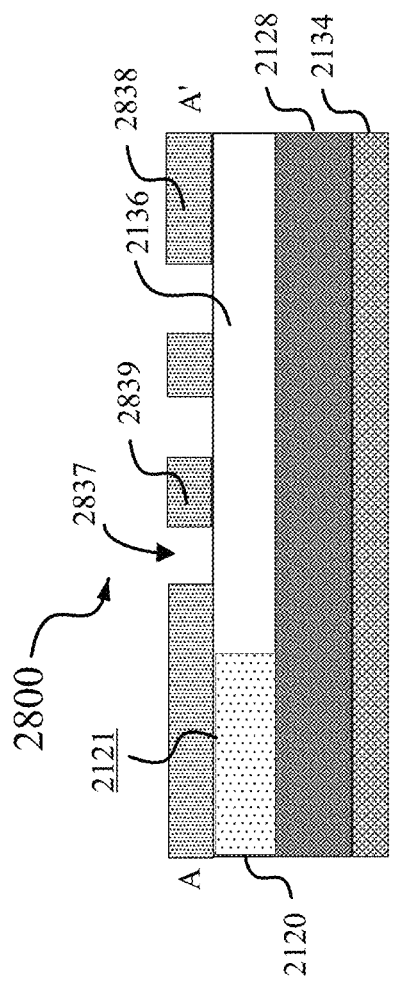
FIGS. 28A-28C illustrate an example of a semiconductor device as modified by a block of the method shown in FIG. 27.
Figure 28C:
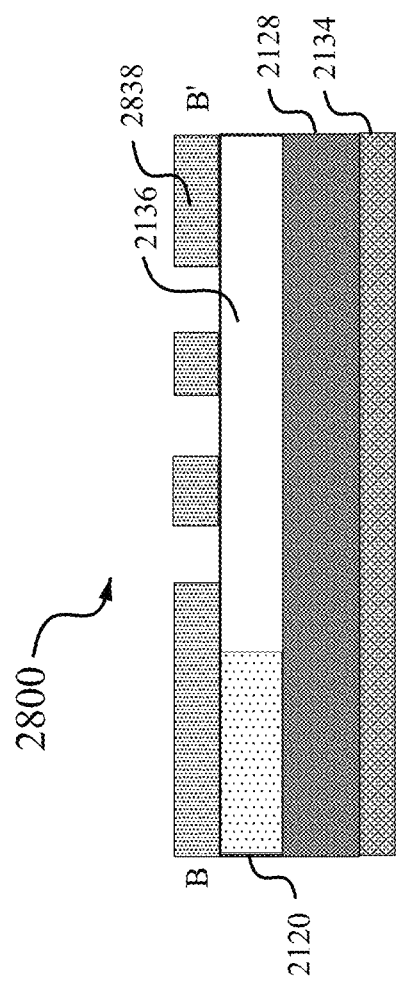
Figure 28A:
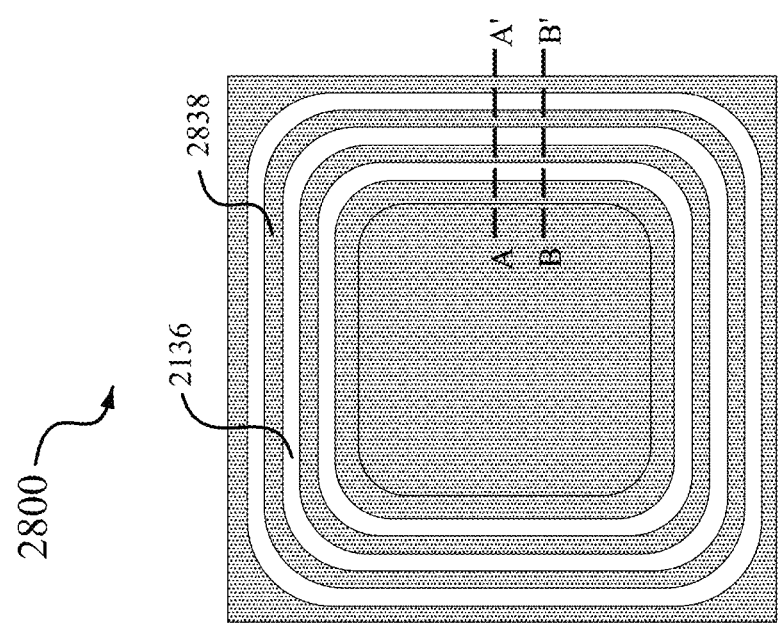

FIGS. 28A-28C illustrate an example of a semiconductor device 2800 as modified by block 2015 of method 2000 shown in FIG. 20. FIG. 28B illustrates a cross-sectional view through a first line A-A' of the semiconductor device 2800 shown in FIG. 28A. FIG. 28C illustrates a cross-sectional view through a second line B-B' of the semiconductor device 2800 shown in FIG. 28A.

As shown in FIGS. 28A-28C, a first masking layer 2838 is formed on the top surface 2121 of the active device region 2120 and over portions of the field region 2136. The pattern of the first masking layer 2838 on the field region 2136 includes concentric annular masking layer regions 2839. The annular masking layer regions are present between the annular openings 2837.

In some embodiments, the first masking layer 2838 is a photoresist having a thickness between 1.5 µm and 3 µm. In some embodiments, the minimum width of the annular masking layer region of the first masking layer 2838 is between 0.6 µm and 1.0 µm. In some embodiments, the widths of the annular masking layer regions of the first masking layer 2838 are all the same. In some embodiments, the widths of the annular masking layer regions of the first masking layer 2838 increase for annular photoresist regions farther from the active device region 2120. In some embodiments, the widths of the annular openings of the first masking layer 2838 are between 1 µm and 5 µm. In some embodiments, the width of the outermost annular opening is larger than the width of the innermost annular opening.

Returning to FIG. 27, method 2700 also includes using ion implantation to implant the unmasked regions of the field region to introduce a dopant of the opposite type to the field region at block 2720. For example, if the field region is n-type, a p-type dopant is implanted into the field region. In some embodiments, the field is n-GaN and the p-type dopant is one of Zn, Be, Mg or Ca. The masking layer selectively blocks the ion-implantation of the dopant ions. In some embodiments, the p-GaN region thickness is between 0.1 µm and 0.5 µm. In some embodiments, the implanted species is implanted at multiple energies between 15 keV and 250 keV. In some embodiments, the total implanted dose is between $5 \times 10^{13}$ cm$^{-2}$ and $5 \times 10^{14}$ cm$^{-2}$. In some embodiments, the sheet resistance (after activation) of the implanted p-GaN region is between 10,000 and 100,000 ohms/square.

FIGS. 29A-29C illustrate an example of a semiconductor device 2900 as modified by block 2720 of method 2700 shown in FIG. 27. FIG. 29B illustrates a cross-sectional view through a first line A-A' of the semiconductor device 2900 shown in FIG. 29A. FIG. 29C illustrates a cross-sectional view through a second line B-B' of the semiconductor device 2900 shown in FIG. 29A.

As shown in FIGS. 29A-29C, a first ion implantation 2942 is performed into the first masking layer 2938 over the active device region 2120, and into the first masking layer 2938 and the exposed surfaces of the field region 2136. The implant species is chosen such that the implanted species has the opposite conductivity type as the field region 2136. As shown in FIG. 29B, the implant is blocked by the first masking layer 2938 in the region that will become the coupling region. As shown in FIGS. 29B and 29C, the implant is introduced into the surface of the field region 2136 between the concentric annular first masking layer regions, thereby forming innermost guard ring 2922 and guard rings 2923.

The first implant dose(s) and energy(ies) are chosen so that the implanted regions achieve a desired depth and sheet resistance in the field region 2136. The ion beam may be directed at the surface at multiple angles by successive implant steps within the first implantation 2942.

In some embodiments, the field region 2136 is an n-GaN layer with a net doping concentration between $5 \times 10^{15}$ cm$^{-3}$ and $5 \times 10^{16}$ cm$^{-3}$. In some embodiments, the implanted region is p-GaN. In some embodiments, the implanted species is one or more of beryllium, magnesium, or calcium. In some embodiments, the thickness of the implanted region is between 0.1 μm and 0.5 μm. In some embodiments, the first implantation 2942 is performed with multiple doses at different energies. In some embodiments, the maximum energy of the implant is between 100 keV and 200 keV. In some embodiments, the total implanted dose is between $1 \times 10^{14}$ cm$^{-2}$ and $2 \times 10^{15}$ cm$^{-2}$.

Figure 30B:
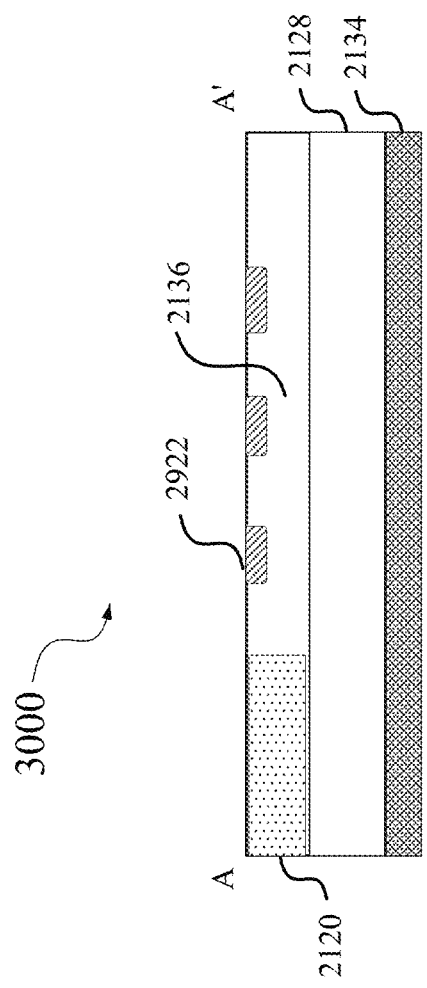
FIGS. 30A-30C illustrate an example of another semiconductor device as modified by another block of the method shown in FIG. 27.
Figure 30C:
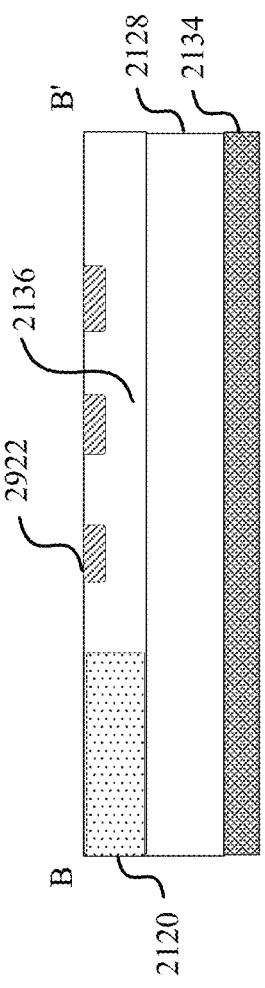
Figure 30A:
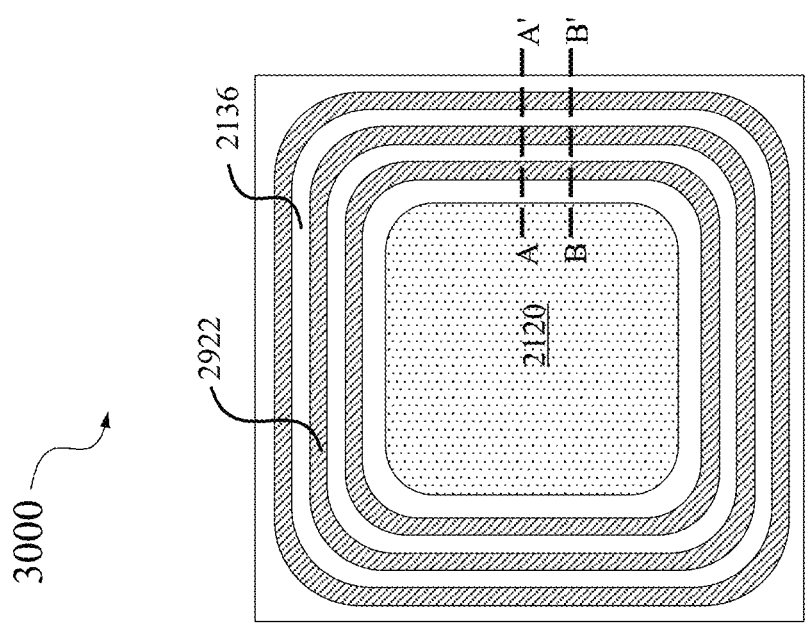

Returning to FIG. 27, method 2700 also includes removing the first masking layer at block 2725. FIGS. 30A-30C illustrate an example of a semiconductor device 3000 as modified by block 2725 of method 2700 shown in FIG. 27. FIG. 30B illustrates a cross-sectional view through a first line A-A' of the semiconductor device 3000 shown in FIG. 30A. FIG. 30C illustrates a cross-sectional view through a second line B-B' of the semiconductor device 3000 shown in FIG. 30A. As shown in FIGS. 30A-30C, the guard rings 2923 are separated by unimplanted field regions 2136 outside of the regions covered by the first masking layer 2938.

Returning to FIG. 27, method 2700 also includes forming a second masking layer over the active device region and the concentric annular regions of the field region that were exposed by the first masking layer at block 2730. This second masking layer provides openings connecting two or more of the annular regions implanted in block 2720 or at least one of the annular regions and the active device region.

Figure 31B:
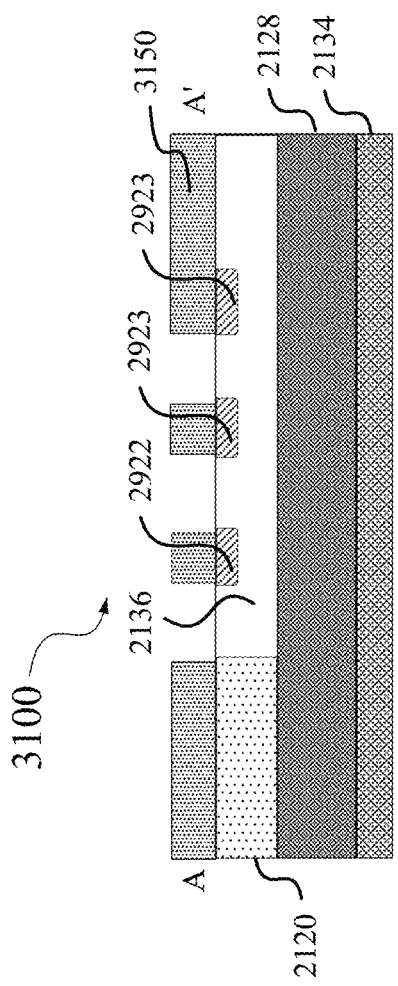
FIGS. 31A-31C illustrate an example of another semiconductor device as modified by another block of the method shown in FIG. 27.
Figure 31C:
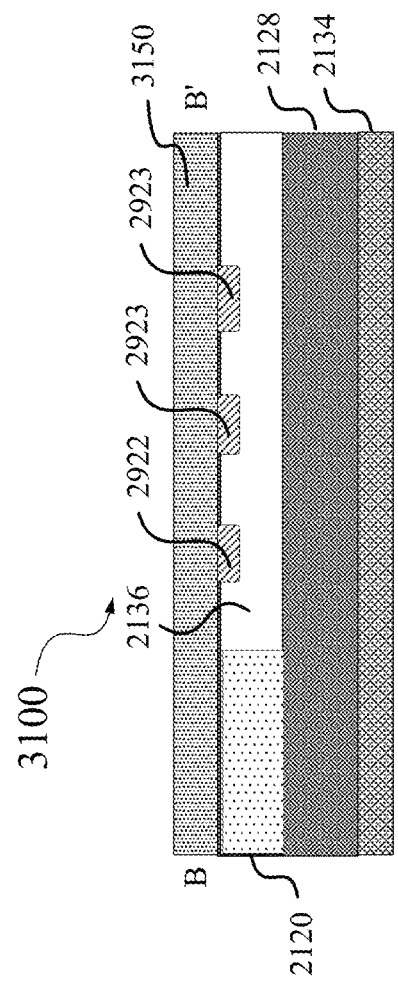
Figure 31A:
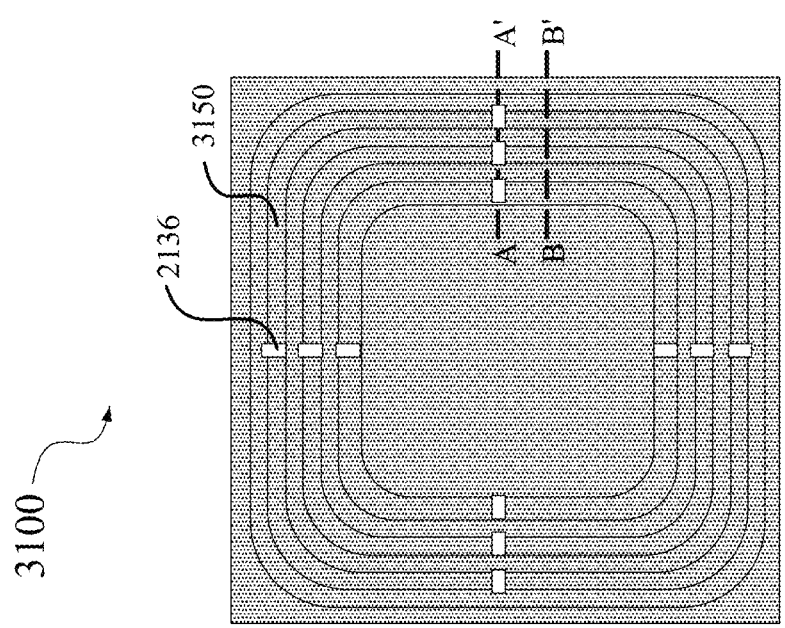

FIGS. 31A-31C illustrate an example of a semiconductor device 3100 as modified by block 2730 of method 2700 shown in FIG. 27. FIG. 31B illustrates a cross-sectional view through a first line A-A' of the semiconductor device 3100 shown in FIG. 31A. FIG. 31C illustrates a cross-sectional view through a second line B-B' of the semiconductor device 3100 shown in FIG. 31A. As shown in FIGS. 31A-31C, a second masking layer 3150 is formed over the active device region 2120 and portions of the field region 2136, leaving openings to form coupling paths between the guard rings 2923 and/or between the active device region 2120 and the innermost guard ring 2922.

Returning to FIG. 27, method 2700 also includes implanting the unmasked regions with a dopant of opposite type to the field region to provide a conduction path ("coupling region") between two or more of the annular implanted regions, and/or between one or more of the annular implanted regions and the active device region at block 2735. In some embodiments, the field region is n-GaN, and the implanted dopants are p-type. In some embodiments, the implanted species is one or more of Zn, Be, Mg or Ca. In some embodiments, the implantation energy is between 15 keV and 60 keV. In some embodiments, the total implanted dose is between $1 \times 10^{12}$ cm$^{-2}$ and $5 \times 10^{13}$ cm$^{-2}$. In some embodiments, the target sheet resistance of the coupling region (after activation) is between $10^6$ ohms/square and $10^7$ ohms/square.

FIGS. 32A-32C illustrate an example of a semiconductor device 3200 as modified by block 2735 of method 2700 shown in FIG. 27. FIG. 32B illustrates a cross-sectional view through a first line A-A' of the semiconductor device 3200 shown in FIG. 32A. FIG. 32C illustrates a cross-sectional view through a second line B-B' of the semiconductor device 3200 shown in FIG. 32A. As shown in FIGS. 32A-32C, a second ion implantation 3252 is performed into the second masking layer 3150 over the active device region 2120, along with the second masking layer 3150 and the exposed surfaces of the field region 2136. The second implantation 3252 results in the formation of coupling paths 3226 between adjacent guard rings 2923 and/or between the active device region 2120 and the innermost guard ring 2922.

Returning to FIG. 27, method 2700 also includes removing the second masking layer at block 2740. The resulting resistive connection formed in the coupling region is a shallow region connecting adjacent guard rings. In some embodiments, the coupling region and the guard rings are made of p-GaN. In some embodiments, multiple coupling regions between adjacent guard rings may be formed. These multiple coupling regions may be arranged symmetrically or asymmetrically about the active device region, and may consist of the same or different numbers of coupling regions per side of the active device region or between adjacent guard rings.

Method 2700 also includes activating the implanted dopants at block 2745. This activation may include deposition of a protective layer on the top surface of the III-nitride material, followed by a rapid thermal annealing process at temperatures up to 1500° C. In some embodiments, the protective layer includes one of silicon nitride, aluminum nitride, or aluminum-silicon nitride, with a thickness between 500 nm and 2000 nm. In some embodiments, the rapid thermal annealing process is performed at a temperature between 1200° C. and 1500° C. and for a time between 30 seconds and 300 seconds. In some embodiments, the protective layer is removed after the thermal annealing process.

FIGS. 33A-33C illustrate an example of a semiconductor device 3300 as modified by blocks 2740 and 2745 of method 2700 shown in FIG. 27. FIG. 33B illustrates a cross-sectional view through a first line A-A' of the semiconductor device 3300 shown in FIG. 33A. FIG. 33C illustrates a cross-sectional view through a second line B-B' of the semiconductor device 3300 shown in FIG. 33A. As shown in FIGS. 33A-33C, the guard rings 2923 are separated by top layers of the field region 2136, and the coupling paths 3226 connect the active device region 2120 with the guard rings 2923, including the innermost guard ring 2922.

Returning to FIG. 27, method 2700 also includes forming the contact electrodes on the active devices at block 2750. These contact electrodes are appropriate to the active device; for example, FET active devices would include source and gate contacts. In some embodiments, one of the contact electrodes is applied to the surface of each guard ring to provide a low-resistance metal on top of and in contact with the guard ring to "strap" the guard ring with a low resistance conducting path.

FIGS. 34A-34C illustrate an example of a semiconductor device 3400 as modified by block 2750 of method 2700 shown in FIG. 27. FIG. 34B illustrates a cross-sectional view through a first line A-A' of the semiconductor device 3400 shown in FIG. 34A. FIG. 34C illustrates a cross-sectional view through a second line B-B' of the semiconductor device 3400 shown in FIG. 34A. As shown in FIGS. 34A-34C, contact electrodes 3446 are formed on the active device region 2120. Contact electrodes are not formed on the coupling paths 3226. In some embodiments, the guard rings 2923 do not have contact electrodes. In some embodiments, contact electrodes (not shown) are formed over one or more of the guard rings 2923, including innermost guard ring 2922.

In some embodiments, the contact electrodes 3446 include n-type contact electrodes and p-type contact electrodes. In some embodiments, the contact electrodes 3446 include p-type contact electrodes. In some embodiments, the contact electrodes 3446 include p-type contact electrodes and Schottky contact electrodes. In some embodiments, the n-type contact electrodes include one or more of Ti, TiN, Al, or Mo. In some embodiments, the p-type contact electrodes include one or more of Au, Ni, Pt, Sc, or Pd.

Returning to FIG. 27, method 2700 also includes forming a metal layer coupled to the opposite surface of the III-nitride wafer at block 2755. This metal layer forms one of the electrodes of the active device; for example, for FET active devices this metal layer would form the drain contact.

FIGS. 35A-35C illustrate an example of a semiconductor device 3500 as modified by block 2755 of method 2700 shown in FIG. 27. FIG. 35B illustrates a cross-sectional view through a first line A-A' of the semiconductor device 3500 shown in FIG. 35A. FIG. 35C illustrates a cross-sectional view through a second line B-B' of the semiconductor device 3500 shown in FIG. 35A. As shown in FIGS. 35A-35C, a metal electrode 3548 is formed on the opposite face of the substrate 2134 to the active device region. In some embodiments, the substrate 2134 is n-GaN and the opposite face is the nitrogen face. In some embodiments, the metal electrode 3548 includes one or more of Cr, Pt, Pd, Al, Ti, TiN, Ni, V or Ag.

Figure 36A:
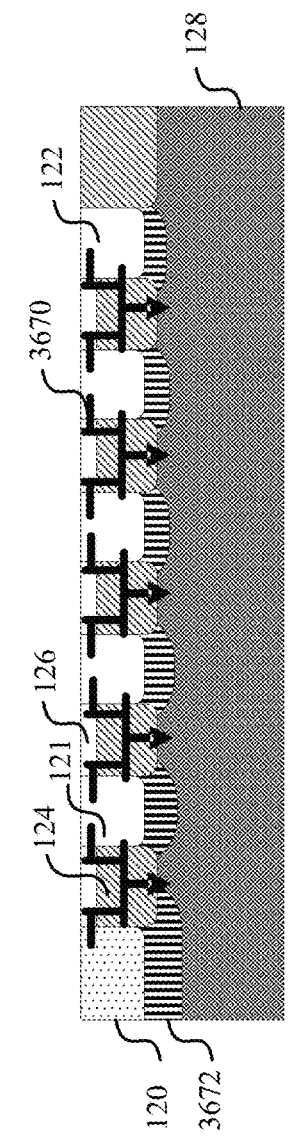
FIGS. 36A-36C illustrate the operation of a semiconductor device that begins as the semiconductor device shown in FIGS. 1A-1C.
Figure 36B:
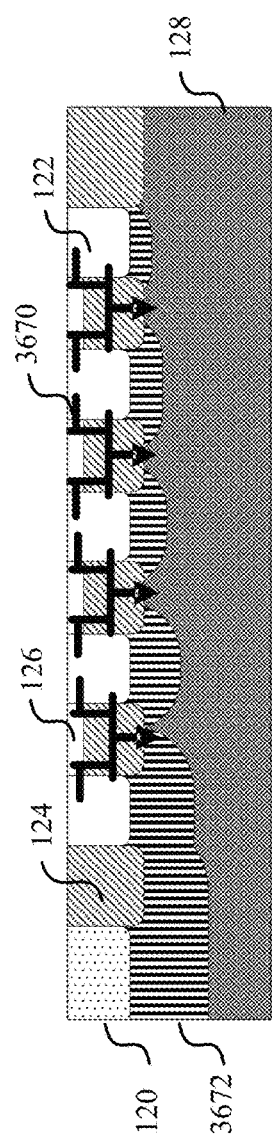
Figure 36C:
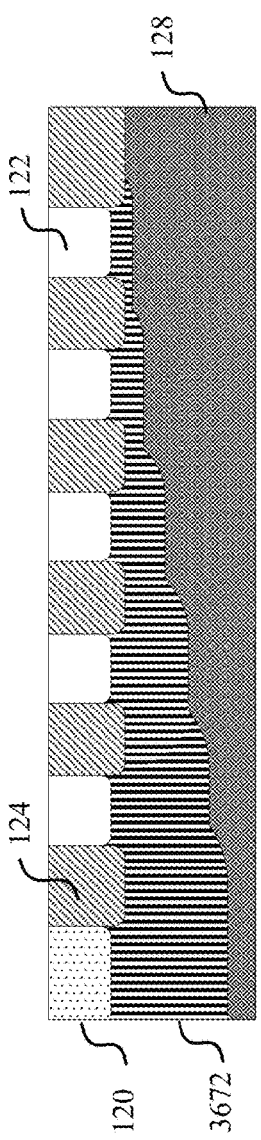

FIGS. 36A-36C illustrate the operation of a semiconductor device 3600 that begins as the semiconductor device 100 shown in FIGS. 1A-1C. More specifically, FIGS. 36A-36C show a cross-sectional view through the first line A-A' of the semiconductor device 100 shown in FIG. 1A, which corresponds to the view shown in FIG. 1B. As the reverse bias across the active device region 120 increases, the coupling paths 126 between adjacent guard rings 122 and/or between the innermost guard ring 121 and the active device region 120 deplete, at which point the potentials on the adjacent junctions 124 are floating with respect to each other. In this manner, the coupling paths 126 behave analogous to a junction FET, where adjacent pairs of guard rings 122 act as "source" and "drain", and the drift region acts as the "gate". As adjacent guard rings 122 "float", the potential on the innermost guard ring 121 can increase relative to the outer guard ring 122, thereby spreading the lateral potential drop between the active device region 120 and the drift region laterally across the guard ring structure, reducing the lateral electric field.

FIG. 36A illustrates the semiconductor device 3600 when the applied voltage is low. As shown in FIG. 36A, each of the coupling paths 126 may behave like a JFET 3670. A gate (not shown) may exist within the active device region 120. Depletion regions 3672 may be formed corresponding to the guard rings 122. As shown in FIG. 36B, as the applied voltage increases, the JFET 3670 that is closest to the gate may turn off, and the corresponding depletion regions 3672 may merge. In addition, as shown in FIG. 36C, as the applied voltage increases further, all of the JFETs 3670 may turn off, and all of the depletion regions 3672 may merge. In the example shown in FIG. 36C, the guard rings 122 may be floating.

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any possible combinations of one or more of the associated listed items.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present invention.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "below", "above", "higher", "lower", "over", and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

It should be understood that although blocks of methods are shown in a particular order, this order may be changed in different embodiments. A single block or a group of blocks within a method may be moved to a different position within the method without departing from the teachings of the present invention.

It is to be understood that the appended claims are not limited to the precise configuration illustrated in the drawings. One of ordinary skill in the art would recognize various modifications, alternatives, and variations may be made in the arrangement and steps of the methods and devices above without departing from the scope of the invention.

What is claimed is:
1. A semiconductor device comprising:
    a drift region characterized by a first conductivity type;
    a field region coupled to the drift region and characterized by a second conductivity type opposite to the first conductivity type;
    an active device region coupled to the drift region and surrounded by the field region;
    a plurality of guard rings arranged in a first concentric pattern in the field region surrounding the active device region and characterized by the second conductivity type;
    a plurality of junctions arranged in a second concentric pattern in the field region surrounding the active device region and characterized by the second conductivity type, wherein at least one of the plurality of junctions is arranged between two adjacent guard rings of the plurality of guard rings, and the plurality of junctions have a different resistivity than the plurality of guard rings; and
    a plurality of coupling paths characterized by the second conductivity type, wherein at least one of the plurality of coupling paths is arranged to connect two adjacent guard rings of the plurality of guard rings.

2. The semiconductor device of claim 1, wherein at least another one of the plurality of coupling paths is arranged to connect a first one of the plurality of guard rings with the active device region.

3. The semiconductor device of claim 1, wherein a top surface of the at least one of the plurality of coupling paths is arranged parallel to a top surface of the plurality of guard rings.

4. The semiconductor device of claim 3, wherein a width of the at least one of the plurality of coupling paths decreases from the top surface of the at least one of the plurality of coupling paths to a bottom of the at least one of the plurality of coupling paths.

5. The semiconductor device of claim 1, wherein the plurality of junctions have a higher resistivity than the plurality of guard rings.

6. The semiconductor device of claim 1, wherein a top surface of the at least one of the plurality of coupling paths is arranged below a top surface of the plurality of guard rings.

7. The semiconductor device of claim 6, wherein a width of the at least one of the plurality of coupling paths decreases from the top surface of the at least one of the plurality of coupling paths to a bottom of the at least one of the plurality of coupling paths.

8. The semiconductor device of claim 1, wherein a depth of the at least one of the plurality of coupling paths is smaller than a depth of the plurality of guard rings.

9. The semiconductor device of claim 1, further comprising a plurality of metal regions that are arranged on a top surface of the plurality of guard rings.

10. A semiconductor device comprising:
a III-nitride drift region characterized by a first conductivity type;
a III-nitride field region coupled to the III-nitride drift region and characterized by a second conductivity type opposite to the first conductivity type;
a III-nitride active device region coupled to the III-nitride drift region and surrounded by the III-nitride field region;
a plurality of guard rings arranged in a first concentric pattern in the III-nitride field region surrounding the III-nitride active device region and characterized by the second conductivity type;
a plurality of junctions arranged in a second concentric pattern in the III-nitride field region surrounding the III-nitride active device region and characterized by the second conductivity type, wherein at least one of the plurality of junctions is arranged between two adjacent guard rings of the plurality of guard rings, and the plurality of junctions comprise a higher resistivity than the plurality of guard rings; and
a plurality of coupling paths characterized by the second conductivity type, wherein at least one of the plurality of coupling paths is arranged to connect two adjacent guard rings of the plurality of guard rings.

11. The semiconductor device of claim 10, wherein:
each of the plurality of junctions are doped with a neutralization species that decreases conductivity of the plurality of junctions.

12. The semiconductor device of claim 10, wherein a top surface of the at least one of the plurality of coupling paths is arranged below a top surface of the plurality of guard rings.

13. The semiconductor device of claim 10, further comprising:
a substrate characterized by the first conductivity type;
wherein:
the III-nitride drift region comprises an n-GaN epitaxial layer coupled to the substrate; and
the III-nitride field region and the III-nitride active device region comprise a regrown p-GaN layer.

* * * * *